(12) United States Patent
Oh et al.

(10) Patent No.: US 11,171,317 B2
(45) Date of Patent: Nov. 9, 2021

(54) METHOD OF MANUFACTURING DISPLAY APPARATUS

(71) Applicant: Samsung Display Co., Ltd., Yongin-si (KR)

(72) Inventors: Suhyun Oh, Yongin-si (KR); Haram Yoo, Yongin-si (KR); Sangyeol Kim, Yongin-si (KR); Sokwon Noh, Yongin-si (KR); Kookchol Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 16/777,262

(22) Filed: Jan. 30, 2020

(65) Prior Publication Data

US 2020/0335730 A1  Oct. 22, 2020

(30) Foreign Application Priority Data

Apr. 16, 2019 (KR) ........................ 10-2019-0044477

(51) Int. Cl.
| | |
|---|---|
| *H01L 51/56* | (2006.01) |
| *H01L 27/32* | (2006.01) |
| *H01L 51/52* | (2006.01) |
| *H01L 51/00* | (2006.01) |

(52) U.S. Cl.
CPC .......... *H01L 51/56* (2013.01); *H01L 27/3234* (2013.01); *H01L 27/3276* (2013.01); *H01L 51/0011* (2013.01); *H01L 51/5237* (2013.01)

(58) Field of Classification Search
CPC ............. H01L 51/5253; H01L 51/5225; H01L 51/0056; H01L 51/0053; H01L 51/009756; H01L 51/0096; H01L 27/3246; H01L 27/3258; H01L 27/326; H01L 27/3227; H01L 27/3225; H01L 27/3244; H01L 2227/323; G06F 1/1637; G06F 1/1626; G06F 1/1684; Y02E 10/549

See application file for complete search history.

(56) References Cited

U.S. PATENT DOCUMENTS

| | | | |
|---|---|---|---|
| 8,183,063 | B2 | 5/2012 | Seo et al. |
| 9,911,941 | B2 | 3/2018 | Choi et al. |
| 2017/0304951 | A1 | 10/2017 | Lee |
| 2018/0198067 | A1 | 7/2018 | Kim et al. |

(Continued)

FOREIGN PATENT DOCUMENTS

| | | | |
|---|---|---|---|
| EP | EP-3664143 A2 * | 6/2020 | ........ G06F 3/0448 |
| KR | 10-2005-0113045 A | 12/2005 | |

(Continued)

*Primary Examiner* — Kyoung Lee
*Assistant Examiner* — Christina A Sylvia
(74) *Attorney, Agent, or Firm* — Lewis Roca Rothgerber Christie LLP

(57) ABSTRACT

A method of manufacturing a display apparatus includes: preparing a substrate including a display area and a sensor area arranged in the display area; forming first counter electrodes on the substrate so that the first counter electrodes are spaced apart from one another in the sensor area to have a first pattern; depositing second counter electrodes having a second pattern different from the first pattern to be spaced apart from one another in the sensor area; and arranging a component to correspond to the sensor area.

26 Claims, 42 Drawing Sheets

(56) References Cited

U.S. PATENT DOCUMENTS

| | | | |
|---|---|---|---|
| 2019/0073976 A1* | 3/2019 | Yeh | G02F 1/136286 |
| 2019/0196635 A1* | 6/2019 | Park | G01J 3/0208 |
| 2020/0144530 A1* | 5/2020 | Kim | C23C 14/24 |
| 2020/0208259 A1* | 7/2020 | Shin | C23C 14/042 |
| 2021/0028248 A1* | 1/2021 | Kim | H01L 27/3216 |

FOREIGN PATENT DOCUMENTS

| | | |
|---|---|---|
| KR | 10-2009-0111530 A | 10/2009 |
| KR | 10-2016-0130042 A | 11/2016 |
| KR | 10-2017-0120225 A | 10/2017 |
| KR | 10-2018-0083459 A | 7/2018 |
| KR | 10-2018-0115387 A | 10/2018 |

* cited by examiner

METHOD OF MANUFACTURING DISPLAY APPARATUS

CROSS-REFERENCE TO RELATED APPLICATION

This application claims priority to and the benefit of Korean Patent Application No. 10-2019-0044477, filed on Apr. 16, 2019, in the Korean Intellectual Property Office, the disclosure of which is incorporated herein in its entirety by reference.

BACKGROUND

1. Field

One or more embodiments relate to a method, and more particularly, to a method of manufacturing a display apparatus.

2. Description of the Related Art

Display apparatuses may display images by using pixels. A display apparatus may include an infrared sensor on a bezel (or an edge portion) of a front surface (e.g., a surface on which an image is displayed) of the display apparatus and may recognize an object by using the infrared sensor.

As the size of a bezel of a display apparatus decreases, a user's eyes may be fixed or focused on an image (or a screen of the display apparatus). Recently, research has been conducted into full-screen display technology for removing a bezel from a front surface of a display apparatus, rearranging an infrared sensor arranged on the front surface (or the bezel) of the display apparatus, and displaying an image on the entire front surface of the display apparatus.

SUMMARY

An aspect of one or more embodiments of the present disclosure is directed toward a method of manufacturing a display apparatus including a light transmitting portion inside a display area. However, the above aspect is an example and does not limit the scope of the present disclosure, and other aspects that are not mentioned may be clearly understood by one of ordinary skill in the art from the description of the present disclosure.

Additional aspects will be set forth in part in the description which follows and, in part, will be apparent from the description, or may be learned by practice of the presented embodiments.

According to one or more embodiments, a method of manufacturing a display apparatus includes: preparing a substrate including a display area and a sensor area arranged in the display area; forming first counter electrodes on the substrate having a first pattern in which the first counter electrodes are spaced apart from one another in the sensor area; depositing second counter electrodes having a second pattern different from the first pattern to be spaced apart from one another in the sensor area; and arranging a component to correspond to the sensor area.

Each of the first counter electrodes and the second counter electrodes may have a quadrangular shape in a plan view.

Corner portions of the first counter electrodes and the second counter electrodes may overlap each other.

The display area may surround at least a portion of the sensor area.

The method may further include forming a plurality of third counter electrodes that are spaced apart from one another in the display area when the first counter electrodes are formed on the substrate.

The method may further include forming a plurality of fourth counter electrodes that are spaced apart from one another in the display area when the second counter electrodes are formed on the substrate.

The method may further include: forming a plurality of third counter electrodes that are spaced apart from one another in the display area when the first counter electrodes are formed on the substrate; and forming, on the substrate, a plurality of fourth counter electrodes that are spaced apart from one another in the display area when the second counter electrodes are formed on the substrate, wherein each of the plurality of fourth counter electrodes is arranged between adjacent third counter electrodes of the plurality of third counter electrodes.

The third counter electrode and the fourth counter electrode may at least partially overlap each other in a plan view.

The plurality of third counter electrodes may be formed adjacent to the sensor area.

Some of the plurality of third counter electrodes may have stripe shapes.

The method may further include: forming a plurality of third counter electrodes to be spaced apart from one another in the display area when the first counter electrodes are formed on the substrate, wherein some of the plurality of third counter electrodes have stripe shapes; and forming, on the substrate, a plurality of fourth counter electrodes that are spaced apart from one another in a portion of the display area when the second counter electrodes are formed on the substrate, wherein each of the plurality of fourth counter electrodes is arranged between adjacent third counter electrodes of the plurality of third counter electrodes.

One of the third counter electrodes and a corresponding one of the fourth counter electrodes may at least partially overlap each other in a plan view.

The plurality of third counter electrodes may be formed adjacent to the sensor area, wherein a planar area of one side part of one of the fourth counter electrodes and a planar area of another side part of the one of the fourth counter electrodes in the display area are different from each other.

According to one or more embodiments, a method of manufacturing a display apparatus includes: forming a counter electrode on a substrate including a display area and a sensor area; forming an encapsulation portion on the counter electrode; and arranging a component for applying a signal through a transmitting portion included in the sensor area, wherein the forming of the counter electrode on the substrate including the display area and the sensor area includes: forming a first counter electrode in the sensor area by using a first mask having a plurality of first opening portions arranged in a first pattern on a first shield portion corresponding to the sensor area; and forming a second counter electrode by using a second mask having a plurality of second opening portions arranged in a second pattern different from the first pattern on a second shield portion corresponding to the sensor area.

Each of the plurality of first opening portions and the plurality of second opening portions may have a quadrangular shape in a plan view.

The first counter electrode and the second counter electrode may be adjacent to each other and may at least partially overlap each other.

The first mask may include a plurality of third opening portions arranged to be spaced apart from one another in a third pattern to form a third counter electrode in the display area, wherein at least one of the plurality of third opening portions is divided into two parts by the first shield portion.

The first mask may have a long side and a short side, wherein the plurality of third opening portions are formed parallel to the long side of the first mask or the short side of the first mask.

The first mask may have a plurality of third opening portions arranged to be spaced apart from one another in a third pattern to form a third counter electrode in the display area, and the second mask may have a plurality of fourth opening portions arranged to be spaced apart from one another to form a fourth counter electrode in the display area in a fourth pattern, wherein the fourth counter electrode is arranged between adjacent third counter electrodes.

Each of the plurality of third opening portions may be divided into two parts by the first shield portion.

The second mask may have a plurality of fourth opening portions arranged to be spaced apart from one another to form a fourth counter electrode in the display area, wherein an area of one of the plurality of fourth opening portions is different from an area of another of the plurality of fourth opening portions, wherein the second mask includes a long side and a short side, wherein an adjacent opening portion for forming a fifth counter electrode is further provided in a portion adjacent to the long side of the second mask or the short side of the second mask.

According to one or more embodiments, a method of manufacturing a display apparatus includes: forming a first counter electrode in a display area by using a first mask on a substrate including an opening area and the display area surrounding the opening area; and forming a second counter electrode by using a second mask in the display area, wherein each of the first mask and the second mask includes: a mask body portion having an opening portion corresponding to the display area; a shield portion arranged inside the opening portion to have a shape corresponding to the opening area and configured to shield a deposition material; a first rib connected to the shield portion and connected to the mask body portion to cross the opening portion in a first direction; and a second rib spaced apart from the first rib, connected to the shield portion, and connected to the mask body portion to cross the opening portion in the first direction.

The shield portion of the first mask may further include: a third rib connected to the mask body portion to cross the opening portion in a second direction; and a fourth rib spaced apart from the third rib, connected to the shield portion, and connected to the mask body portion to cross the opening portion in the second direction.

The shield portion of the first mask may be adjacent to the mask body portion.

The opening portion of the first mask may have a plurality of openings, wherein an area of one of the plurality of openings is different from an area of another one of the plurality of openings.

The opening portion of the second mask is adjacent to the mask body portion, the first rib, and the second rib.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
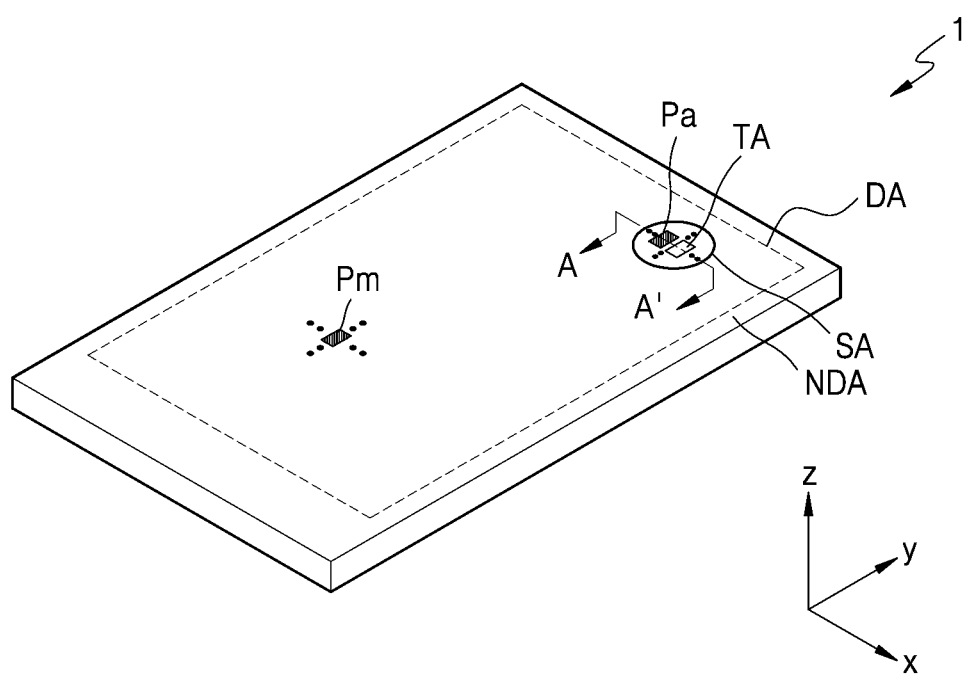
FIG. 1 is a perspective view of a display apparatus manufactured by using a manufacturing method according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc., may be used herein to describe various elements, these elements should not be limited by these terms, and these elements are only used to distinguish one element from another.

As used herein, the singular forms "a," "an," and "the" are intended to include the plural forms as well, unless the context clearly indicates otherwise.

It will be further understood that, as used herein, the terms "comprises" and/or "comprising" specify the presence of stated features or components, but do not preclude the presence or addition of one or more other features or components.

It will be understood that when a layer, region, or element is referred to as being "formed on" another layer, region, or element, it may be directly formed on the other layer, region, or element or may be indirectly formed on the other layer, region, or element with intervening layer(s), region(s), or element(s) therebetween.

Sizes of elements may be exaggerated for convenience of explanation. In other words, since sizes and thicknesses of elements in the drawings are arbitrarily illustrated for convenience of explanation, the present disclosure is not limited thereto.

In the following embodiments, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected or may be indirectly electrically connected with intervening layer(s), region(s), or element(s) therebetween.

The use of "may" when describing embodiments of the inventive concept refers to "one or more embodiments of the inventive concept."

As used herein, the terms "use," "using," and "used" may be considered synonymous with the terms "utilize," "utilizing," and "utilized," respectively.

FIG. 1 is a perspective view of a display apparatus 1 manufactured by using a manufacturing method according to an embodiment of the present disclosure.

Referring to FIG. 1, the display apparatus 1 includes a display area DA where an image is formed and a non-display area NDA where an image is not formed. The display apparatus 1 may provide a main image by using light emitted by a plurality of main pixels Pm arranged in the display area DA.

The display apparatus 1 includes a sensor area SA. The sensor area SA may be an area under which a component such as a sensor using infrared radiation, visible light, and/or sound is arranged as described below with reference to FIG. 2. The sensor area SA may include a transmission portion TA through which light and/or sound output from the component to the outside or traveling from the outside toward the component may be transmitted. In an embodiment of the present disclosure, when infrared radiation is transmitted through the sensor area SA, an infrared transmittance of the sensor area SA may be equal to or greater than about 15%, and more preferably, equal to or greater than 20%, equal to or greater than 25%, equal to or greater than 85%, or equal to or greater than 90%.

In the display apparatus 1 manufactured by using a manufacturing method of the present embodiment, a plurality of auxiliary pixels Pa may be arranged in the sensor area SA, and a set or predetermined image may be provided by using light emitted by the plurality of auxiliary pixels Pa. The resolution of an image provided by the sensor area SA that is an auxiliary image may be lower than that of an image provided by the display area DA. That is, the sensor area SA may include the transmission portion TA through which light and/or sound may be transmitted, and thus, the number of auxiliary pixels Pa that may be arranged per unit area may be less than the number of main pixels Pm arranged per unit area in the display area DA.

The sensor area SA may be at least partially surrounded by the display area DA (i.e., the display area DA is at least partially around the sensor area SA), and in FIG. 1 illustrating the display apparatus 1 manufactured by using a manufacturing method according to an embodiment, the sensor area SA is entirely surrounded by the display area DA (i.e., the display area DA is all around the sensor area SA).

Although an organic light-emitting display apparatus is described as the display apparatus 1 manufactured by using a manufacturing method according to an embodiment of the present disclosure, the display apparatus 1 manufactured by using a manufacturing method of the present disclosure is not limited thereto. In another embodiment, the display apparatus 1 may be any of various suitable display apparatuses such as an inorganic light-emitting display apparatus or a quantum dot light-emitting display apparatus.

Although the sensor area SA is arranged on a side (top or upper right side) of the display area DA having a quadrangular shape in FIG. 1, the present disclosure is not limited thereto. The display area DA may be arranged to surround (i.e., to be around) at least a portion of the sensor area SA. A shape of the display area DA may be a circular shape, an elliptical shape, or a polygonal shape such as a triangular shape or a pentagonal shape, and a position and the number of sensor area(s) SA may be modified in various suitable ways.

Figure 2:
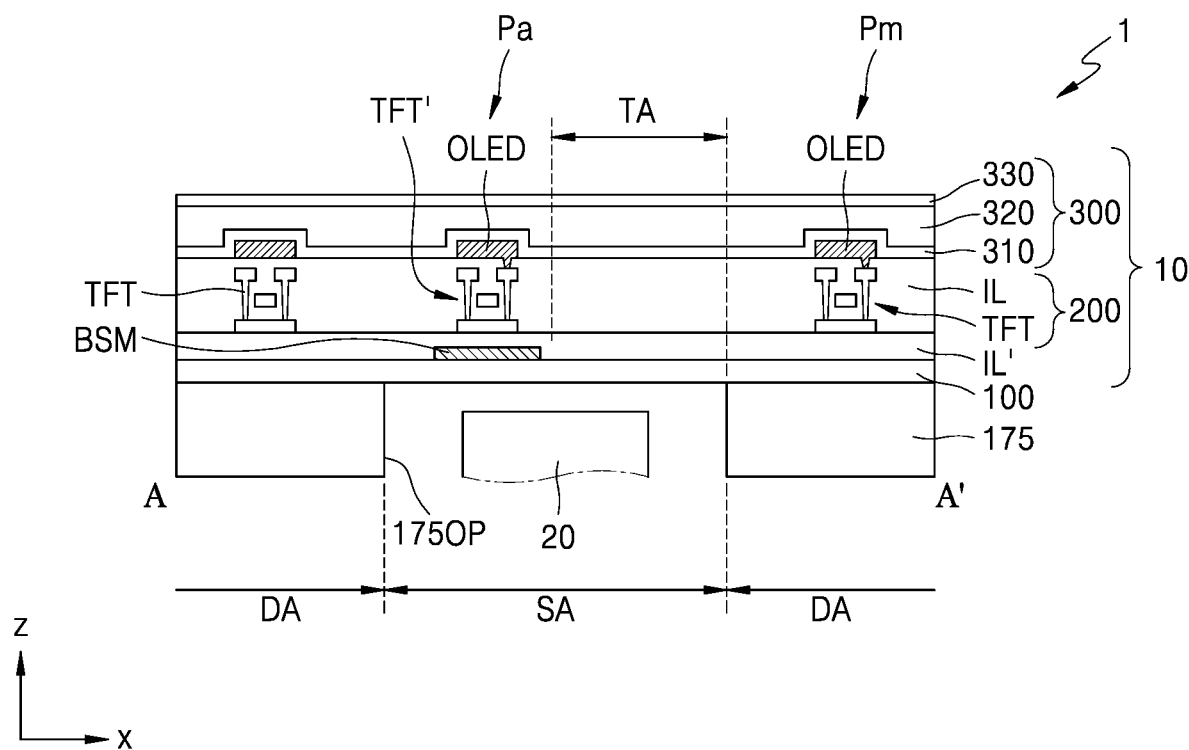
FIG. 2 is a cross-sectional view of the display apparatus manufactured by using a manufacturing method according to an embodiment of the present disclosure.

FIG. 2 is a cross-sectional view of the display apparatus 1 manufactured by using a manufacturing method according to the present embodiment, taken along line A-A' of FIG. 1.

Referring to FIG. 2, the display apparatus 1 may include a display panel 10 including a display element, and a component 20 corresponding to the sensor area SA.

The display panel 10 may include a substrate 100, a display element layer 200 arranged on the substrate 100, and a thin-film encapsulation layer 300 that is a sealing member for sealing the display element layer 200. Also, the display panel 10 may further include a lower protective film 175 arranged under the substrate 100.

The substrate 100 may include glass and/or a polymer resin. When the substrate 100 includes a polymer resin, the substrate 100 may be flexible, rollable, and/or bendable. The substrate 100 may have a multi-layer structure including a layer including a polymer resin and an inorganic layer.

The display element layer 200 may include a circuit layer including a thin-film transistor (TFT) TFT and an auxiliary TFT TFT', an organic light-emitting diode (OLED) that is a display element, and an insulating layer IL or IL' between the circuit layer and the OLED.

Also, the transmission portion TA, where the auxiliary TFT TFT' and a display element are not arranged, may be arranged in the sensor area SA. The transmission portion TA may be an area through which light or a signal emitted from the component 20 or light and/or a signal incident on the component 20 is transmitted.

The component 20 may be arranged in the sensor area SA. The component 20 may include an electronic element using light and/or sound. Non-limiting examples of the component 20 may include a sensor for receiving and using light such as an infrared sensor, a sensor for outputting and detecting light and/or sound to measure a distance and/or recognize a fingerprint, a small lamp for outputting light, and a speaker for outputting sound. When the component 20 is an electronic element using light, the component 20 may use light of various wavelength bands such as visible light, infrared light, and/or ultraviolet light. A plurality of components 20 may be provided in the sensor area SA. For example, a light-emitting device and a light-receiving device may be provided as the component 20 in one sensor area SA. Alternatively, both a light-emitting portion and a light-receiving portion may be provided in one component 20.

A lower electrode layer BSM may be arranged in the sensor area SA, to correspond to the auxiliary pixel Pa. That is, the lower electrode layer BSM may be arranged under the auxiliary TFT TFT' to correspond to the auxiliary TFT TFT'. That is, the lower electrode layer BSM may prevent or protect external light from reaching the auxiliary pixel Pa including the auxiliary TFT TFT'. For example, the lower electrode layer BSM may prevent or protect light emitted from the component 20 from reaching the auxiliary pixel Pa. A constant voltage or a signal may be applied to the lower electrode layer BSM, thereby preventing or protecting a pixel circuit from being damaged by an electrostatic discharge.

The thin-film encapsulation layer 300 may include at least one inorganic encapsulation layer and at least one organic encapsulation layer. In this regard, FIG. 2 illustrates first and second inorganic encapsulation layers 310 and 330 and an organic encapsulation layer 320 between the first and second inorganic encapsulation layers 310 and 330.

The organic encapsulation layer 320 may include a polymer-based material. For example, the organic encapsulation layer 320 may include polyethylene terephthalate (PET), polyethylene naphthalate (PEN), polycarbonate (PC), polyimide (PI), polyethylene sulfonate, polyoxymethylene, polyarylate, hexamethyldisiloxane (HMDSO), or an acrylic resin (e.g., polymethyl methacrylate (PMMA) or polyacrylic acid), or a combination thereof.

Each of the first and second inorganic encapsulation layers 310 and 330 may include at least one inorganic insulating material selected from among aluminum oxide, titanium oxide, tantalum oxide, hafnium oxide, zinc oxide, silicon oxide, silicon nitride, and silicon oxynitride. The second inorganic encapsulation layer 330 may cover the organic encapsulation layer 320 and may include silicon oxide, silicon nitride, and/or silicon oxynitride. The second inorganic encapsulation layer 330 may be deposited to contact the first inorganic encapsulation layer 310 on an edge portion of the display apparatus 1, thereby preventing or protecting the organic encapsulation layer 320 from being exposed to the outside of the display apparatus 1.

The lower protective film 175 may be attached to the bottom of the substrate 100 and may support and protect the substrate 100. The lower protective film 175 may have an opening 1750P corresponding to the sensor area SA. Because the lower protective film 175 has the opening 1750P, a light transmittance of the sensor area SA may be improved. The lower protective film 175 may include PET or PI.

When the substrate 100 includes glass, the lower protective film 175 may be omitted.

The sensor area SA may be greater in area than that of a portion where the component 20 is arranged (i.e., housed in). Accordingly, the area of the opening 1750P of the lower protective film 175 may not be the same as that of the sensor area SA. For example, the area of the opening 1750P may be less than that of the sensor area SA.

In one embodiment, elements such as an input sensing member for sensing a touch input, an anti-reflection member such as a polarizer and a retarder, and/or a color filter and a black matrix, and a transparent window may be further arranged on the display panel 10.

Although the thin-film encapsulation layer 300 is used as a sealing member for sealing the display element layer 200 in the present embodiment, the present disclosure is not limited thereto. For example, a sealing substrate adhered to the substrate 100 by using a sealant or frit may be used as a member for sealing the display element layer 200.

Figure 3:
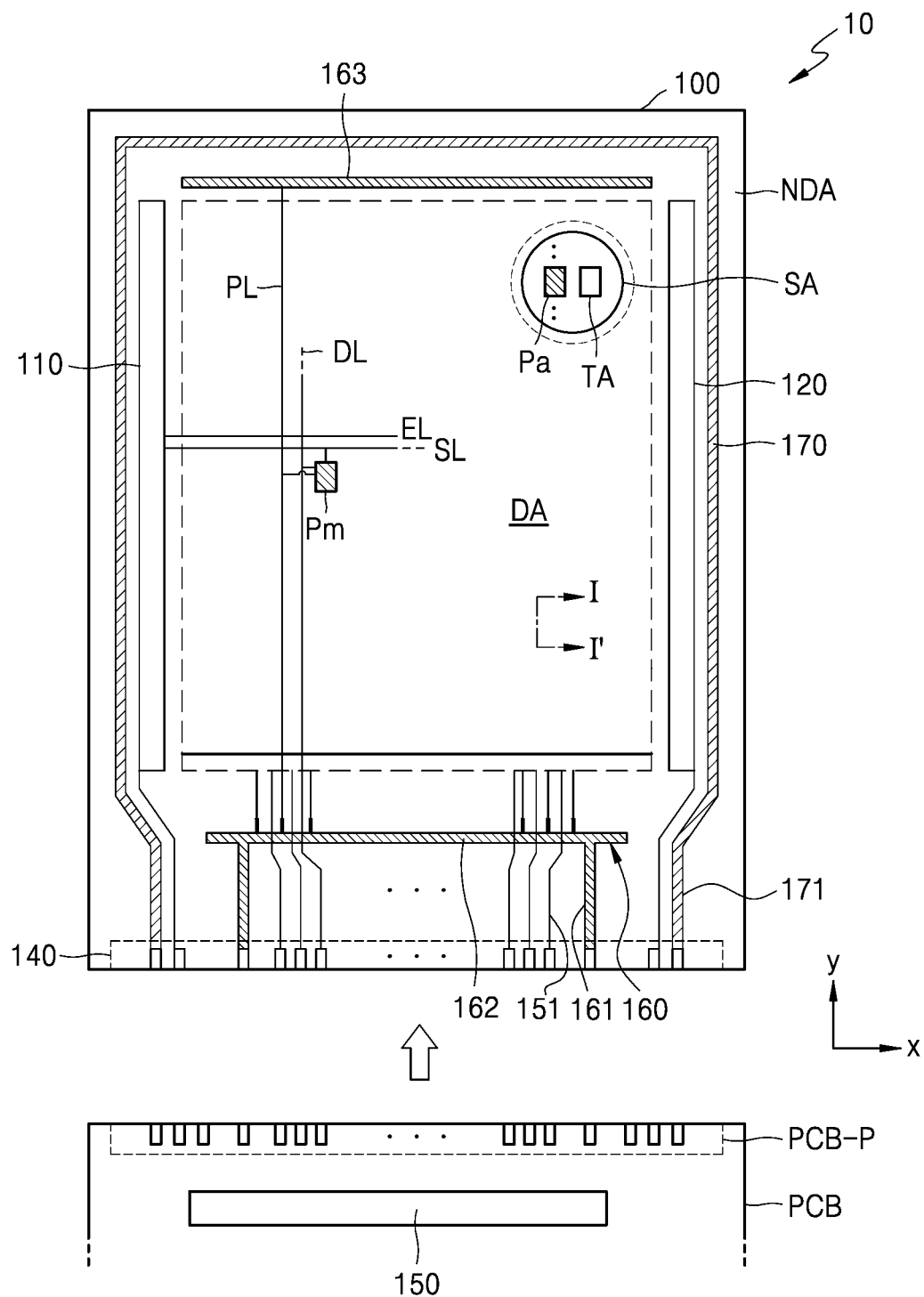
FIG. 3 is a plan view of the display apparatus manufactured by using a manufacturing method according to an embodiment of the present disclosure.

FIG. 3 is a plan view of the display apparatus 1 manufactured by using a manufacturing method according to an embodiment of the present disclosure.

Referring to FIG. 3, the display panel 10 is arranged in the display area DA, and includes the plurality of main pixels Pm. Each of the main pixels Pm may include a display element such as an OLED. Each main pixel Pm may emit, for example, red, green, blue, or white light, through the OLED. The term "main pixel Pm" used herein may refer to a pixel that emits any of red light, green light, blue light, and white light. The display area DA may be covered by an encapsulation member described with reference to FIG. 2 and may be protected from external air, moisture, and/or the like.

The sensor area SA may be arranged inside the display area DA, and the plurality of auxiliary pixels Pa are arranged in the sensor area SA. Each of the auxiliary pixels Pa may include a display element such as an OLED. Each auxiliary pixel Pa may emit, for example, red, green, blue, or white light, through the OLED. The term "auxiliary pixel Pa" used herein may refer to a pixel that emits any of red light, green light, blue light, and white light. The transmission portion TA arranged with or between the auxiliary pixels Pa may be provided in the sensor area SA.

In an embodiment, one main pixel Pm and one auxiliary pixel Pa may include the same pixel circuit. However, the present disclosure is not limited thereto. A pixel circuit included in the main pixel Pm may be different from a pixel circuit included in the auxiliary pixel Pa.

The sensor area SA may include the transmission portion TA, and the resolution of the sensor area SA may be less than that of the display area DA. For example, the resolution of the sensor area SA may be about ½ of that of the display area DA. In some embodiments, the resolution of the display area DA may be equal to or greater than 400 ppi, and the resolution of the sensor area SA may be about 200 ppi.

Each of the main pixel Pm and the auxiliary pixel Pa may be electrically connected to peripheral areas arranged in the non-display area NDA. A first scan driving circuit 110, a second scan driving circuit 120, a terminal 140, a data driving circuit 150, a first power supply wiring 160, and a second power supply wiring 170 may be arranged in the non-display area NDA.

The first scan driving circuit 110 may apply a scan signal to each of the main pixel Pm and the auxiliary pixel Pa through a scan line SL. The first scan driving circuit 110 may apply an emission control signal to each pixel through an emission control line EL. The second scan driving circuit 120 may be arranged parallel to the first scan driving circuit 110 with the display area DA therebetween. Some of the main pixels Pm and the auxiliary pixels Pa arranged in the display area DA may be electrically connected to the first scan driving circuit 110, and the others may be connected to the second scan driving circuit 120. In another embodiment, the second scan driving circuit 120 may be omitted.

The terminal 140 may be arranged on a side of the substrate 100. The terminal 140 may be exposed by not being covered by an insulating layer and may be electrically connected to a printed circuit board (PCB).

A terminal PCB-P of the PCB may be electrically connected to the terminal 140 of the display panel 10. The PCB applies a signal and/or power of a controller to the display panel 10. A control signal generated by the controller may be transmitted to the first and second scan driving circuits 110 and 120 through the PCB. The controller may respectively apply first and second power supply voltages ELVDD and ELVSS to the first and second power supply wirings 160 and 170 through first and second connection wirings 161 and 171. The first power supply voltage ELVDD may be applied to each of the main pixels Pm and the auxiliary pixels Pa through a driving voltage line PL connected to the first power supply wiring 160, and the second power supply voltage ELVSS may be applied to a counter electrode of each of the main pixels Pm and the auxiliary pixels Pa connected to the second power supply wiring 170.

The data driving circuit 150 is electrically connected to a data line DL. A data signal of the data driving circuit 150 may be applied to each of the main pixels Pm and the auxiliary pixels Pa through a connection wiring 151 connected to the terminal 140 and the data line DL connected to the connection wiring 151. Although the data driving circuit 150 is arranged on the PCB in FIG. 3, in another embodiment, the data driving circuit 150 may be arranged on the substrate 100. For example, the data driving circuit 150 may be arranged between the terminal 140 and the first power supply wiring 160.

The first power supply wiring 160 may include a first sub-wiring 162 and a second sub-wiring 163 both extending in parallel in an x-direction with the display area DA therebetween. The second power supply wiring 170 may partially surround the display area DA in a loop shape having one side open.

Figure 4:
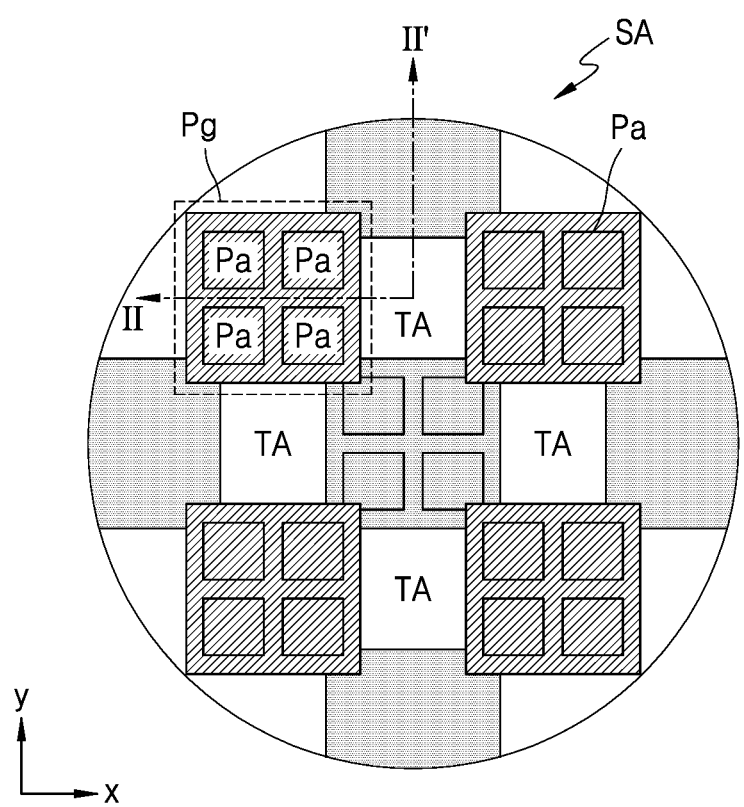
FIG. 4 is a plan view illustrating a part of a sensor area of FIG. 3.
Figure 5:
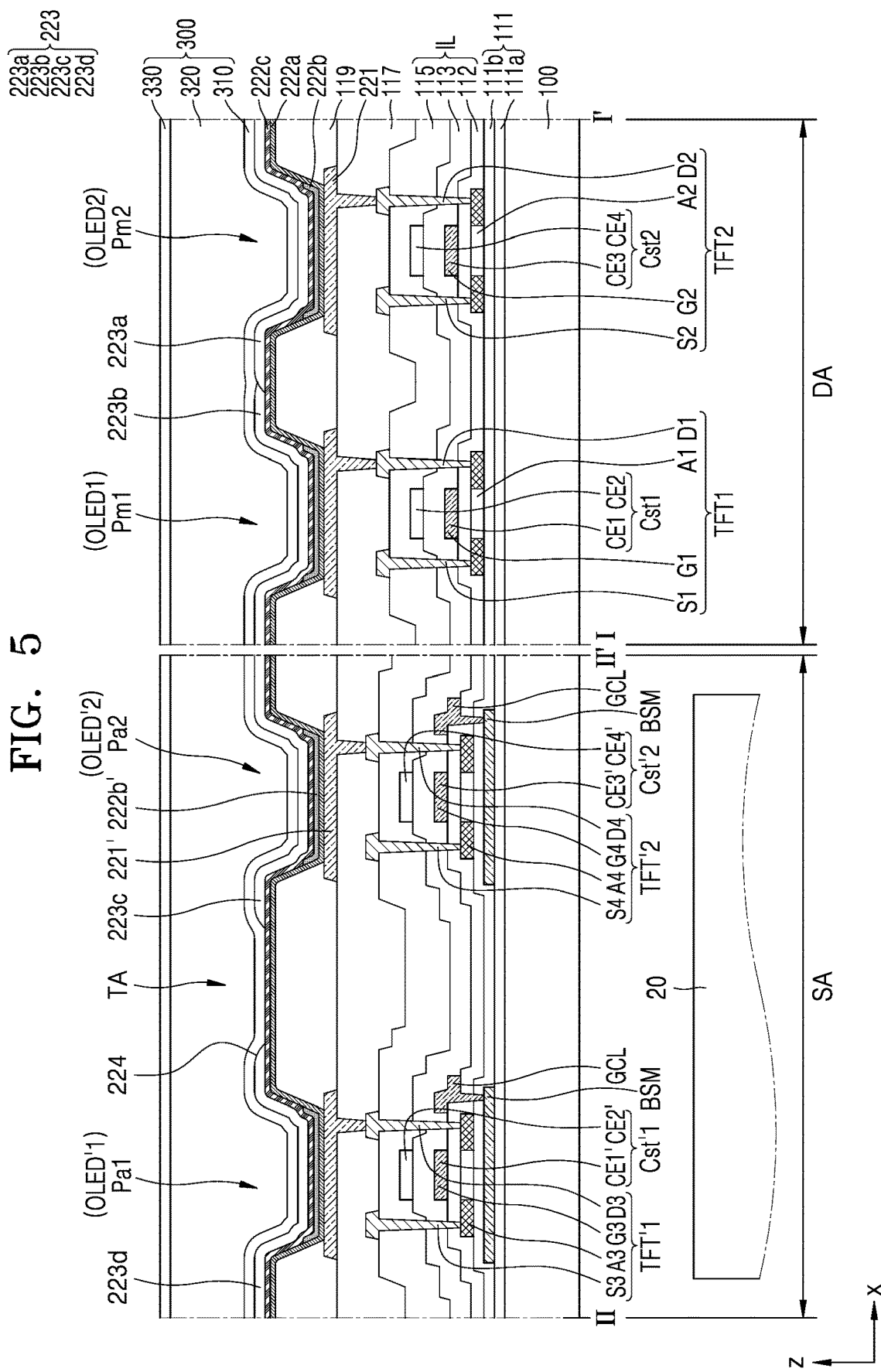
FIG. 5 is a cross-sectional view taken along line I-I' of FIG. 3 and line II-II' of FIG. 4.

FIG. 4 is a plan view illustrating a part of the sensor area SA of FIG. 3, and FIG. 5 is a cross-sectional view taken along line I-I' of FIG. 3 and line II-II' of FIG. 4.

Referring to FIG. 4, the auxiliary pixels Pa and the transmitting portions TA are arranged in the sensor area SA of the display apparatus 1 according to an embodiment of the present disclosure. Certain auxiliary pixels Pa may be continuously arranged to form one pixel group Pg.

At least one auxiliary pixel Pa may be included in the pixel group Pg. In FIG. 4, four auxiliary pixels Pa arranged in two rows are included in one pixel group Pg. However, the present disclosure is not limited thereto. The number and arrangement of auxiliary pixels Pa included in one pixel group Pg may be modified in various suitable ways.

The plurality of transmitting portions TA including no display element and having a high light transmittance may be provided in the sensor area SA. The transmission portions TA and the pixel groups Pg may be alternately arranged in a first direction (e.g., an x-direction) and/or a second direction (e.g., a y-direction). Alternatively, the transmitting portions TA may surround the pixel group Pg. Alternatively, the auxiliary pixels Pa may surround the transmission portion TA.

Referring to FIG. 5, the display apparatus 1 manufactured by using a manufacturing method according to an embodiment of the present disclosure includes the display area DA and the sensor area SA. A first main pixel Pm1 and a second main pixel Pm2 are arranged in the display area DA, and a first auxiliary pixel Pa1, a second auxiliary pixel Pa2, and the transmission portion TA are arranged in the sensor area SA.

The first main pixel Pm1 may include a first main TFT TFT1, a first main storage capacitor Cst1, and a first main OLED OLED1. The first auxiliary pixel Pa1 may include a first auxiliary TFT TFT'1, a first auxiliary storage capacitor Cst'1, and a first auxiliary OLED OLED'1.

The second main pixel Pm2 may include a second main TFT TFT2, a second main storage capacitor Cst2, and a second main OLED OLED2. The second auxiliary pixel Pa2 may include a second auxiliary TFT TFT'2, a second auxiliary storage capacitor Cst'2, and a second auxiliary OLED OLED'2.

The component 20 may be arranged under the sensor area SA. The component 20 may be an infrared (IR) sensor that transmits/receives infrared radiation. The transmission portion TA may be arranged in the sensor area SA, and an infrared signal transmitted/received to/from the component 20 may be transmitted through the transmission portion TA. For example, light emitted by the component 20 may travel in a z-direction through the transmission portion TA, and light generated outside the display apparatus 1 and incident on the component 20 may travel in a −z-direction through the transmission portion TA.

A stacked structure of elements included in the display apparatus 1 manufactured by using a manufacturing method according to an embodiment of the present disclosure will now be described.

The substrate 100 may include glass and/or a polymer resin. The polymer resin may include polyethersulfone (PES), polyacrylate (PAR), polyetherimide (PEI), PEN, PET, polyphenylene sulfide (PPS), polyarylate, PI, PC, and/or cellulose acetate propionate (CAP). The substrate 100 including the polymer resin may be flexible, rollable, and/or bendable. The substrate 100 including the polymer resin may have a multi-layer structure including a layer including a polymer resin and an inorganic layer.

A buffer layer 111 may be arranged on the substrate 100, and may reduce or prevent penetration of a foreign material, moisture, and/or external air from the bottom of the substrate 100 and may flatten a surface of the substrate 100. The buffer layer 111 may include an inorganic material such as oxide or nitride, an organic material, or an organic/inorganic composite material, and may have a single or multi-layer structure including an inorganic material and an organic material. A barrier layer for preventing or reducing penetration of external air may be further provided between the substrate 100 and the buffer layer 111. In some embodiments, the buffer layer 111 may include silicon oxide ($SiO_2$) and/or silicon nitride ($SiN_x$). The buffer layer 111 may be provided so that a first buffer layer 111a and a second buffer layer 111b are stacked.

In the sensor area SA, a lower electrode layer (also referred to as a first lower electrode layer) BSM and a second lower electrode layer BSM' may be arranged between the first buffer layer 111a and the second buffer layer 111b. In another embodiment, the first lower electrode layer BSM and the second lower electrode layer BSM' may be arranged between the substrate 100 and the first buffer layer 111a. The first lower electrode layer BSM may be arranged under the first auxiliary TFT TFT'1, and the second lower electrode layer BSM' may be arranged under the second auxiliary TFT TFT'2, thereby preventing or protecting characteristics of the first auxiliary TFT TFT'1 and the second auxiliary TFT TFT'2 from being degraded due to light emitted from the component 20.

Also, the first lower electrode layer BSM and the second lower electrode layer BSM' may respectively receive a constant voltage and/or a signal from a first wiring GCL and a second wiring GCL' arranged on different layers. For example, the first lower electrode layer BSM and the second lower electrode layer BSM' may receive a driving voltage, for example, the first power supply voltage ELVDD, and/or a scan signal. As the first lower electrode layer BSM and the second lower electrode layer BSM' receive a constant voltage and/or a signal, the probability that an electrostatic discharge occurs may be greatly reduced. Each of the first lower electrode layer BSM and the second lower electrode layer BSM' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). Each of the first lower electrode layer BSM and the second lower electrode layer BSM' may have a single or multi-layer structure including the above material(s).

The first main TFT TFT1, the second main TFT TFT2, the first auxiliary TFT TFT'1, and the second auxiliary TFT TFT'2 may be arranged on the buffer layer 111. The first main TFT TFT1 includes a first semiconductor layer A1, a first gate electrode G1, a first source electrode S1, and a first drain electrode D1, and the second main TFT TFT2 includes a second semiconductor layer A2, a second gate electrode G2, a second source electrode S2, and a second drain electrode D2. The first auxiliary TFT TFT'1 includes a third semiconductor layer A3, a third gate electrode G3, a third source electrode S3, and a third drain electrode D3, and the second auxiliary TFT TFT'2 includes a fourth semiconductor layer A4, a fourth gate electrode G4, a fourth source electrode S4, and a fourth drain electrode D4. The first main TFT TFT1 may be connected to the first main OLED OLED1 of the display area DA and may drive the first main OLED OLED1. The first auxiliary TFT TFT'1 may be connected to the first auxiliary OLED OLED'1 of the sensor area SA and may drive the first auxiliary OLED OLED1. Likewise, the second main TFT TFT2 may be connected to the second main OLED OLED2 of the display area DA and may drive the second main OLED OLED2. The second auxiliary TFT TFT'2 may be connected to the second auxiliary OLED OLED'2 of the sensor area SA and may drive the second auxiliary OLED OLED'2.

At least one of the first semiconductor layer A1 through the fourth semiconductor layer A4 may be arranged on the buffer layer 111 and may include polysilicon. In another embodiment, at least one of the first semiconductor layer A1 through the fourth semiconductor layer A4 may include amorphous silicon. In another embodiment, at least one of the first semiconductor layer A1 through the fourth semiconductor layer A4 may include at least one oxide selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). At least one of the first semiconductor layer A1 through the fourth semiconductor layer A4 may include a channel region and may also include a source region and a drain region doped with impurities.

The third semiconductor layer A3 and the fourth semiconductor layer A4 may respectively overlap the first lower electrode layer BSM and the second lower electrode layer BSM' with the second buffer layer 111b therebetween. In an embodiment, the widths of the third semiconductor layer A3 and the fourth semiconductor layer A4 may be less than the widths of the first lower electrode layer BSM and the second lower electrode layer BSM', and when projected in a direction perpendicular or normal to the substrate 100, the third semiconductor layer A3 and the fourth semiconductor layer A4 may respectively overlap the first lower electrode layer BSM and the second lower electrode layer BSM'.

A first gate insulating layer 112 may be provided to cover the first semiconductor layer A1 through the fourth semiconductor layer A4. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may have a single or multi-layer structure including the above inorganic material.

The first gate electrode G1 through the fourth gate electrode G4 are arranged on the first gate insulating layer 112 to respectively overlap the first semiconductor layer A1 through the fourth semiconductor layer A4. Each of the first gate electrode G1 through the fourth gate electrode G4 may include Mo, Al, Cu, and/or Ti and may have a single or multi-layer structure. For example, each of the first gate electrode G1 through the fourth gate electrode G4 may have a single-layer structure including Mo.

A second gate insulating layer 113 may be provided to cover the first gate electrode G1 through the fourth gate electrode G4. The second gate insulating layer 113 may include an inorganic insulating material such as $SiO_2$, $SiN_x$, SiON, $Al_2O_3$, $TiO_2$, $Ta_2O_5$, $HfO_2$, and/or $ZnO_2$. The second gate insulating layer 113 may have a single or multi-layer structure including the above inorganic insulating material.

A first upper electrode CE2 of the first main storage capacitor Cst1, a second upper electrode CE4 of the second main storage capacitor Cst2, a third upper electrode CE2' of the first auxiliary storage capacitor Cst'1, and a fourth upper electrode CE4' of the second auxiliary storage capacitor Cst'2 may be arranged on the second gate insulating layer 113.

In the display area DA, the first upper electrode CE2 and the second upper electrode CE4 may respectively overlap the first gate electrode G1 and the second gate electrode G2 arranged under the first upper electrode CE2 and the second upper electrode CE4. The first gate electrode G1 and the second upper electrode CE2 overlapping each other with the second gate insulating layer 113 therebetween may constitute the first main storage capacitor Cst1. The first gate electrode G1 may be a first lower electrode CE1 of the first main storage capacitor Cst1. Also, the second gate electrode G2 and the second upper electrode CE4 overlapping each other with the second gate insulating layer 113 therebetween may constitute the second main storage capacitor Cst2. The second gate electrode G2 may be a second lower electrode CE3 of the second main storage capacitor Cst2.

In the sensor area SA, the third upper electrode CE2' may overlap the third gate electrode G3 arranged under the third upper electrode CE2'. The third gate electrode G3 and the third upper electrode CE2' overlapping each other with the second gate insulating layer 113 therebetween may constitute the first auxiliary storage capacitor Cst'1. The third gate electrode G3 may be a third lower electrode CE1' of the first auxiliary storage capacitor Cst'1. Also, the fourth gate electrode G4 and the fourth upper electrode CE4' overlapping each other with the second gate insulating layer 113 therebetween may constitute the second auxiliary storage capacitor Cst'2. The fourth gate electrode G4 may be a fourth lower electrode CE3' of the second auxiliary storage capacitor Cst'2.

Each of the first upper electrode CE2 through the fourth upper electrode CE4' may include Al, Pt, Pd, Ag, Mg, Au, Nd, Ir, Cr, Ni, Ca, Mo, Ti, W, and/or Cu, and may have a single or multi-layer structure including the above material.

An interlayer insulating layer 115 may be formed to cover the first upper electrode CE2 through the fourth upper electrode CE4'. The interlayer insulating layer 115 may include $SiO_2$, $SiN_x$, SiON, $Al_2O_3$, $TiO_2$, $Ta_2O_5$, $HfO_2$, and/or $ZnO_2$.

The first, second, third, and fourth source electrodes S1, S2, S3, and S4 and the first, second, third, and fourth drain electrodes D1, D2, D3, and D4 are arranged on the interlayer insulating layer 115. Each of the source electrodes S1, S2, S3, and S4 and the drain electrodes D1, D2, D3, and D4 may include a conductive material including Mo, Al, Cu, and/or Ti, and may have a single or multi-layer structure including the above material(s). For example, each of the source electrodes S1, S2, S3, and S4 and the drain electrodes D1, D2, D3, and D4 may have a multi-layer structure formed of Ti/Al/Ti.

A planarization layer 117 may be arranged on the interlayer insulating layer 115. The planarization layer 117 may have a flat top surface so that a first pixel electrode 221 and a second pixel electrode 221' arranged on the planarization layer 117 are flat.

The planarization layer 117 may have a single or multi-layer structure formed of an organic material and/or an inorganic material. The planarization layer 117 may include a general-purpose polymer (e.g., benzocyclobutene (BCB), PI, HMDSO, PMMA, and/or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include $SiO_2$, $SiN_x$, SiON, $Al_2O_3$, $TiO_2$, $Ta_2O_5$, $HfO_2$, and/or $ZnO_2$. After the planarization layer 117 is formed, chemical mechanical polishing may be performed to provide a flat top surface.

Opening portions through which the first main TFT TFT1 and the second main TFT TFT2 are exposed may be formed in the planarization layer 117, and the first pixel electrode 221 may be electrically connected to the first main TFT TFT1 and the second main TFT TFT2 through the opening portions.

Also, opening portions through which the first auxiliary TFT TFT'1 and the second auxiliary TFT TFT'2 are exposed may be formed in the planarization layer 117, and the second pixel electrode 221' may be electrically connected to the first auxiliary TFT TFT'1 and the second auxiliary TFT TFT'2 through the opening portions.

Each of the first pixel electrode 221 and the second pixel electrode 221' may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, each of the first pixel electrode 221 and the second pixel electrode 221' may include a reflective film including Ag, Mg, Al, Pt, Pd, Au, Ni, Nd, Ir, Cr, or an alloy or compound thereof. In another embodiment, each of the first pixel electrode 221 and the second pixel electrode 221' may further include a film formed of ITO, IZO, ZnO, and/or In203 over/under the reflective film. In some embodiments, each of the first pixel electrode 221 and the second pixel electrode 221' may have a stacked structure formed of ITO/Ag/ITO.

A pixel-defining film 119 may cover an edge of each of the first pixel electrode 221 and the second pixel electrode 221'. The pixel-defining film 119 overlaps each of the first pixel electrode 221 and the second pixel electrode 221'. The pixel-defining film 119 may increase a distance between a counter electrode 223 arranged over the first and second pixel electrodes 221 and 221' and edges of the first and second pixel electrodes 221 and 221', thereby preventing or protecting an arc or the like from occurring at the edges of the first and second pixel electrodes 221 and 221'. The pixel-defining film 119 may be formed of an organic insulating material such as PI, polyamide, an acrylic resin, BCB, HMDSO, and/or a phenolic resin by using spin coating or the like.

A first functional layer 222a is arranged to cover the pixel-defining film 119. The first functional layer 222a may have a single or multi-layer structure. The first functional layer 222a may be a hole transport layer (HTL) having a single-layer structure. Also, the first functional layer 222a may include a hole injection layer (HIL) and/or an HTL. The first functional layer 222a may be integrally formed to correspond to the first main pixel Pm1 and the second main pixel Pm2 and the first auxiliary pixel Pa1 and the second auxiliary pixel Pa2 included in the display area DA and the sensor area SA.

A first emission layer 222b and a second emission layer 222b' respectively corresponding to the first pixel electrode 221 and the second pixel electrode 221' are arranged on the first functional layer 222a. Each of the first emission layer 222b and the second emission layer 222b' may include a high molecular weight material or a low molecular weight material, and may emit red, green, blue, or white light.

A second functional layer 222c may be formed on the first emission layer 222b and the second emission layer 222b'. The second functional layer 222c may have a single or multi-layer structure. The second functional layer 222c may include an electron transport layer (ETL) and/or an electron injection layer (EIL). The second functional layer 222c may be integrally formed to correspond to the main pixels Pm and the auxiliary pixels Pa included in the display area DA and the sensor area SA. The first functional layer 222a and/or the second functional layer 222c may be omitted.

The counter electrode 223 is arranged on the second functional layer 222c. The counter electrode 223 may include a conductive material having a low work function. For example, the counter electrode 223 may include a (semi)transparent layer including Ag, Mg, Al, Pt, Pd, Au, Ni, Nd, Ir, Cr, lithium (Li), or Ca, or an alloy or compound thereof. Alternatively, the counter electrode 223 may further include a layer formed of ITO, IZO, ZnO, and/or $In_2O_3$ on the (semi)transparent layer including the above material(s).

The counter electrode 223 may include a first main counter electrode 223a corresponding to the first main pixel Pm1 of the display area DA and a second main counter electrode 223b corresponding to the second main pixel Pm2 of the display area DA. Also, the counter electrode 223 may include a second auxiliary counter electrode 223d corresponding to the first auxiliary pixel Pa1 of the sensor area SA and a first auxiliary counter electrode 223c corresponding to the second auxiliary pixel Pa2 of the sensor area SA.

Layers from the first pixel electrode 221 to the counter electrode 223 formed in the display area DA may constitute the first main OLED OLED1 and the second OLED OLED2. Layers from the second pixel electrode 221' to the counter electrode 223 formed in the sensor area SA may constitute the first auxiliary OLED OLED'1 and the second auxiliary OLED OLED'2.

An opening 224 defined by and corresponding to the counter electrode 223 may be formed in the transmission portion TA of the sensor area SA to improve a transmittance of signals emitted by the component 20.

The thin-film encapsulation layer 300 is arranged on the counter electrode 223 and the opening 224. The thin-film encapsulation layer 300 may include at least one inorganic encapsulation layer and/or at least one organic encapsulation layer, and in this regard, FIG. 5 illustrates a structure of the thin-film encapsulation layer 300 in which the first inorganic encapsulation layer 310, the organic encapsulation layer 320, and the second inorganic encapsulation layer 330 are stacked. The number of organic encapsulation layers, the number of inorganic encapsulation layers, and an order of stacking organic encapsulation layers and inorganic encapsulation layers may be suitably modified.

Each of the first inorganic encapsulation layer 310 and the second inorganic encapsulation layer 330 may include at least one inorganic insulating material (such as aluminum oxide, titanium oxide, tantalum oxide, hafnium oxide, zinc oxide, silicon oxide, silicon nitride, and/or silicon oxynitride), and may be formed by using chemical vapor deposition (CVD). The organic encapsulation layer 320 may include a polymer-based material. Examples of the polymer-based material may include a silicon-based resin, an acrylic resin, an epoxy-based resin, PI, and polyethylene.

The first inorganic encapsulation layer 310, the organic encapsulation layer 320, and the second inorganic encapsulation layer 330 may be integrally formed to cover the display area DA and the sensor area SA.

As described above, the display apparatus 1 may improve a transmittance of signals emitted from the component 20 by forming the opening 224 corresponding to the counter electrode 223 in the transmission portion TA. A method of manufacturing the display apparatus 1 having the opening 224 formed in the transmission portion TA to correspond to (and be defined by) the counter electrode 223 will be described in detail.

Figure 6:
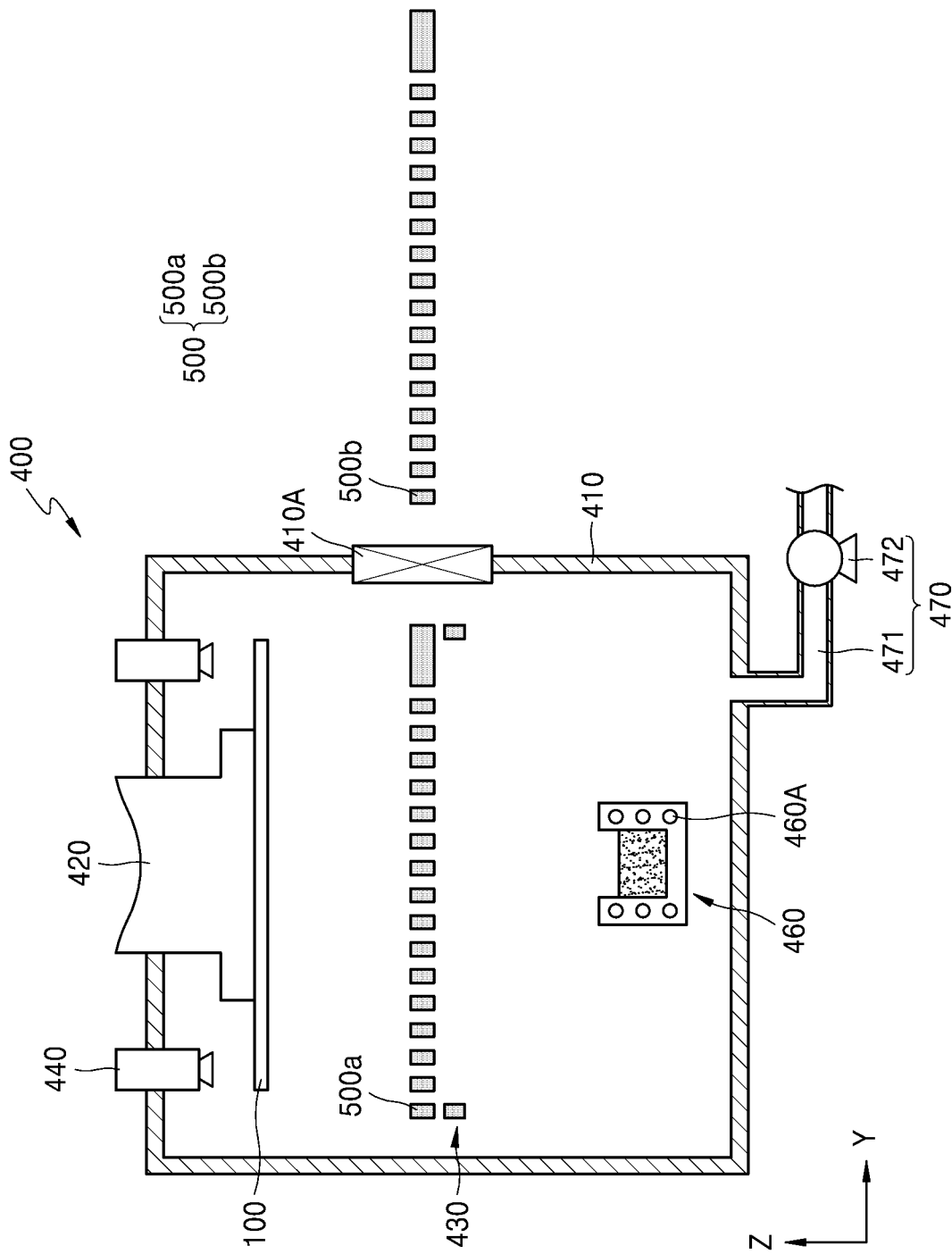
FIG. 6 is a cross-sectional view of an apparatus for manufacturing the display apparatus according to an embodiment of the present disclosure.

FIG. 6 is a cross-sectional view of an apparatus 400 for manufacturing the display apparatus 1 according to an embodiment of the present disclosure.

Referring to FIG. 6, the apparatus 400 for manufacturing the display apparatus 1 may include a chamber 410, a first support portion 420, a second support portion 430, a vision unit 440, a mask 500, a deposition source 460, and a pressure regulator 470.

An inner space may be formed inside the chamber 410 so that a portion of the chamber 410 is open. A gate valve 410A may be provided at the open portion of the chamber 410 and may selectively open/close the open portion of the chamber 410.

The first support portion 420 may support the substrate 100. In this case, the first support portion 420 may support the substrate 100 in various suitable ways. For example, the first support portion 420 may include an electrostatic chuck or an adhesive chuck. In another embodiment, the first support portion 420 may include a frame on which a part of the substrate 100 is placed and that supports the substrate 100, and a clamp that holds and fixes a part of the substrate 100. The first support portion 420 is not limited thereto, and may include any device for supporting the substrate 100. However, for convenience of explanation, the following will be described in more detail on the assumption that the first support portion 420 includes an electrostatic chuck or an adhesive chuck.

In this case, the first support portion 420 may include at least one of a permanent magnet and an electromagnet to closely attach the mask 500 to the substrate 100. In another embodiment, when the first support portion 420 includes a frame or a clamp, at least one of a magnet and an electromagnet similar to the first support portion 420 of FIG. 6 may be further provided to closely attach the substrate 100 to the mask 500.

The mask 500 may be placed and supported on the second support portion 430. In this case, the mask 500 on the second support portion 430 may be finely adjusted in at least two different directions.

The vision unit 440 may capture images of positions of the substrate 100 and the mask 500. In this case, the substrate 100 and the mask 500 may be aligned by moving at least one of the substrate 100 and the mask 500 based on the images captured by the vision unit 440.

The mask 500 may include a plurality of opening portions. The plurality of opening portions may define an area through which a deposition material passes.

The mask 500 may include a first mask 500a and a second mask 500b that are exchangeable with each other. The first mask 500a may shield a part of the display area DA of the substrate 100. Also, the second mask 500b may shield a part of the display area DA of the substrate 100, different from the part of the display area DA of the first mask 500a. In this case, a method of depositing a deposition material on the display area DA of the substrate 100 by using the first mask 500a and the second mask 500b will be described below in more detail.

A deposition material may be supplied into and may evaporate in the deposition source 460. In this case, the deposition source 460 may include a heater 460A, and the deposition material may evaporate due to heat applied by the heater 460A. The deposition material may be a material for forming the counter electrode 223 on the substrate 100, and may be the first functional layer 222a or the second functional layer 222c. However, for convenience of explanation, the following will be described in more detail on the assumption that the deposition material is a material for forming the counter electrode 223 on the substrate 100.

The deposition source 460 may be formed in various suitable ways. For example, the deposition source 460 may be a point deposition source in which an inlet portion through which the deposition material is ejected has a circular shape. Also, the deposition source 460 may be a long linear deposition source in which a plurality of inlet portions are formed or an inlet portion has a long hole shape. For convenience of explanation, the following will be described in more detail on the assumption that the deposition source 460 faces a point of the mask 500 and is a point deposition source.

The pressure regulator 470 may be connected to the chamber 410 and may adjust a pressure inside the chamber 410 to a level similar to an atmospheric pressure or vacuum. In this case, the pressure regulator 470 may include a connection pipe 471 connected to the chamber 410 and a pressure regulating pump 472 arranged in the connection pipe 471.

Upon examining a method of manufacturing the display apparatus 1 by using the apparatus 400, the substrate 100 including the display area DA and the sensor area SA may be manufactured and prepared.

Also, the mask 500 may be manufactured and prepared. The mask 500 may include the first mask 500a and the second mask 500b. After the first mask 500a is placed on the second support portion 430, the substrate 100 and the first mask 500a may be aligned with each other. A deposition material may be supplied into the deposition source 460, may evaporate, and may be deposited on the substrate 100 through an opening of the first mask 500a.

After the deposition material is deposited on the substrate 100, the first mask 500a may be replaced with the second mask 500b. After the second mask 500b is placed on the second support portion 430, the substrate 100 and the second mask 500b may be aligned with each other. A deposition material may be supplied into the deposition source 460, may evaporate, and may be deposited on the substrate 100 through an opening of the second mask 500b.

However, the second mask 500b may be first placed on the second support portion 430, and then a deposition material may be deposited on the substrate 100. Also, the second mask 500b may be replaced with the first mask 500a, and a deposition material may be deposited on the substrate 100. However, for convenience of explanation, the following will be described in more detail on the assumption that the first mask 500a is placed on the second support portion 430, a deposition material is deposited on the substrate 100, and the first mask 500a is replaced with the second mask 500b.

Also, the thin-film encapsulation layer 300 may be formed, and a component for applying a signal through the transmission portion TA included in the sensor area SA may be arranged.

Figure 7A:
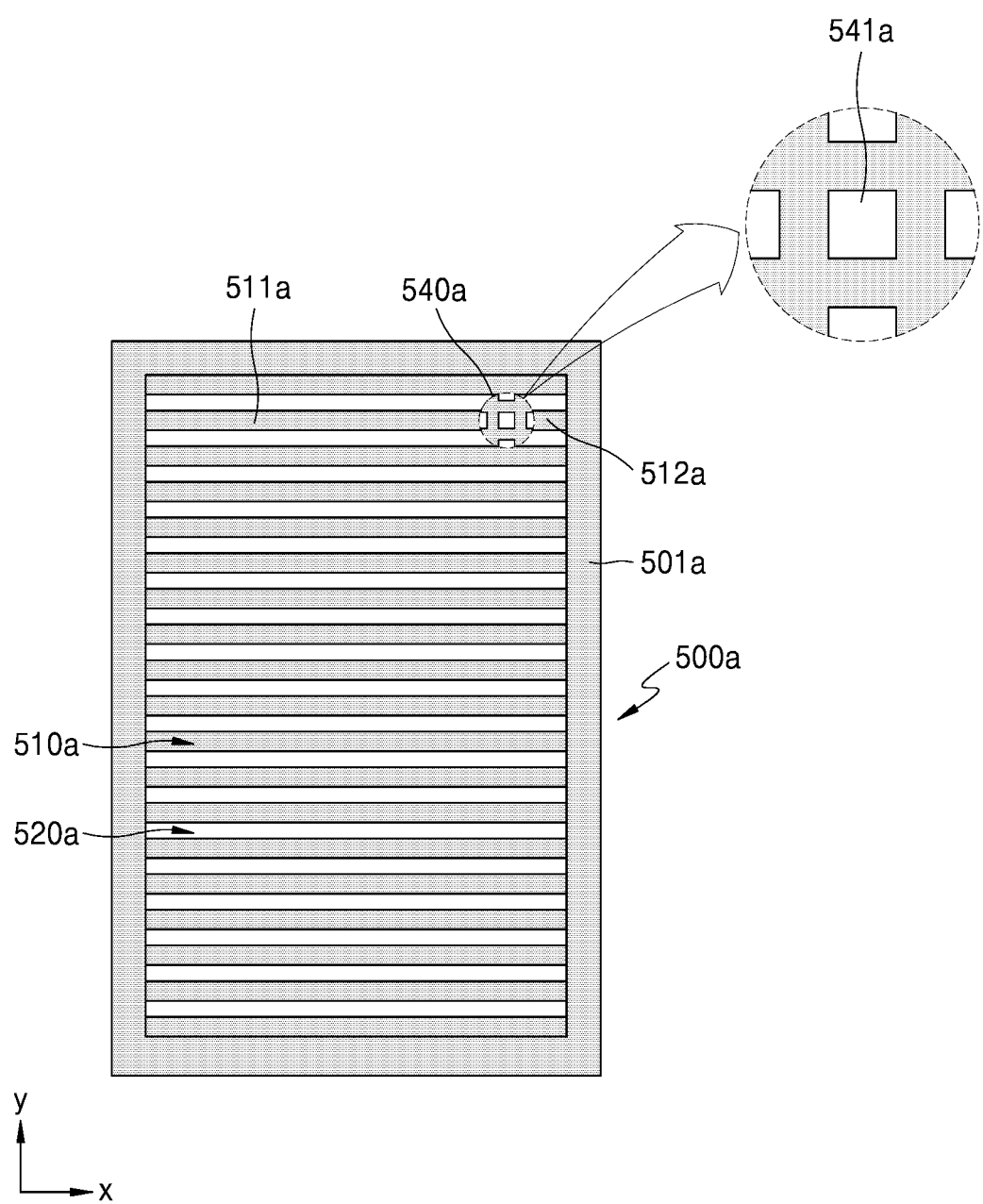
FIG. 7A is a plan view illustrating a first mask of the apparatus for manufacturing the display apparatus according to an embodiment of the present disclosure.
Figure 7B:
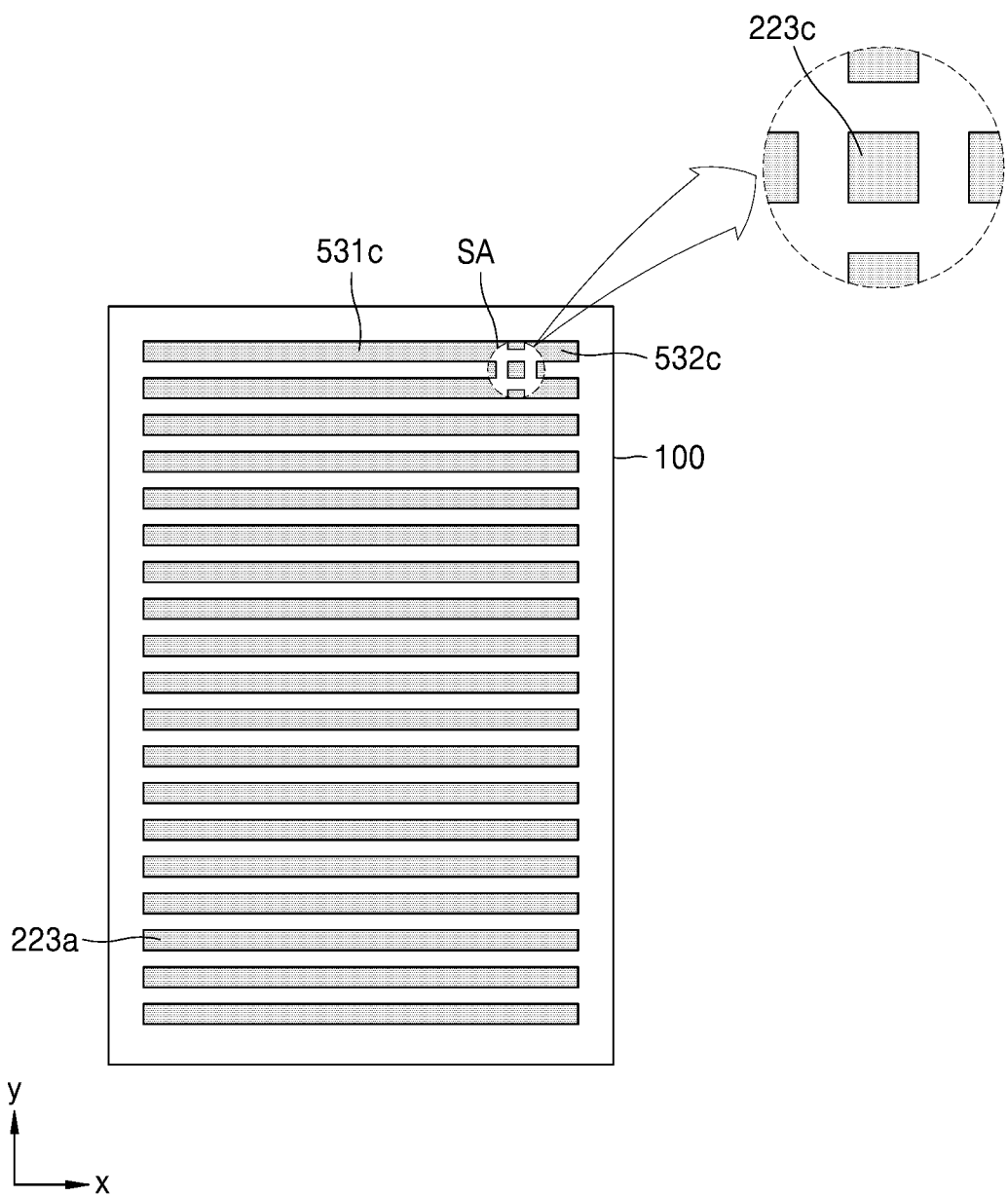
FIG. 7B is a plan view illustrating a part of a counter electrode formed on a substrate by placing the first mask on a second support portion and then depositing a deposition material in a manufacturing method according to an embodiment of the present disclosure.
Figure 7C:
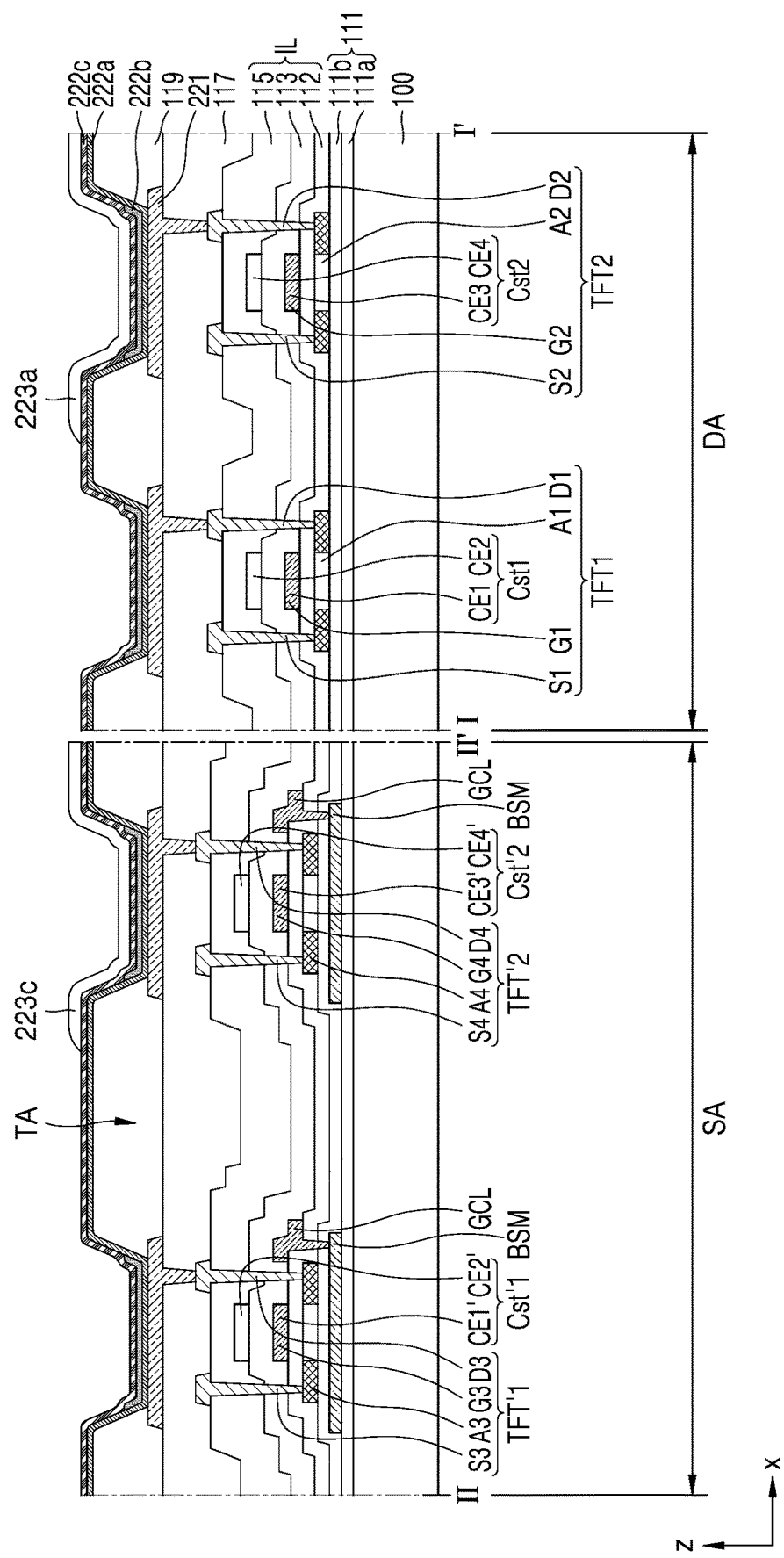
FIG. 7C is a cross-sectional view illustrating a part of the counter electrode formed on the substrate by placing the first mask on the second support portion and then depositing a deposition material in a manufacturing method according to an embodiment of the present disclosure.

FIG. 7A is a plan view illustrating the first mask 500a of the apparatus 400 for manufacturing the display apparatus 1 according to an embodiment of the present disclosure. FIG. 7B is a plan view illustrating a part of the counter electrode 223 formed on the substrate 100 by placing the first mask 500a on the second support portion 430 and then depositing a deposition material in a manufacturing method according to an embodiment of the present disclosure. FIG. 7C is a cross-sectional view illustrating a part of the counter electrode 223 formed on the substrate 100 by placing the first mask 500a on the second support portion 430 and then depositing a deposition material in a manufacturing method according to an embodiment of the present disclosure. In FIG. 7C, the same member as that in FIG. 5 may be denoted by the same reference numeral, and a repeated explanation will not be given for the sake of brevity.

Referring to FIGS. 7A through 7C, the first mask 500a may include a first mask body portion 501a, a first rib portion 510a, a first rib connector 511a, a second rib connector 512a, a first mask opening portion 520a, and a first shield portion 540a.

The first mask body portion 501a may have a quadrangular shape in a plan view. In this case, the first mask body portion 501a may have a long side and a short side. For example, the long side of the first mask body portion 501a may extend in a y-direction of FIG. 7A, and the short side of the first mask body portion 501a may extend in an x-direction of FIG. 7A. For convenience of explanation, the following will be described in more detail on the assumption that the first mask body portion 501a has a quadrangular shape in a plan view.

The first rib portion 510a may include a plurality of first ribs arranged inside the first mask 500a to be spaced apart from one another. For example, the first ribs may be arranged to be spaced apart from one another in the y-direction of FIG. 7A. In this case, each first rib may be connected to the first mask body portion 501a. For example, each first rib may be integrally formed with the first mask body portion 501a, or may be manufactured separately from the first mask body portion 501a and then may be fixed to the first mask body portion 501 by using welding or the like.

The first mask 500a may include a plurality of the first mask opening portions 520a that are arranged to be spaced apart from one another. For example, the first mask opening portions 520a may be arranged to be spaced apart from one another in the y-direction of FIG. 7A. That is, the first mask opening portions 520a may be formed parallel to the long side of the first mask body portion 501a or a short side of the first mask 500a. Each of the first mask opening portions 520a may have a rectangular shape or a square shape. However, the present disclosure is not limited thereto. Various suitable modifications, including a case where a corner portion of each first mask opening portion 520a has a curvature, may be made. The first mask opening portion 520a may be arranged between adjacent first ribs.

The first shield portion 540a may be provided on the first mask 500a to correspond to the sensor area SA. The first shield portion 540a shields a deposition material. Also, an edge portion of the first shield portion 540a has any of various suitable shapes such as a polygonal shape (e.g., a triangular shape or a rectangular shape) or a circular shape. However, for convenience of explanation, the following will be described in more detail on the assumption that an edge portion of the first shield portion 540a has a circular shape.

The first shield portion 540a may include first opening portions 541a formed in the transmission portion TA in a pattern to correspond to the second auxiliary pixels Pa2. Also, the first opening portions 541a may be spaced apart from one another to have a set or predetermined pattern. Various suitable modifications, including a case where each first opening portion 541a has a polygonal shape or a circular shape in a plan view, may be made. However, for convenience of explanation, the following will be described in more detail on the assumption that the first opening portion 541a has a quadrangular shape in a plan view.

The first shield portion 540a may be fixed in various suitable ways. For example, the first shield portion 540a may be connected to and supported on one first rib. In another embodiment, the first shield portion 540a may be connected to and supported on at least two first ribs. For example, the first shield portion 540a may be connected to the first mask body portion 501a to cross in the x-direction due to the first rib connector 511a and the second rib connector 512a.

One of the first mask opening portions 520a may be divided into two parts by the first shield portion 540a. For example, the first mask opening portion 520a arranged between the first rib connector 511a and the second rib connector 512a may be divided into two parts based on the first shield portion 540a.

A deposition material may evaporate in the deposition source 460 and may pass through the first opening portions 541a of the first mask 500a. The first auxiliary counter electrodes 223c may be formed on the substrate 100 to correspond to the second auxiliary pixels Pa2 of the sensor area SA.

The first auxiliary counter electrodes 223c may be formed in the sensor area SA to be spaced apart from one another. For example, each of the first auxiliary counter electrodes 223c may have a quadrangular shape in a plan view. However, the present disclosure is not limited thereto. Various suitable modifications, including a case where the first auxiliary counter electrode 223c has a circular shape in a plan view, may be made. However, for convenience of explanation, the following will be described in more detail on the assumption that the first auxiliary counter electrode 223c has a quadrangular shape in a plan view. In particular, a shape of the first auxiliary counter electrode 223c in a plan view may be the same as or similar to that of the first opening portion 541a of the first shield portion 540a.

When the first auxiliary counter electrodes 223c are formed on the substrate 100, the plurality of first main counter electrodes 223a may be formed in the display area DA to be spaced apart from one another (see FIG. 7C). For example, the first main counter electrodes 223a may be spaced apart from one another in a pattern to correspond to the first mask opening portions 520a of the first mask 500a.

Some of the first main counter electrodes 223a, corresponding to the first shield portion 540a, may be divided into a side part (i.e., left side part) 531c and another side part (i.e., right side part) 532c. That is, the first main counter electrode 223a may be divided into two parts based on the sensor area SA.

Some of the first main counter electrodes 223a may have stripe shapes. For example, the first main counter electrodes 223a may be arranged to be spaced apart from one another in the y-direction of FIG. 7B.

Figure 8A:
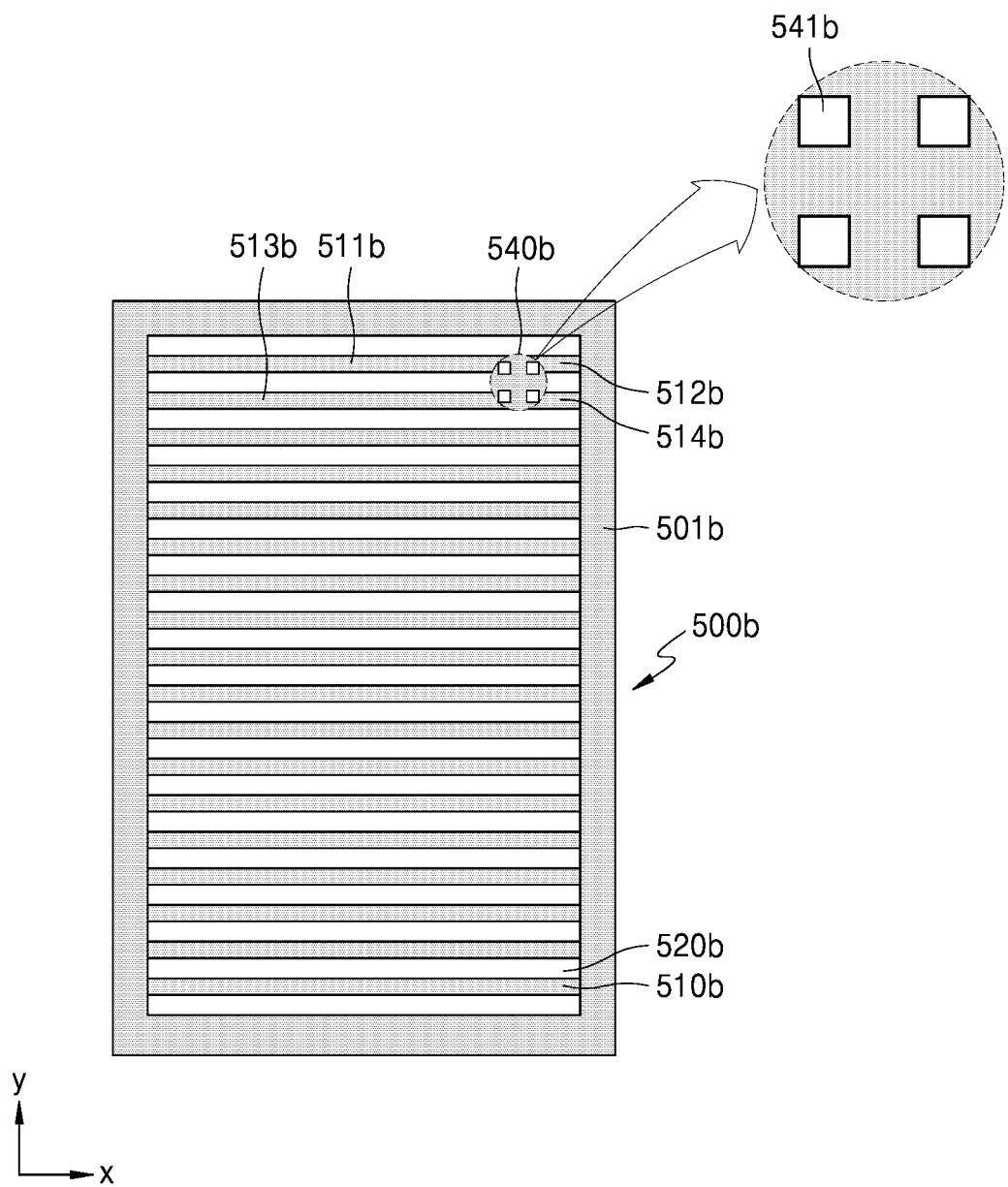
FIG. 8A is a plan view illustrating a second mask of the apparatus for manufacturing the display apparatus according to an embodiment of the present disclosure.
Figure 8B:
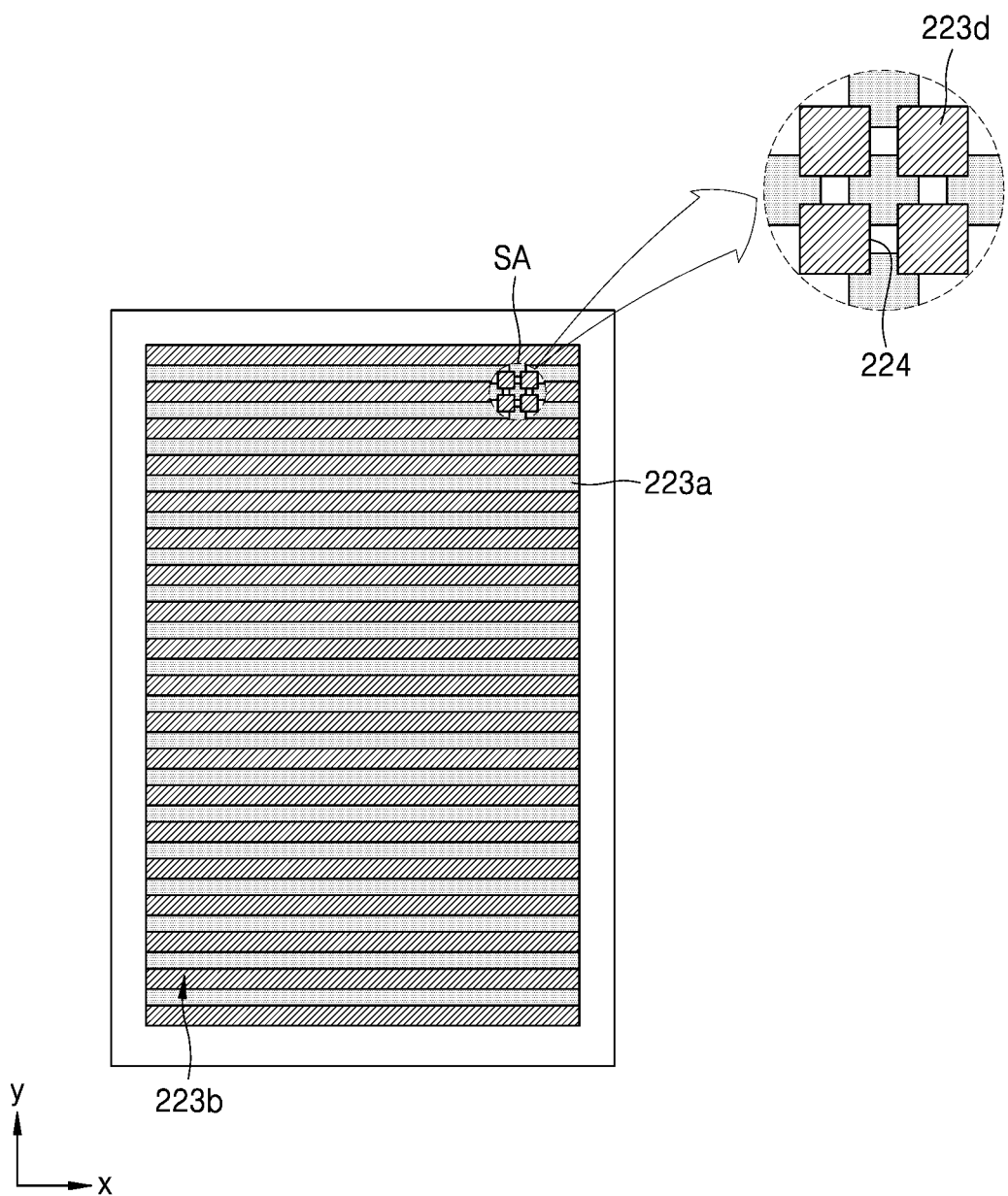
FIG. 8B is a plan view illustrating the counter electrode formed on the substrate by placing the second mask on the second support portion and then depositing a deposition material in a manufacturing method according to an embodiment of the present disclosure.
Figure 8C:
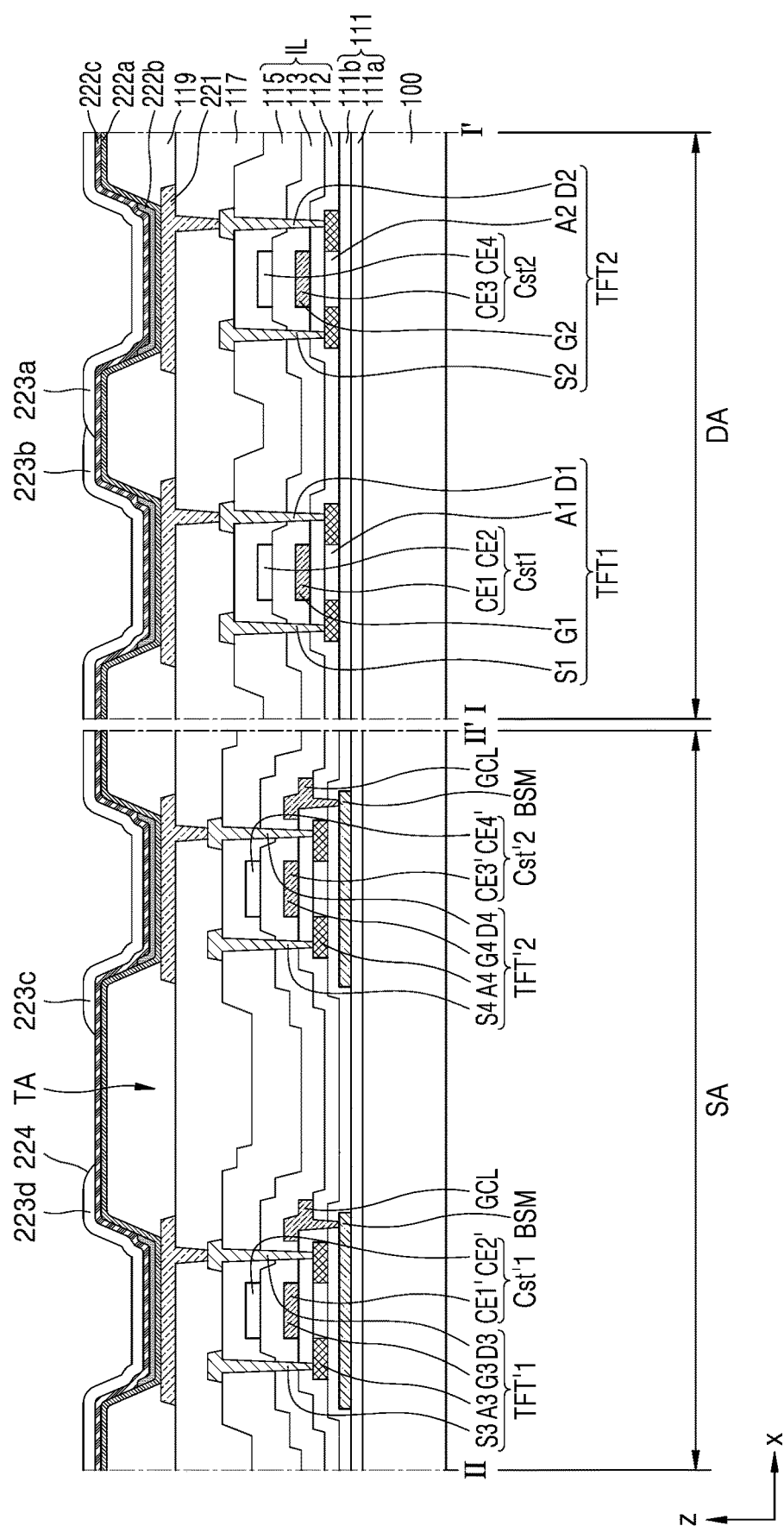
FIG. 8C is a cross-sectional view illustrating the counter electrode formed on the substrate by placing the second mask on the second support portion and then depositing a deposition material in a manufacturing method according to an embodiment of the present disclosure.

FIG. 8A is a plan view illustrating the second mask 500b of the apparatus 400 for manufacturing the display apparatus 1 according to an embodiment of the present disclosure. FIG. 8B is a plan view illustrating the counter electrode 223 formed on the substrate 100 by placing the second mask 500b on the second support portion 430 and then depositing a deposition material in a manufacturing method according to an embodiment of the present disclosure. FIG. 8C is a cross-sectional view illustrating the counter electrode 223 formed on the substrate 100 by placing the second mask 500b on the second support portion 430 and then depositing a deposition material in a manufacturing method according to an embodiment of the present disclosure. In FIG. 8C, the same member as that in FIG. 5 may be denoted by the same reference numeral, and a repeated explanation thereof will not be given for the sake of brevity.

Referring to FIGS. 8A through 8C, the second mask 500b may include a second mask body portion 501b, a second rib portion 510b, a third rib connector 511b, a fourth rib connector 512b, a second mask opening portion 520b, and a second shield portion 540b.

The second mask body portion 501b may have a quadrangular shape in a plan view. In this case, the second mask body portion 501b may have a long side and a short side. For example, the long side of the second mask body portion 501b may extend in a y-direction of FIG. 8A, and the short side of the second mask body portion 501b may extend in an x-direction of FIG. 8A. However, for convenience of explanation, the following will be described in more detail on the assumption that the second mask body portion 501b has a quadrangular shape in a plan view.

The second rib portion 510b may include a plurality of second ribs arranged inside the second mask 500b to be spaced apart from one another. For example, the second ribs may be arranged to be spaced apart from one another in the y-direction of FIG. 8A. The second ribs may contact inside the second mask 500b (i.e., contact the inside of the second mask body portion 501b). Also, the second ribs may be arranged between the first ribs when perpendicularly or normally projected by matching both vertexes of the first mask body portion 501a of the first mask 500a and the second mask body portion 501b of the second mask 500b. In this case, the first ribs and the second ribs may be alternately arranged.

The second mask 500b may include a plurality of the second mask opening portions 520b arranged to be spaced apart from one another. For example, the second mask opening portions 520b may be arranged to be spaced apart from one another in the y-direction of FIG. 8A. That is, the second mask opening portions 520b may be formed parallel to a short side of the second mask 500b. Each of the second mask opening portions 520b may have a rectangular shape or a square shape. However, the present disclosure is not limited thereto. Various suitable modifications, including a case where a corner portion of each second mask opening portion 520b has a curvature, may be made. The second mask opening portions 520b may be arranged between the first mask opening portions 520a when perpendicularly or normally projected by matching both vertexes of the first mask body portion 501a of the first mask 500a and the second mask body portion 501b of the second mask 500b.

The second shield portion 540b may be provided on the second mask 500b to correspond to the sensor area SA. The second shield portion 540b may shield a deposition material, and may divide at least one of the second mask opening portions 520b into two parts. Also, the second shield portion 540b may have any of various suitable shapes to correspond to the first shield portion 540a. However, for convenience of explanation, the following will be described in more detail on the assumption that the second shield portion 540b has a circular shape.

The second shield portion 540b may include second opening portions 541b provided in the transmission portion TA in a pattern to correspond to the first auxiliary pixels Pa1. Also, the second opening portions 541b may be spaced apart from one another to have a pattern. A pattern of the second opening portions 541b may be different from that of the first opening portions 541a. For example, the center of the second opening portion 541b may not overlap the center of the first opening portion 541a. Various suitable modifications, including a case where the second opening portion 541b has a quadrangular shape or a circular shape in a plan view, may be made. However, for convenience of explanation, the following will be described in more detail on the assumption that the second opening portion 541b has a quadrangular shape in a plan view.

The second shield portion 540b may be connected to and supported on at least one second rib. For example, in an embodiment, the second shield portion 540b may be connected to and supported on one rib. In another embodiment, the second shield portion 540b may be connected to at least two second ribs. In more detail, the second shield portion 540b may be connected to the second mask body portion 501b to cross in the x-direction due to the third rib connector 511b and the fourth rib connector 512b. The third rib connector 511b and the fourth rib connector 512b may be spaced apart by the same distance from the short side of the second mask body portion 501b.

The second shield portion 540b may be supported by the third rib connector 511b and the fourth rib connector 512b. In this case, the second shield portion 540b may divide the second opening portion 541b between two adjacent second ribs. That is, the second shield portion 540b may divide the second opening portion 541b into a portion between the third rib connector 511b and a fifth rib connector 513b and a portion between the fourth rib connector 512b and a sixth rib connector 514b.

The second mask 500b may further include the fifth rib connector 513b and the sixth rib connector 514b. The second shield portion 540b may be connected to the second mask body portion 501b to cross in the x-direction due to the fifth rib connector 513b and the sixth rib connector 514b. The fifth rib connector 513b and the sixth rib connector 514b may be spaced apart by the same distance from the short side of the second mask body portion 501b.

The second shield portion 540b may be supported by the third rib connector 511b and the fourth rib connector 512b, and may be further supported by the fifth rib connector 513b and the sixth rib connector 514b.

Accordingly, deformation of at least one of the third rib connector 511b through the sixth rib connector 514b connected to the second shield portion 540b may be reduced or prevented. Also, an initial or substantially initial shape of the second mask 500b may be maintained.

As shown in FIGS. 8B and 8C, a deposition material may be deposited on the display area DA, the first mask 500a may be taken out of the chamber 410, the second mask 500b may be inserted into the chamber 410, and a deposition material may be supplied from the deposition source 460 to be deposited on the display area DA of the substrate 100 through the second opening portions 541b of the second mask 500b. In this case, the second auxiliary counter electrodes 223d may be formed on the substrate 100 to correspond to the first auxiliary pixels Pa1 of the sensor area SA.

The second auxiliary counter electrodes 223d may be spaced apart from one another in the sensor area SA to have a pattern different from that of the first auxiliary counter electrodes 223c. For example, the second auxiliary counter electrodes 223d and the first auxiliary counter electrodes 223c may be alternately arranged. In this case, in an embodiment, the second auxiliary counter electrodes 223d may not overlap the first auxiliary counter electrodes 223c. In another embodiment, the first auxiliary counter electrode 223c and the second auxiliary counter electrode 223d that are adjacent to each other may at least partially overlap each other. In this case, the first auxiliary counter electrode 223c and the second auxiliary counter electrode 223d, each having a quadrangular shape in a plan view, may overlap at corner portions. Accordingly, a uniform voltage may be formed in the first auxiliary counter electrode 223c and the second auxiliary counter electrode 223d. For convenience of explanation, the following will be described in more detail on the assumption that the first auxiliary counter electrode 223c and the second auxiliary counter electrode 223d partially overlap each other.

When the second auxiliary counter electrodes 223d are formed on the substrate 100, the plurality of second main counter electrodes 223b may be formed in the display area DA to be spaced apart from one another (see FIG. 8C). For example, the second main counter electrodes 223b may be spaced apart from one another in a pattern to correspond to the second mask opening portions 520b of the second mask 500b.

The second main counter electrode 223b may be arranged between adjacent first main counter electrodes 223a of the first main counter electrodes 223a. In this case, the first main counter electrode 223a and the second main counter electrode 223b may at least partially overlap each other in a plan view.

Some of the second main counter electrodes 223b may have stripe shapes. For example, the second main counter electrodes 223b may be arranged to be spaced apart from one another in the y-direction of FIG. 8B.

The first auxiliary counter electrodes 223c and the second auxiliary counter electrodes 223d may be spaced apart from each other, and the opening 224 corresponding to the counter electrode 223 may be formed in the transmission portion TA of the sensor area SA. Accordingly, a transmittance in the transmission portion TA of the sensor area SA may be improved.

Figure 9A:
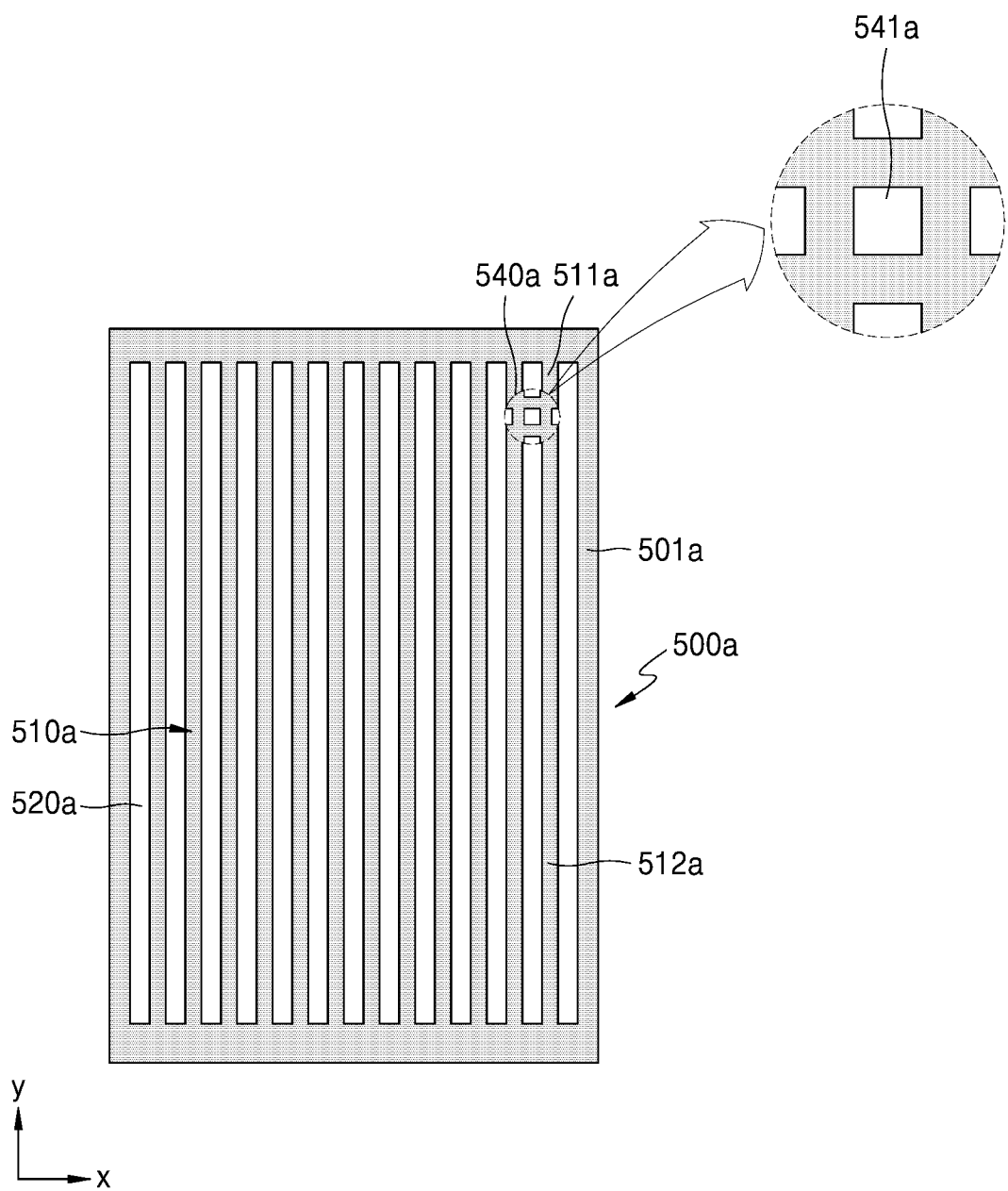
FIG. 9A is a plan view illustrating the first mask of the apparatus for manufacturing the display apparatus according to another embodiment of the present disclosure.

FIG. 9A is a plan view illustrating the first mask 500a of the apparatus 400 for manufacturing the display apparatus 1 according to another embodiment of the present disclosure.

The first mask 500a may include the first mask body portion 501a, the first rib portion 510a, the first rib connector 511a, the second rib connector 512a, the first mask opening portion 520a, and the first shield portion 540a. In this case, the first mask body portion 501a, the first rib portion 510a, the first rib connector 511a, the second rib connector 512a, the first mask opening portion 520a, and the first shield portion 540a are the same as or similar to those of FIG. 7A, and thus a detailed explanation thereof will not be given. The following will focus on a difference from that described with reference to FIG. 7A.

The first rib portions 510a may be arranged to be spaced apart from one another in an x-direction of FIG. 9A. Also, the first mask opening portions 520a may be arranged to be spaced apart from one another in the x-direction of FIG. 9A. That is, each first mask opening portion 520a may be formed parallel to a long side of the first mask body portion 501a.

Figure 9B:
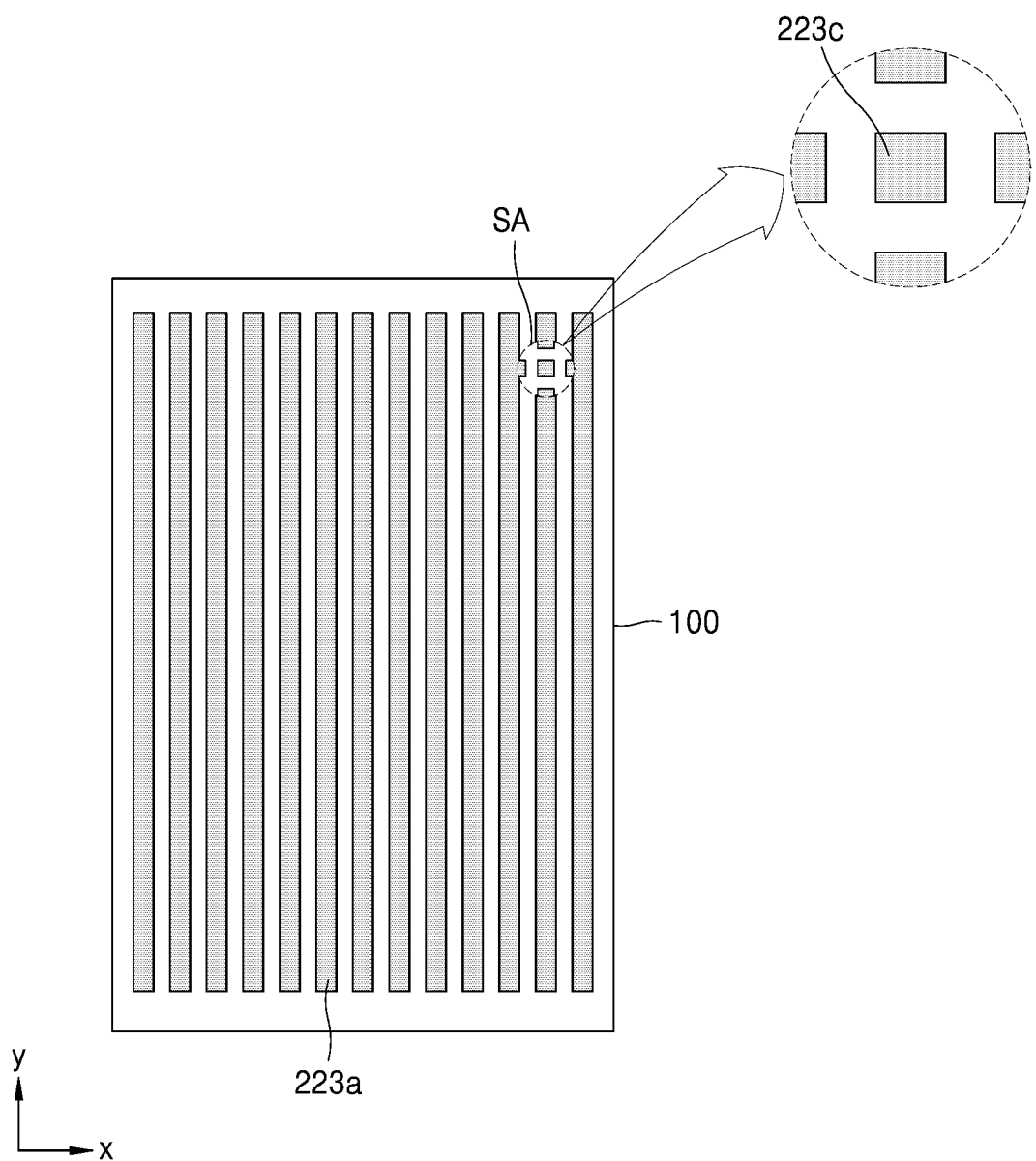
FIG. 9B is a plan view illustrating a part of the counter electrode formed on the substrate by placing the first mask on the second support portion and then depositing a deposition material in a manufacturing method according to another embodiment of the present disclosure.

FIG. 9B is a plan view illustrating a part of the counter electrode 223 formed on the substrate 100 by placing the first mask 500a on the second support portion 430 and then depositing a deposition material in a manufacturing method according to another embodiment of the present disclosure.

Referring to FIG. 9B, the first auxiliary counter electrodes 223c and the first main counter electrodes 223a are the same as or similar to those of FIG. 7B, and thus a detailed explanation thereof will not be given. Also, a cross-sectional view of the first auxiliary counter electrodes 223c and the first main counter electrodes 223a formed on the substrate 100 is the same as or similar to that of FIG. 7C, and thus an explanation thereof will not be given.

The first main counter electrodes 223a may be arranged to be spaced apart from one another in the x-direction of FIG. 9B.

Figure 10A:
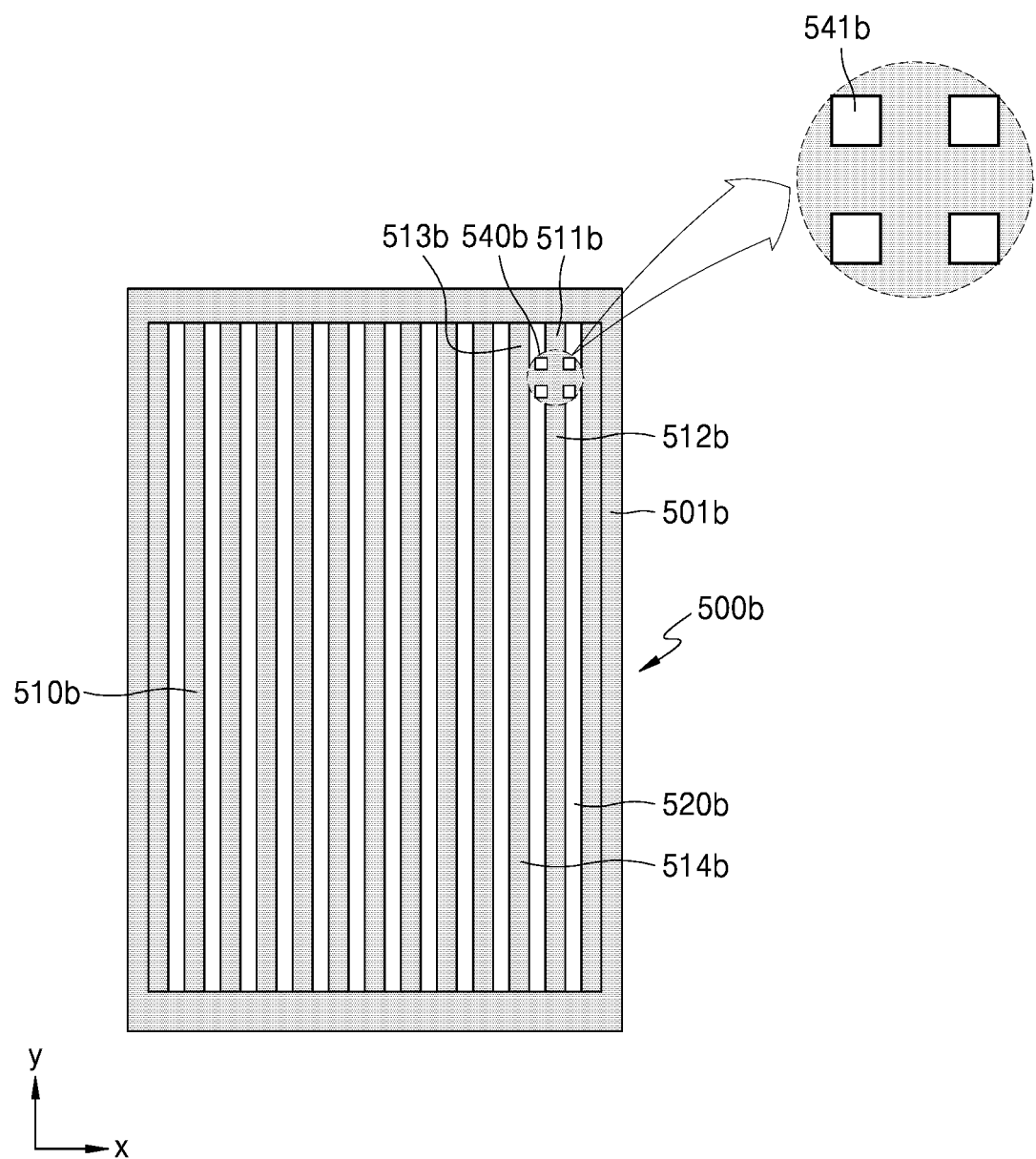
FIG. 10A is a plan view illustrating the second mask of the apparatus for manufacturing the display apparatus according to another embodiment of the present disclosure.

FIG. 10A is a plan view illustrating the second mask 500b of the apparatus 400 for manufacturing the display apparatus 1 according to another embodiment of the present disclosure.

Referring to FIG. 10A, the second mask 500b may include the second mask body portion 501b, the second rib portion 510b, the third rib connector 511b, the fourth rib connector 512b, the second mask opening portion 520b, and the second shield portion 540b. However, the second mask body portion 501b, the second rib portion 510b, the third rib connector 511b, the fourth rib connector 512b, the second mask opening portion 520b, and the second shield portion 540b are the same as or similar to those of FIG. 8A, and thus a detailed explanation thereof will not be given.

The second rib portions 510b may be arranged to be spaced apart from one another in an x-direction of FIG. 10A. Also, the second mask opening portions 520b may be arranged to be spaced apart from one another in the x-direction of FIG. 10A. That is, each second mask opening portion 520b may be formed parallel to a long side of the second mask body portion 501b.

The second shield portion 540b may be connected to the second mask body portion 501b to cross in a y-direction due to the third rib connector 511b and the fourth rib connector 512b. Also, the second mask 500b may further include the fifth rib connector 513b and the sixth rib connector 514b. The second shield portion 540b may be further connected to the second mask body portion 501b to cross in the y-direction due to the fifth rib connector 513b and the sixth rib connector 514b.

Figure 10B:
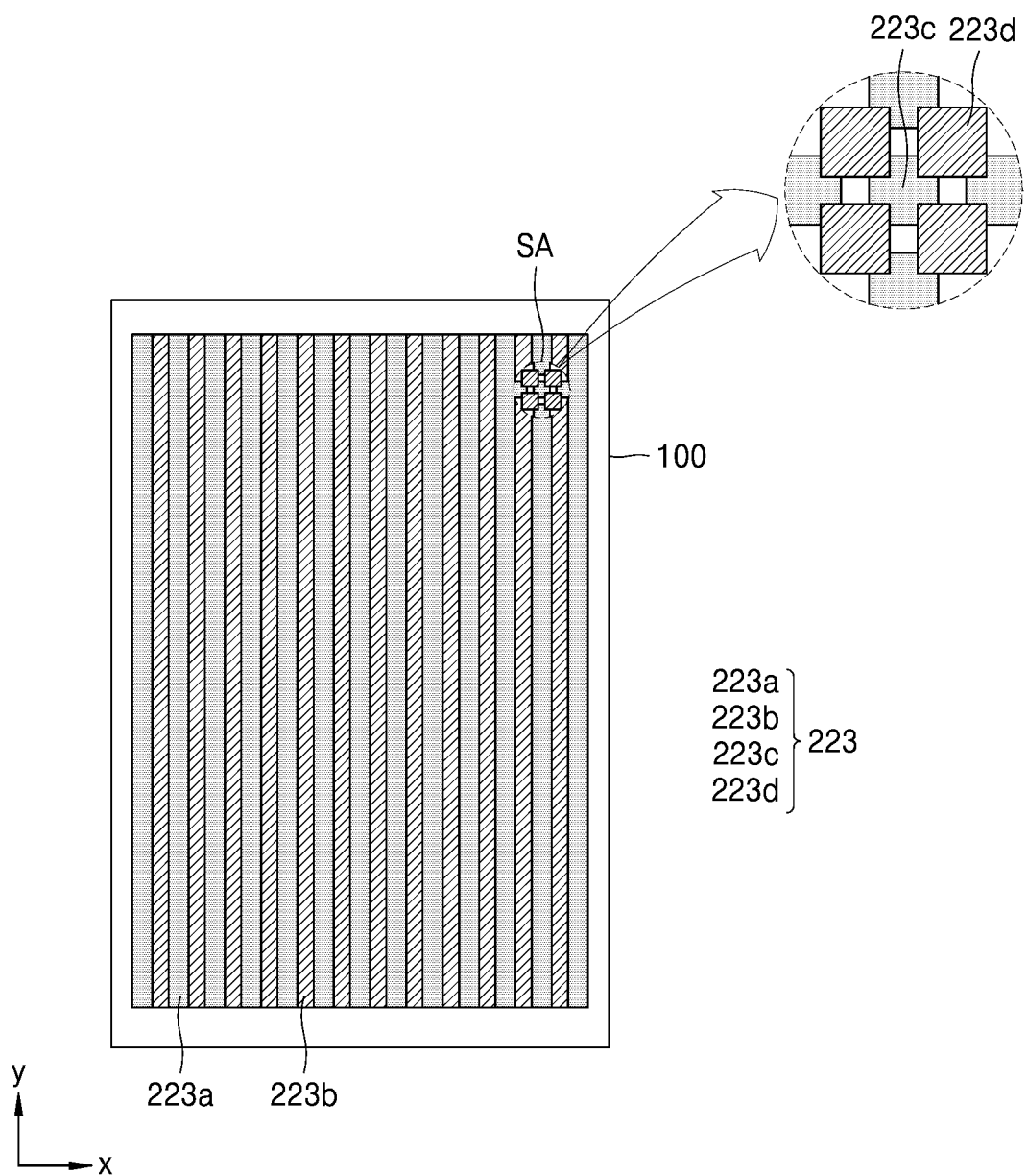
FIG. 10B is a plan view illustrating the counter electrode formed on the substrate by placing the second mask on the second support portion and then depositing a deposition material in a manufacturing method according to another embodiment of the present disclosure.

FIG. 10B is a plan view illustrating the counter electrode 223 formed on the substrate 100 by placing the second mask 500b on the second support portion 430 and then depositing a deposition material in a manufacturing method according to another embodiment of the present disclosure.

The second auxiliary counter electrodes 223d and the second main counter electrodes 223b are the same as or similar to those of FIG. 8B, and thus a detailed explanation thereof will not be given. Also, a cross-sectional view of the second auxiliary counter electrodes 223d and the second main counter electrodes 223b formed on the substrate 100 is the same as or similar to that of FIG. 8C, and thus an explanation thereof will not be given.

The first main counter electrodes 223a and the second main counter electrodes 223b may be arranged to be spaced apart from each other in the x-direction of FIG. 10B.

Figure 11A:
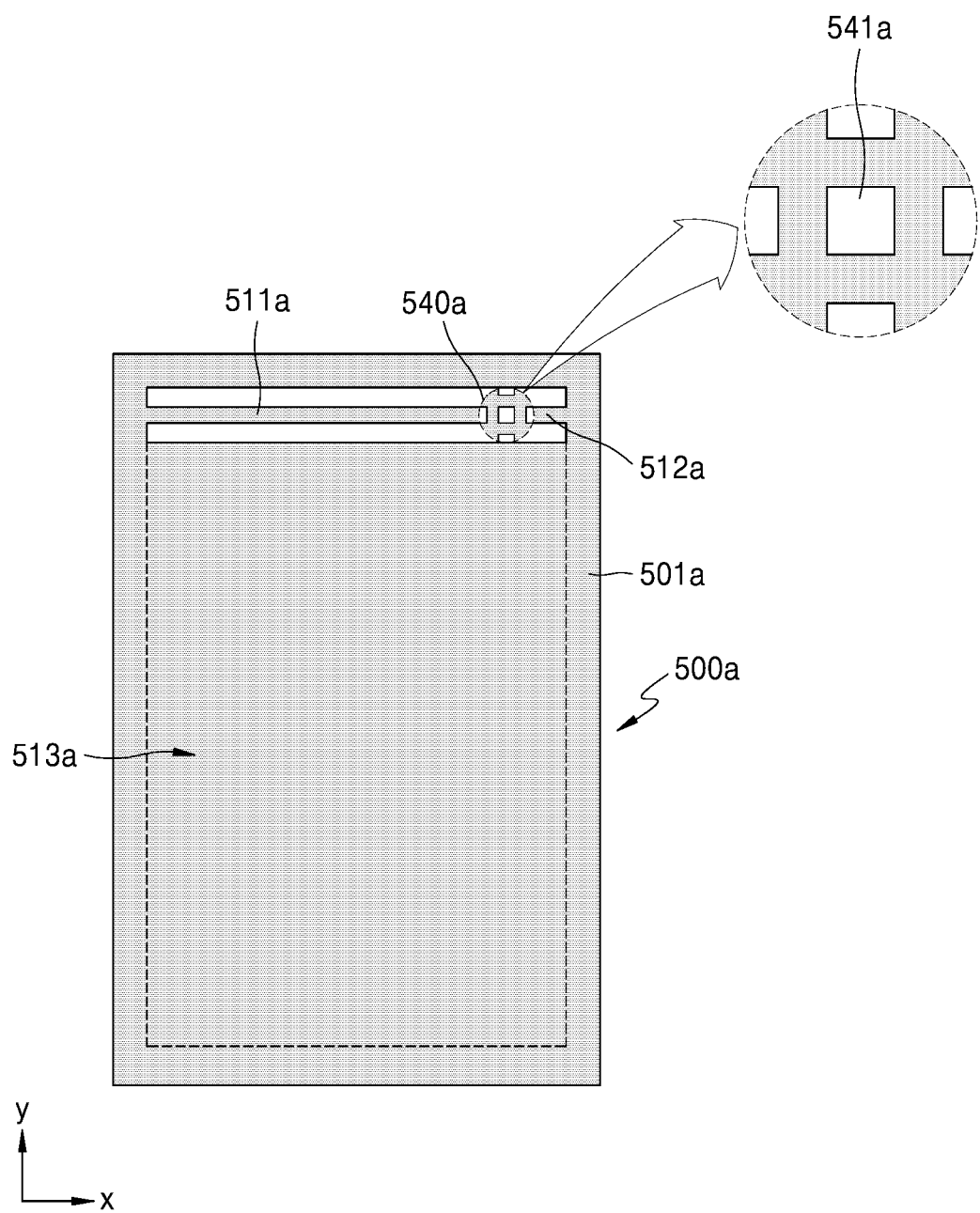
FIG. 11A is a plan view illustrating the first mask of the apparatus for manufacturing the display apparatus according to another embodiment of the present disclosure.

FIG. 11A is a plan view illustrating the first mask 500a of the apparatus 400 for manufacturing the display apparatus 1 according to another embodiment of the present disclosure. The same member as that of FIG. 7A is denoted by the same reference numeral, and a repeated explanation thereof will not be given for the sake of brevity.

Referring to FIG. 11A, the first mask 500a may further include a third rib portion 513a. The third rib portion 513a may be connected to a long side of the first mask body portion 501a. Also, the third rib portion 513a may be connected to the first shield portion 540a and a short side of the first mask body portion 501a. Accordingly, the third rib portion 513a may be formed on a substantial (most) portion of the first mask opening portion 520a. For example, the first mask opening portion 520a may be arranged only adjacent to the first shield portion 540a.

The third rib portion 513a may prevent or reduce deformation of the first rib connector 511a or the second rib connector 512a connected to the first shield portion 540a. Also, an initial or substantially initial shape of the first mask 500a may be maintained.

Figure 11B:
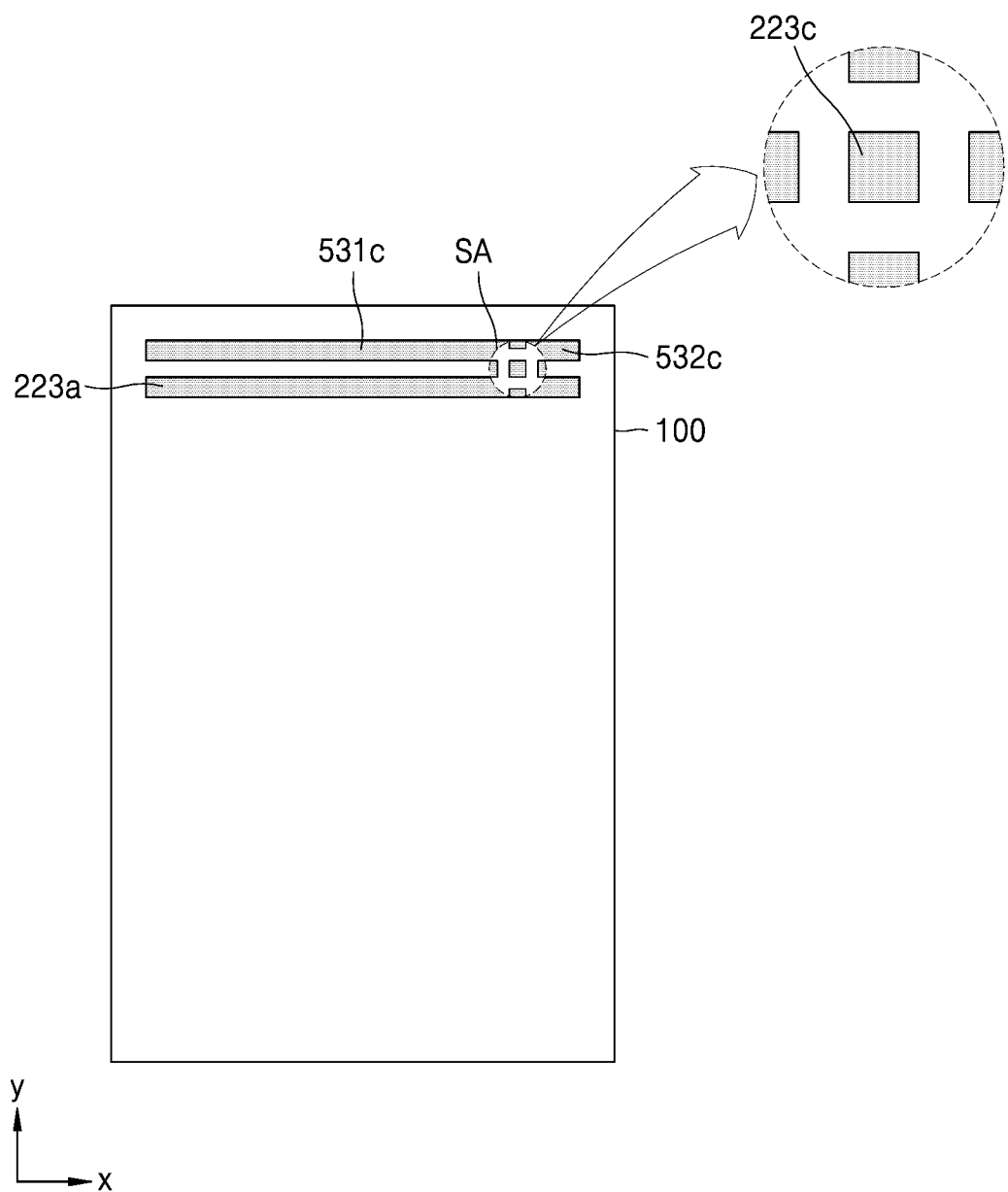
FIG. 11B is a plan view illustrating a part of the counter electrode formed on the substrate by placing the first mask on the second support portion and then depositing a deposition material in a manufacturing method according to another embodiment of the present disclosure.

FIG. 11B is a plan view illustrating a part of the counter electrode 223 formed on the substrate 100 by placing the first mask 500a on the second support portion 430 and then depositing a deposition material in a manufacturing method according to another embodiment of the present disclosure. The same member as that of FIG. 7B may be denoted by the same reference numeral, and a repeated explanation thereof will not be given for the sake of brevity.

The first main counter electrodes 223a may be formed adjacent to the sensor area SA. Also, some of the plurality of first main counter electrodes 223a may have stripe shapes.

The planar area of the side part (i.e., left side part) 531c of the first main counter electrode 223a may be different from the planar area of another side part (i.e., right side part) 532c of the first main counter electrode 223a. However, the present disclosure is not limited thereto. Various suitable modifications, including a case where the planar areas of the first main counter electrodes 223a are the same, may be made. However, for convenience of explanation, the following will be described in more detail on the assumption that the planar area of one side part 531c of the first main counter electrode 223a and the planar area of another side part 532c of the first main counter electrode 223a are different from each other.

Figure 12A:
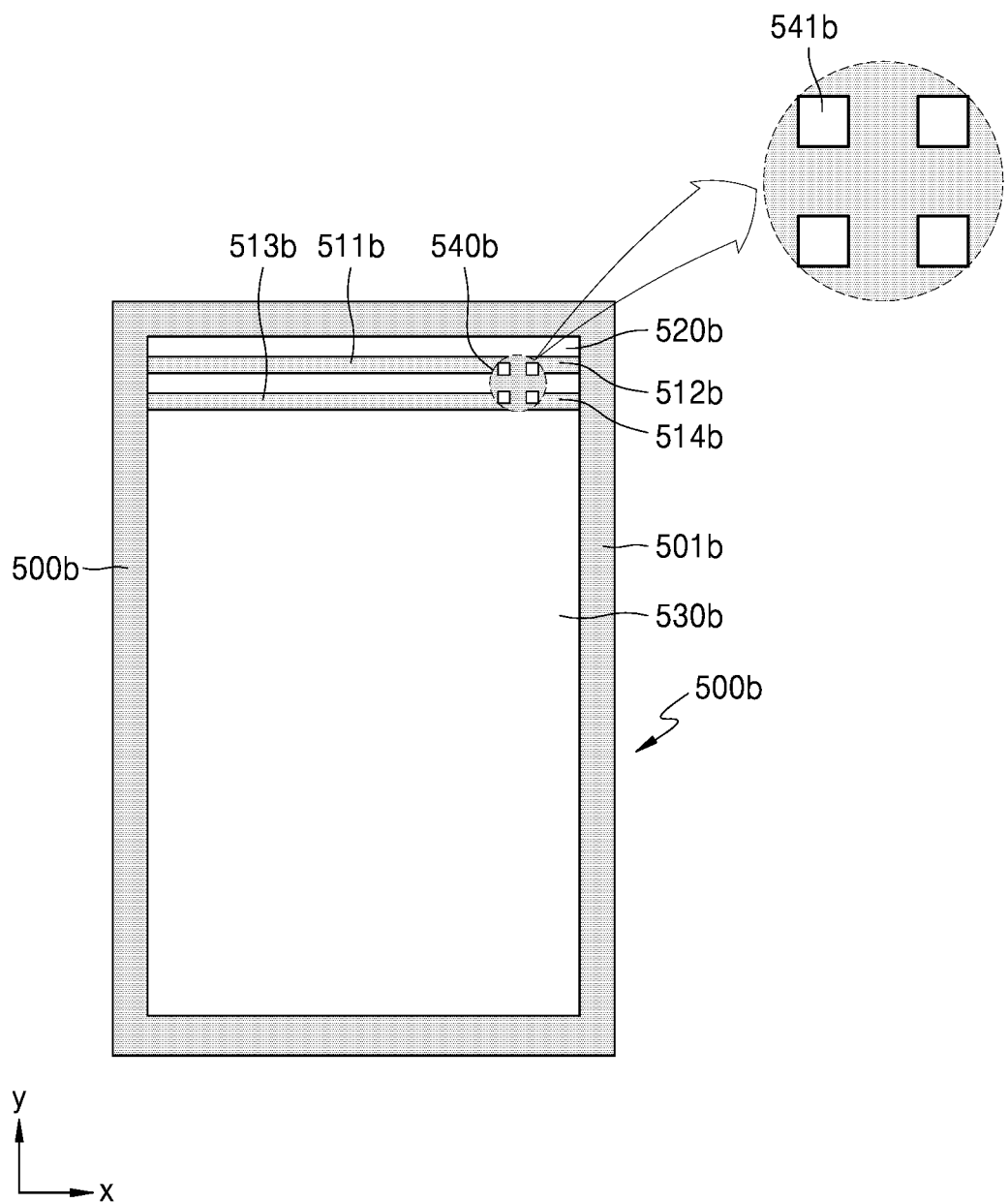
FIG. 12A is a plan view illustrating the second mask of the apparatus for manufacturing the display apparatus according to another embodiment of the present disclosure.

FIG. 12A is a plan view illustrating the second mask 500b of the apparatus 400 for manufacturing the display apparatus 1 according to another embodiment of the present disclosure. The same member as that of FIG. 8A is denoted by the same reference numeral, and a repeated explanation thereof will not be given for the sake of brevity.

Referring to FIG. 12A, the area of one of the plurality of second mask opening portions 520b may be different from the area of another of the plurality of second mask opening portions 520b. For example, the second mask opening portion 520b may further include an adjacent opening portion 530b whose area is different from those of other portions of the second mask opening portion 520b. In this case, the second mask opening portion 520b, except for the adjacent opening portion 530b, is the same as or similar to that of FIG. 8A, and thus a detailed explanation thereof will not be given.

The adjacent opening portion 530b may be arranged adjacent to a short side of the second mask body portion 501b, and may be adjacent to at least a part of a long side of the second mask body portion 501b. Also, the adjacent opening portion 530b may be arranged adjacent to the fifth rib connector 513b or the sixth rib connector 514b.

The adjacent opening portion 530b may have a quadrangular shape in a plan view, and may be formed on a substantial (most) portion of the second mask 500b.

Figure 12B:
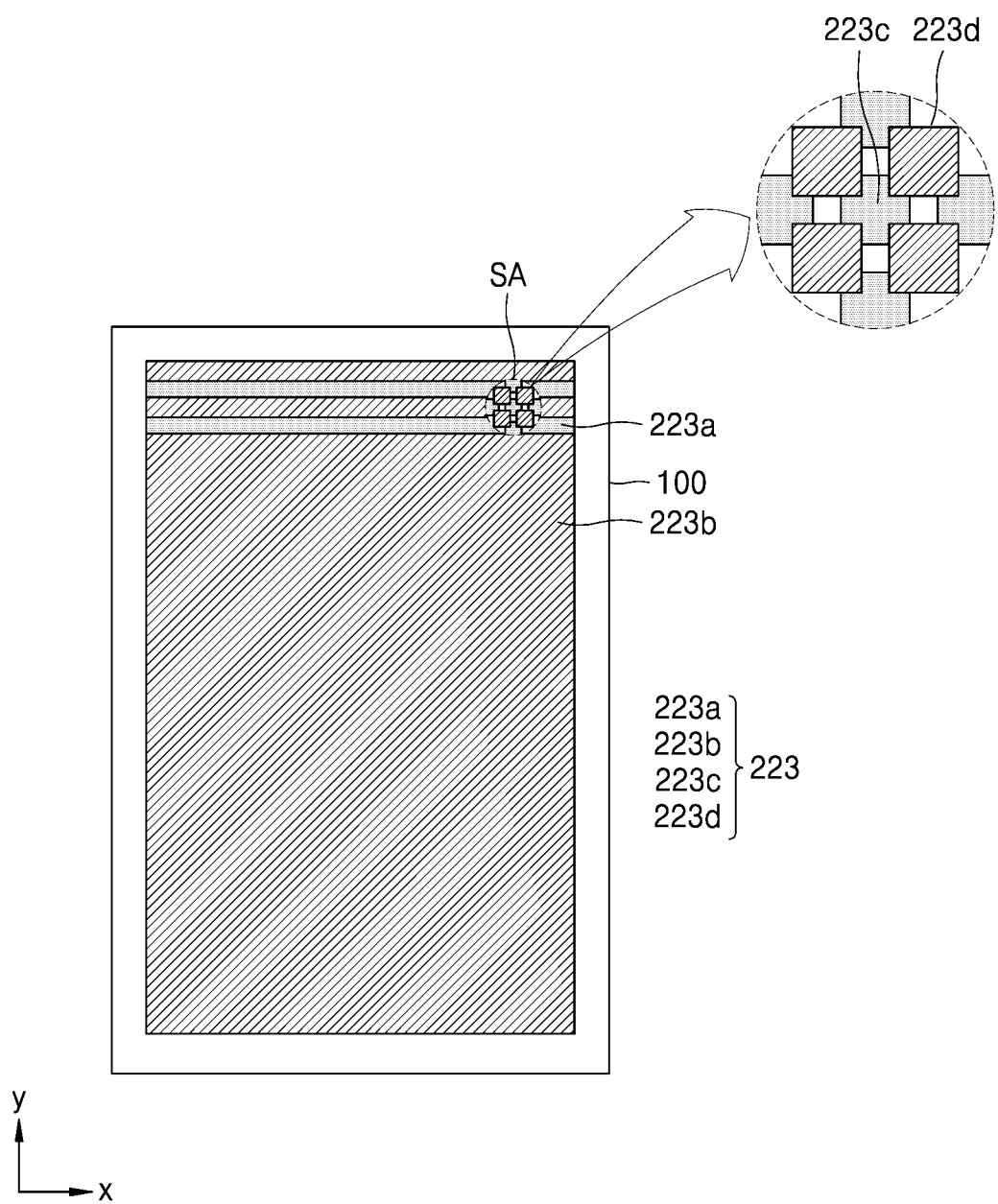
FIG. 12B is a plan view illustrating the counter electrode formed on the substrate by placing the second mask on the second support portion and then depositing a deposition material in a manufacturing method according to another embodiment of the present disclosure.

FIG. 12B is a plan view illustrating the counter electrode 223 formed on the substrate 100 by placing the second mask 500b on the second support portion 430 and then depositing a deposition material in a manufacturing method according to another embodiment of the present disclosure. The same member as that of FIG. 8B is denoted by the same reference numeral, and a repeated explanation thereof will not be given for the sake of brevity.

When the second mask 500b is aligned on the substrate 100, some of the second main counter electrodes 223b may be formed to correspond to the adjacent opening portion 530b. Because a deposition material passes through the adjacent opening portion 530b and is deposited on the substrate 100, some of the second main counter electrodes 223b may be uniformly formed. Accordingly, the number of times the first main counter electrodes 223a and the second main counter electrodes 223b overlap each other may be reduced, and thus a thickness of the counter electrode 223 may be mostly uniform.

Figure 13A:
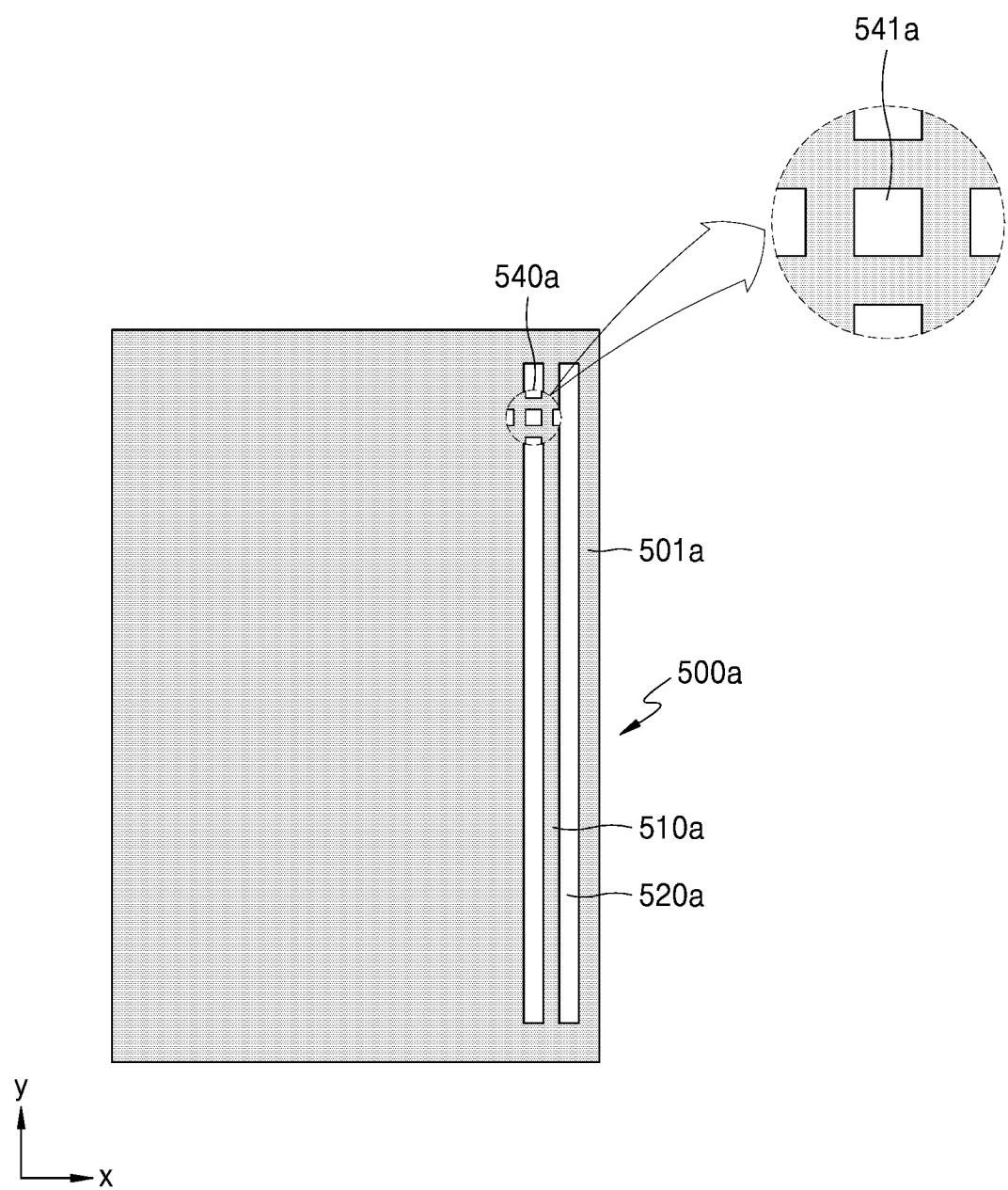
FIG. 13A is a plan view illustrating the first mask of the apparatus for manufacturing the display apparatus according to another embodiment of the present disclosure.

FIG. 13A is a plan view illustrating the first mask 500a of the apparatus 400 for manufacturing the display apparatus 1 according to another embodiment of the present disclosure. The same member as that of FIG. 11A is denoted by the same reference numeral, and a repeated explanation thereof will not be given for the sake of brevity.

The first rib portion (i.e., the first rib) 510a may be arranged to be spaced apart from the first mask body portion 501a in an x-direction of FIG. 13A. Also, the first mask opening portions 520a may be arranged to be spaced apart from one another in the x-direction of FIG. 13A. That is, each first mask opening portion 520a may be formed parallel to a long side of the first mask body portion 501a.

Figure 13B:
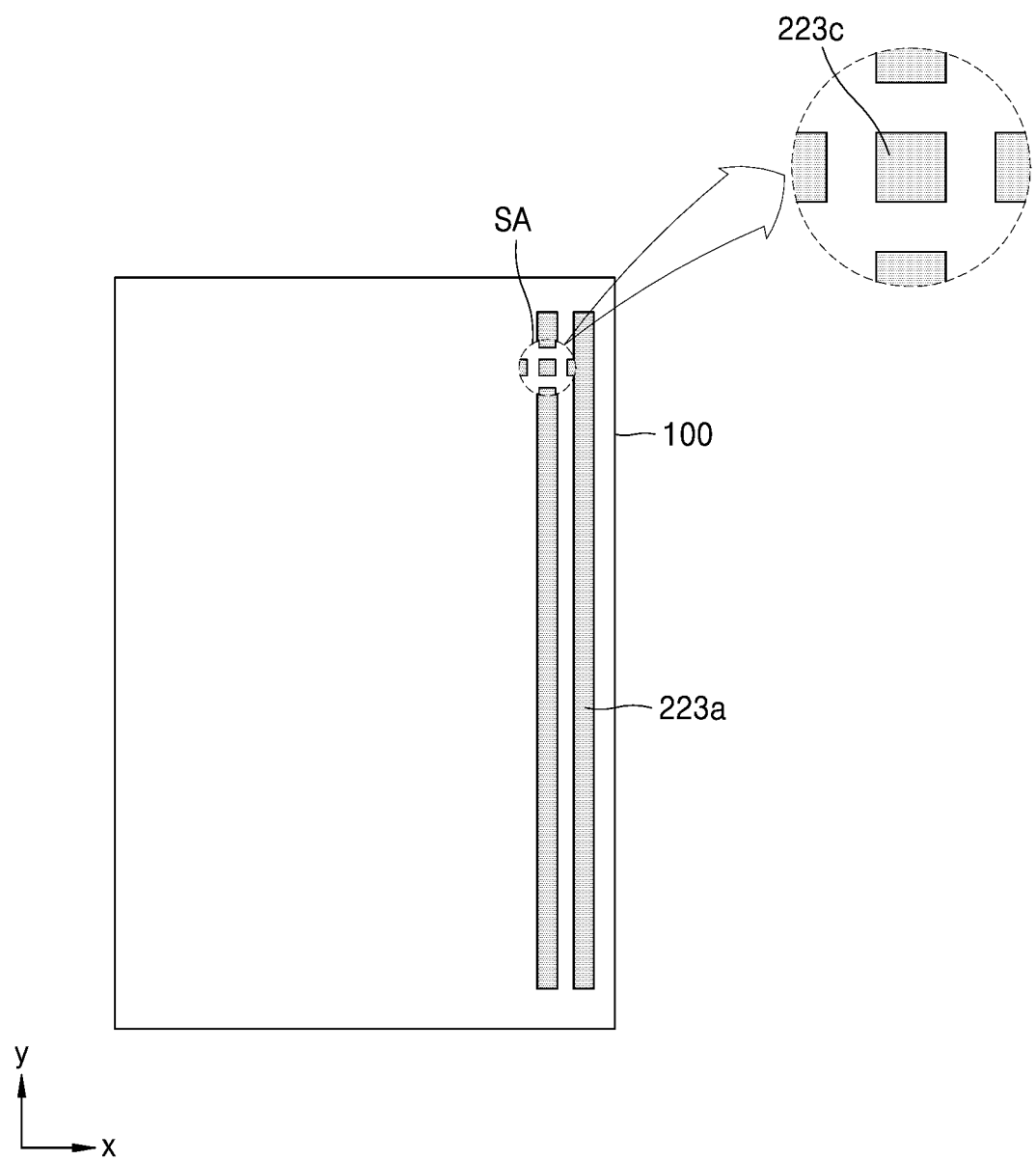
FIG. 13B is a plan view illustrating a part of the counter electrode formed on the substrate by placing the first mask on the second support portion and then depositing a deposition material in a manufacturing method according to another embodiment of the present disclosure.

FIG. 13B is a plan view illustrating a part of the counter electrode 223 formed on the substrate 100 by placing the first mask 500a on the second support portion 430 and then depositing a deposition material in a manufacturing method according to another embodiment of the present disclosure.

The first auxiliary counter electrodes 223c and the first main counter electrodes 223a are the same as or similar to those of FIG. 11B, and thus a detailed explanation thereof will not be given.

The first main counter electrodes 223a may be arranged to be spaced apart from one another in the x-direction of FIG. 13B.

Figure 14A:
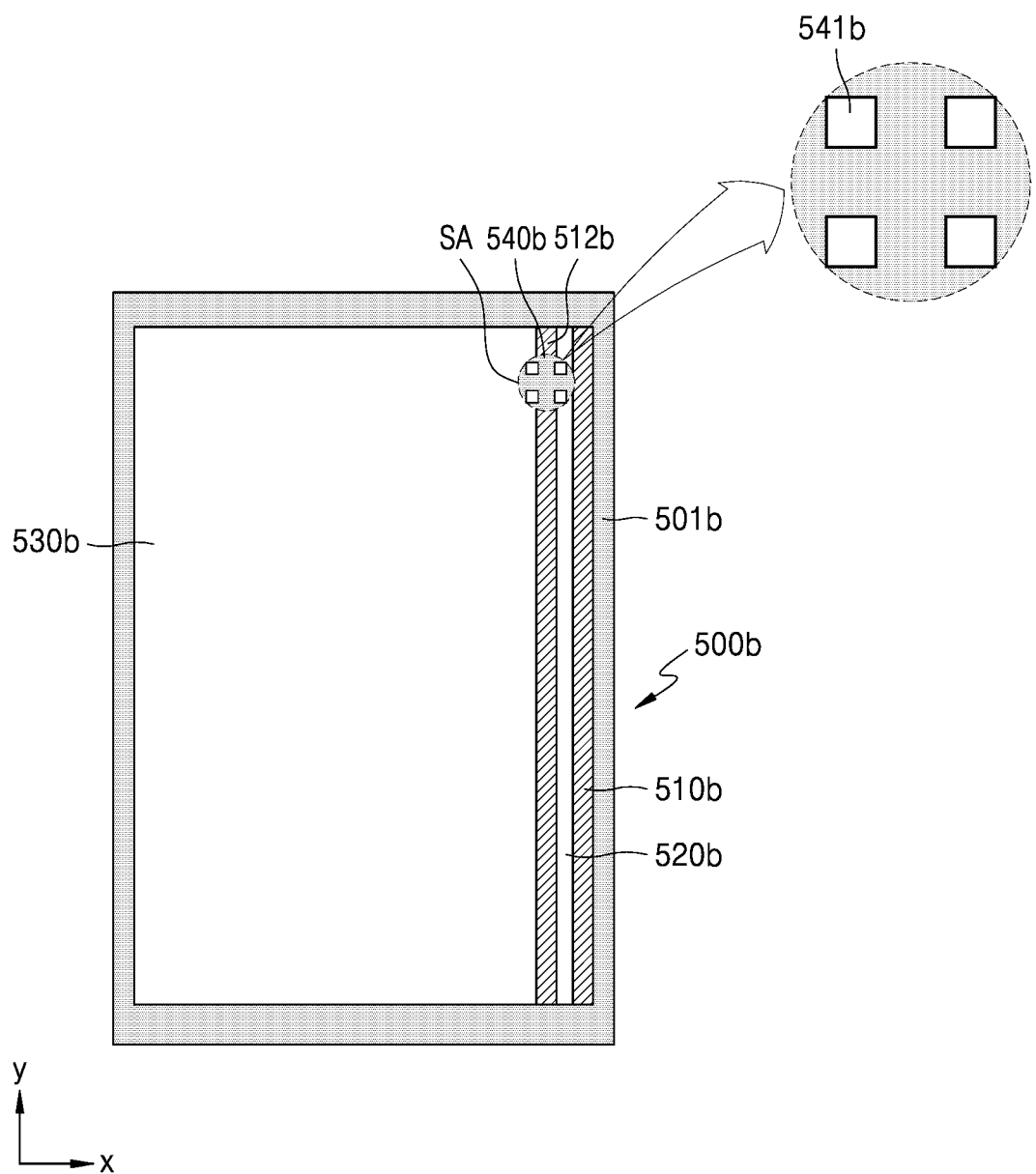
FIG. 14A is a plan view illustrating the second mask of the apparatus for manufacturing the display apparatus according to another embodiment of the present disclosure.

FIG. 14A is a plan view illustrating the second mask 500b of the apparatus 400 for manufacturing the display apparatus 1 according to another embodiment of the present disclosure. The same member as that of FIG. 12A is denoted by the same reference numeral, and a repeated explanation thereof will not be given for the sake of brevity.

The second rib portion 510b may be arranged to be spaced apart from the fourth rib connector 512b in an x-direction of FIG. 14A. Also, the second mask opening portion 520b may be arranged to be spaced apart from the adjacent opening portion 530b in the x-direction of FIG. 14A. That is, the second mask opening portion 520b may be formed parallel to a long side of the second mask body portion 501b.

Figure 14B:
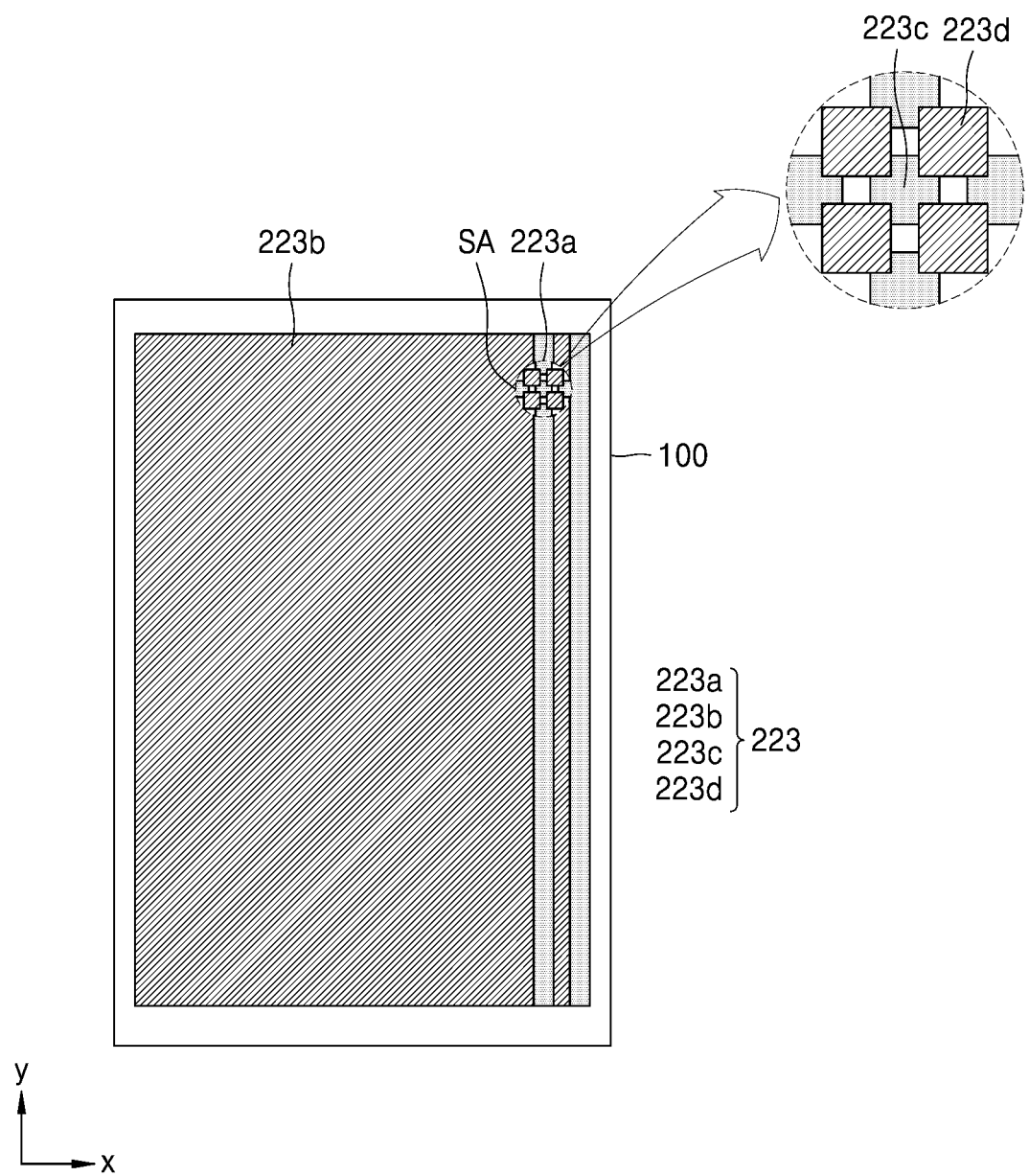
FIG. 14B is a plan view illustrating the counter electrode formed on the substrate by placing the second mask on the second support portion and then depositing a deposition material in a manufacturing method according to another embodiment of the present disclosure.

FIG. 14B is a plan view illustrating the counter electrode 223 formed on the substrate 100 by placing the second mask 500b on the second support portion 430 and then depositing a deposition material in a manufacturing method according to another embodiment of the present disclosure. The same member as that of FIG. 12B is denoted by the same reference numeral, and a repeated explanation thereof will not be given for the sake of brevity.

The first main counter electrodes 223a and the second main counter electrodes 223b may be arranged to be spaced apart from each other in the x-direction of FIG. 14B.

Figure 15:
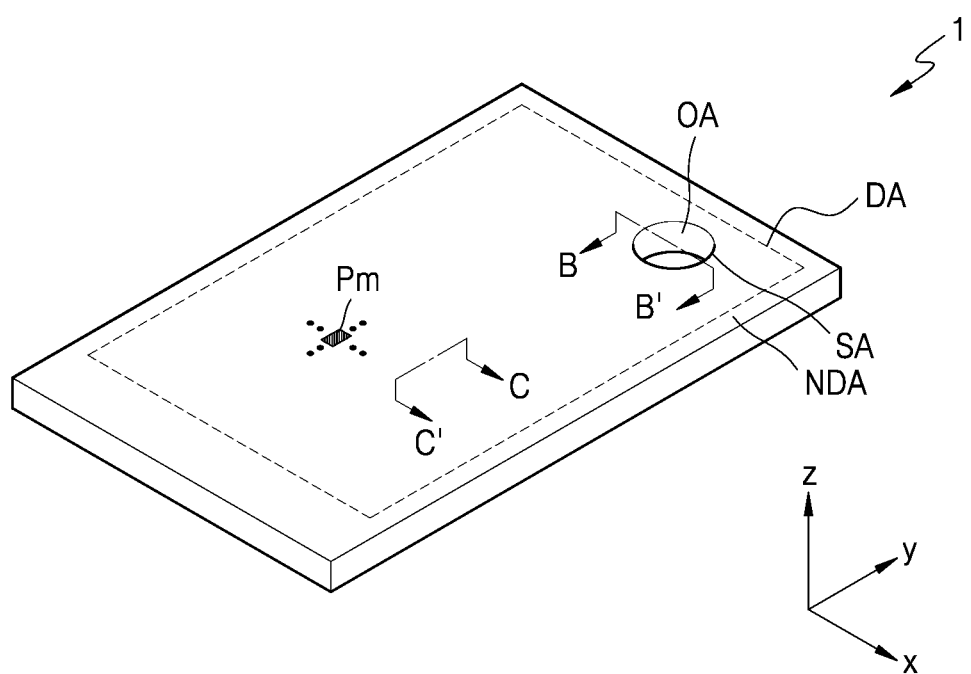
FIG. 15 is a perspective view of the display apparatus manufactured by using a manufacturing method according to another embodiment of the present disclosure.

FIG. 15 is a perspective view of the display apparatus 1 manufactured by using a manufacturing method according to another embodiment of the present disclosure. The same member as that in FIG. 1 is denoted by the same reference numeral, and a repeated explanation thereof will not be given for the sake of brevity.

The display apparatus 1 may include a through-portion OA. The through-portion OA may be an area under which a component 30 is arranged. The through-portion OA may be a transmission area where light and/or sound output from the component 30 to the outside or traveling from the outside toward the component 30 may be transmitted. In the display apparatus 1 manufactured by using a manufacturing method according to an embodiment of the present disclosure, when light is transmitted through the through-portion OA, a light transmittance may be equal to or greater than about 50%, and more preferably, equal to or greater than 70%, equal to or greater than 75%, equal to or greater than 80%, equal to or greater than 85%, or equal to or greater than 90%. The through-portion OA may be an area where no display element is arranged and an image may not be provided. In the present embodiment, the through-portion OA may be arranged inside the display area DA, and main pixels may be arranged to surround the through-portion OA.

Figure 16:
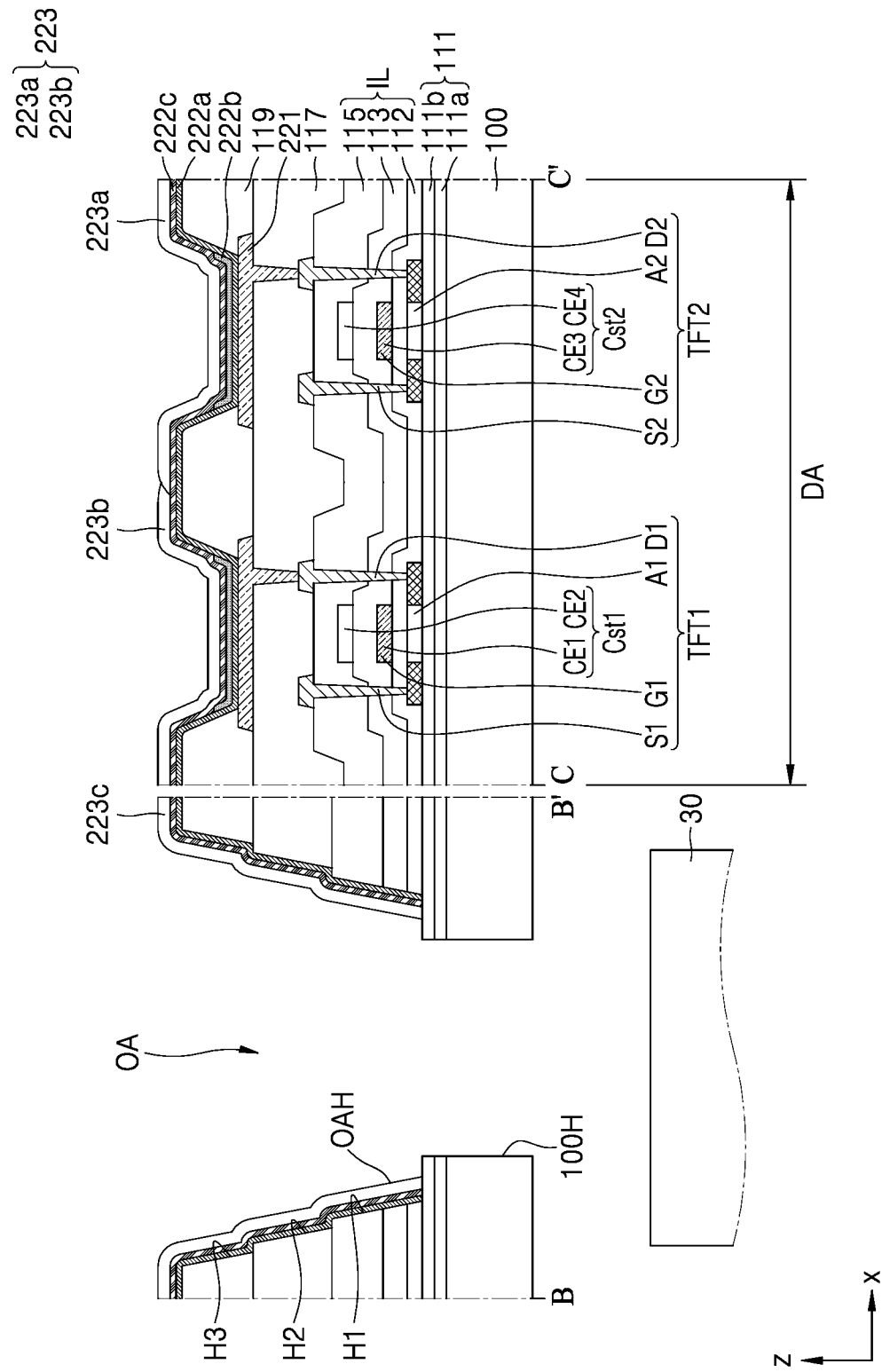
FIG. 16 is a cross-sectional view taken along lines B-B' and C-C' of FIG. 15.

FIG. 16 is a cross-sectional view taken along lines B-B' and C-C' of FIG. 15. In FIG. 16, the same member as that of FIG. 5 is denoted by the same reference numeral, and a repeated explanation thereof will not be given.

Referring to FIG. 16, the display apparatus 1 may include the through-portion OA. The through-portion OA may have an opening hole OAH corresponding to the through-portion OA.

The through-portion OA may have a substrate hole 100H passing through the substrate 100. As the through-portion OA has the substrate hole 100H, a light transmittance of the through-portion OA may be improved. Accordingly, the component 30 requiring a high light transmittance may be arranged under the through-portion OA.

When the first gate insulating layer 112, the second gate insulating layer 113, and the interlayer insulating layer 115 are collectively called the inorganic insulating layer IL, the inorganic insulating layer IL may have a first hole H1 corresponding to the transmission portion TA. The first hole H1 may be formed to expose a top surface of the buffer layer 111 or the substrate 100. The first hole H1 may be formed by overlapping a first opening of the first gate insulating layer 112, a second opening of the second gate insulating layer 113, and a third opening of the interlayer insulating layer 115 that are formed to correspond to the through-portion OA. The first through third openings may be individually formed by using separate processes or may be simultaneously formed by using the same process. Alternatively, various suitable modifications, including a case where the first opening and the second opening are concurrently or simultaneously formed and the third opening is separately formed, may be made. When the first through third openings are formed by using separate processes, a stepped portion may be formed at a side surface of the first hole H1.

The planarization layer 117 may have a second hole H2 corresponding to the through-portion OA. The second hole H2 may overlap the first hole H1.

A pixel-defining film 119 may have a third hole H3 formed in the through-portion OA. The third hole H3 may overlap the first hole H1 and the second hole H2. The counter electrode 223 may be arranged on inner side walls defining the first hole H1, the second hole H2, and the third hole H3. In some embodiments, the first functional layer 222a, the second functional layer 222c, and the counter electrode 223 may be arranged on side walls defining the first hole H1, the second hole H2, and the third hole H3.

As the first hole H1, the second hole H2, and the third hole H3 are formed, a light transmittance of the through-portion OA may be improved.

Figure 17A:
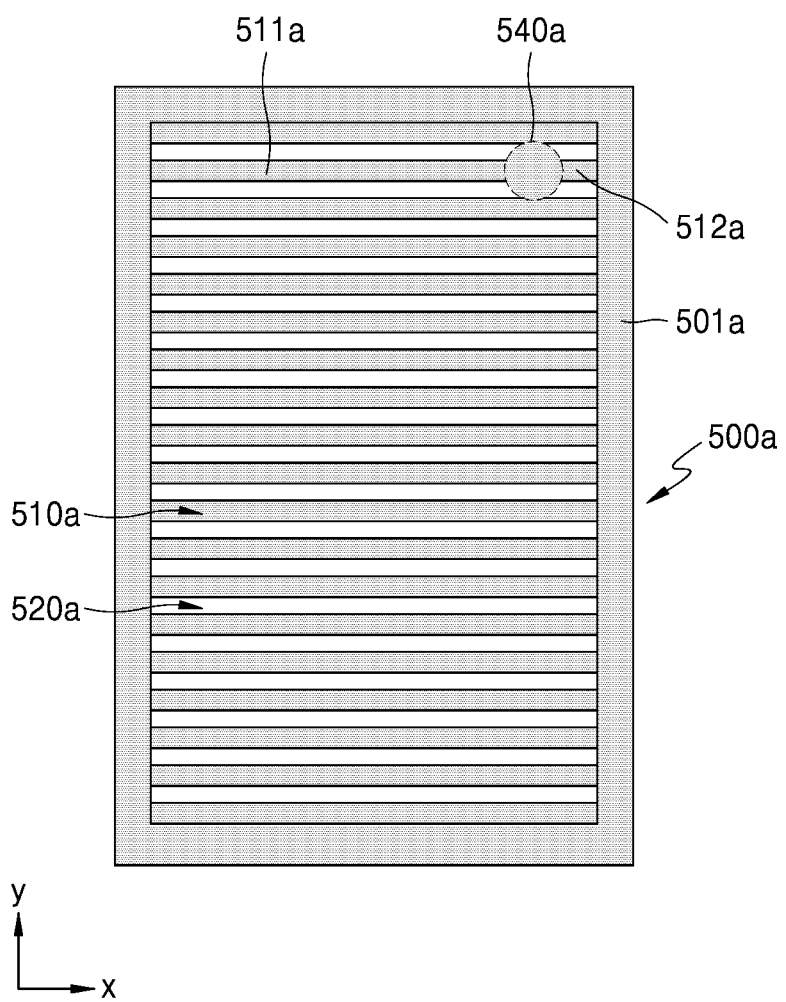
FIG. 17A is a plan view illustrating the first mask of the apparatus for manufacturing the display apparatus according to another embodiment of the present disclosure.

FIG. 17A is a plan illustrating the first mask 500a of the apparatus 400 for manufacturing the display apparatus 1 according to another embodiment of the present disclosure.

The first mask 500a may include the first mask body portion 501a, the first rib portion 510a, the first rib connector 511a, the second rib connector 512a, the first mask opening portion 520a, and the first shield portion 540a. In this case, the first mask body portion 501a, the first rib portion 510a, the first rib connector 511a, the second rib connector 512a, and the first mask opening portion 520a are the same as those of FIG. 7A, and thus a detailed explanation thereof will not be given.

The first shield portion 540a may be provided on the first mask 500a to correspond to the through-portion OA. The first shield portion 540a shields a deposition material. Also, various suitable embodiments, including a case where the first shield portion 540a has a rectangular shape or a circular shape, may be made.

Figure 17B:
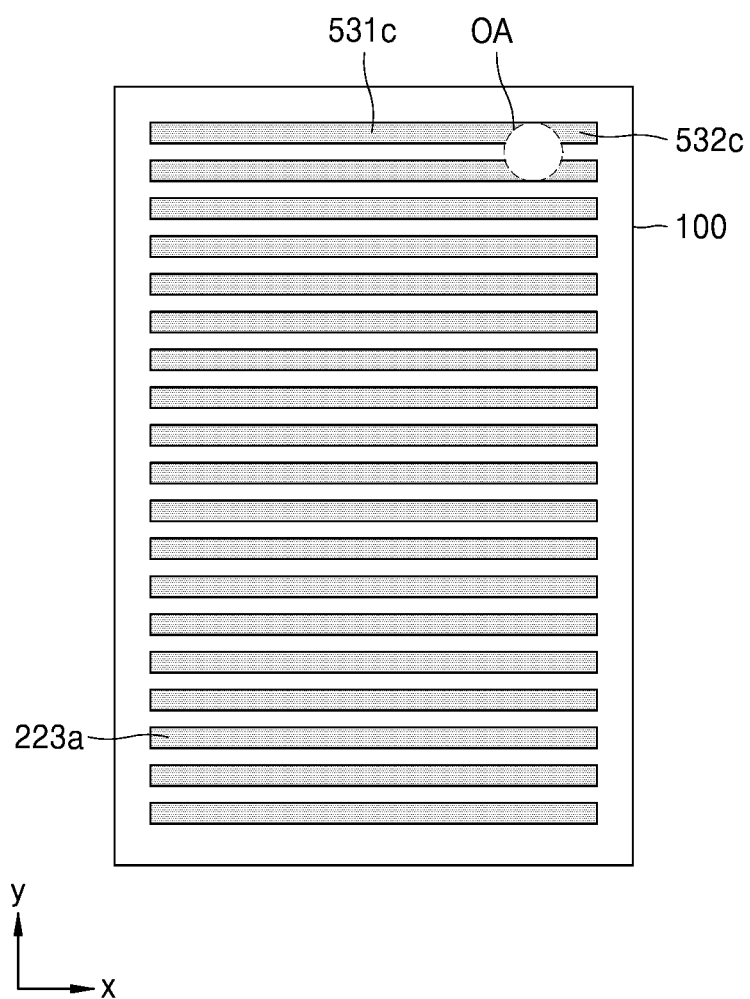
FIG. 17B is a plan view illustrating a part of the counter electrode formed on the substrate by placing the first mask on the second support portion and then depositing a deposition material in a manufacturing method according to another embodiment of the present disclosure.

FIG. 17B is a plan view illustrating a part of the counter electrode 223 formed on the substrate 100 by placing the first mask 500a on the second support portion 430 and then depositing a deposition material in a manufacturing method according to another embodiment of the present disclosure.

The counter electrode 223 may include the first main counter electrodes 223a. In this case, the first main counter electrodes 223a are the same as those of FIG. 7B, and thus a detailed explanation thereof will not be given.

Figure 18A:
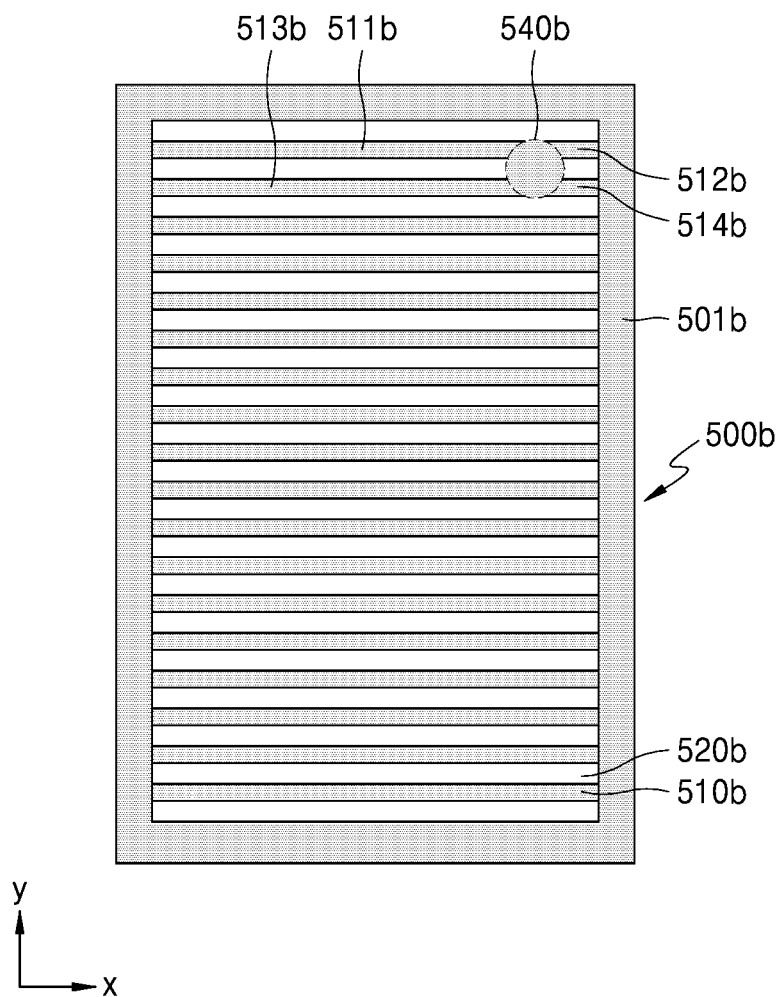
FIG. 18A is a plan view illustrating the second mask of the apparatus for manufacturing the display apparatus according to another embodiment of the present disclosure.

FIG. 18A is a plan view illustrating the second mask 500b of the apparatus 400 for manufacturing the display apparatus 1 according to another embodiment of the present disclosure.

The second mask 500b may include the second mask body portion 501b, the second rib portion 510b, the third rib connector 511b, the fourth rib connector 512b, the second mask opening portion 520b, and the second shield portion 540b. In this case, the first mask body portion 501a, the first rib portion 510a, the first rib connector 511a, the second rib connector 512a, and the first mask opening portion 520a are the same as those of FIG. 8A, and thus a detailed explanation thereof will not be given.

The second shield portion 540b may be provided on the second mask 500b to correspond to the through-portion OA. The second shield portion 540b shields a deposition material. Also, various suitable modifications, including a case where the second shield portion 540b has a rectangular shape or a circular shape, may be made.

The second shield portion 540b may be connected to and supported on at least four ribs. Accordingly, the second mask 500b may further include the fifth rib connector 513b and the sixth rib connector 514b. The second shield portion 540b may be connected to the second mask body portion 501*b* to cross in an x-direction due to the fifth rib connector 513*b* and the sixth rib connector 514*b*. The fifth rib connector 513*b* and the sixth rib connector 514*b* may be spaced apart by the same distance from a short side of the second mask body portion 501*b*. The fifth rib connector 513*b* and the sixth rib connector 514*b* may divide the second mask opening portion 520*b* arranged between adjacent second rib portions 510*b*.

Accordingly, deformation of the third rib connector 511*b* or the fourth rib connector 512*b* connected to the second shield portion 540*b* may be reduced or prevented. Also, an initial or substantially initial shape of the second mask 500*b* may be maintained.

Figure 18B:
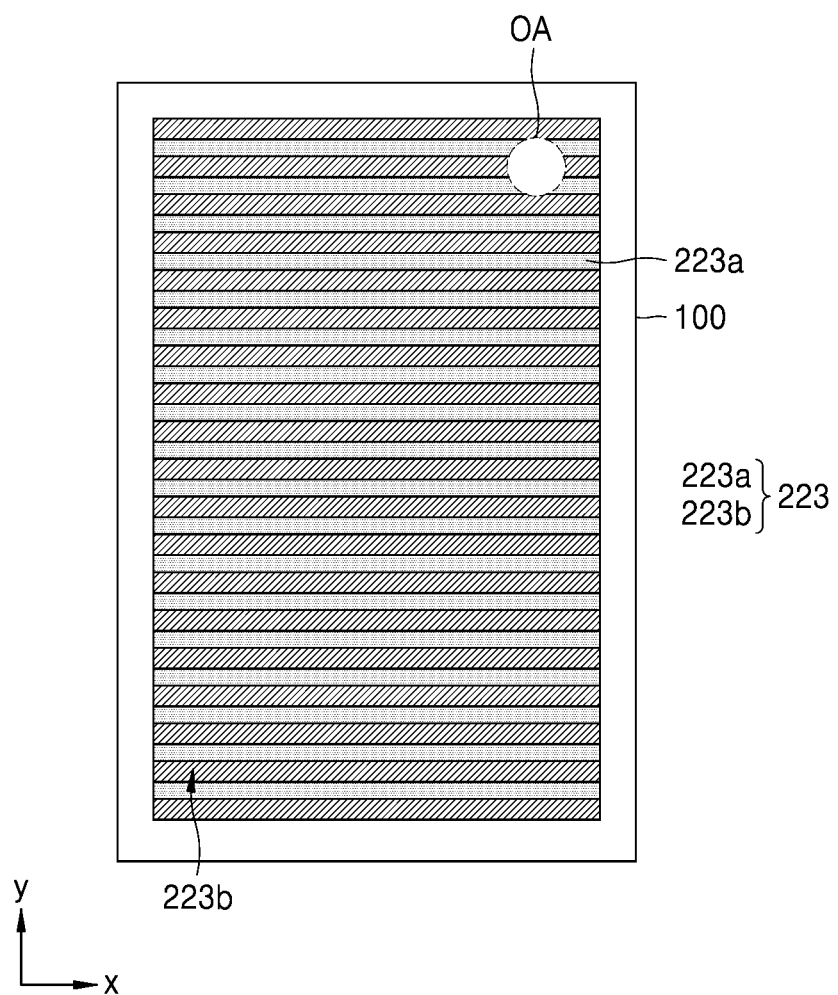
FIG. 18B is a plan view illustrating the counter electrode formed on the substrate by placing the second mask on the second support portion and then depositing a deposition material in a manufacturing method according to another embodiment of the present disclosure.

FIG. 18B is a plan view illustrating the counter electrode 223 formed on the substrate 100 by placing the second mask 500*b* on the second support portion 430 and then depositing a deposition material in a manufacturing method according to another embodiment of the present disclosure.

The counter electrode 223 may include the first main counter electrodes 223*a* and the second main counter electrodes 223*b*. In this case, the first main counter electrodes 223*a* and the second main counter electrodes 223*b* are the same as or similar to those of FIG. 8B, and thus a detailed explanation thereof will not be given.

Figure 19A:
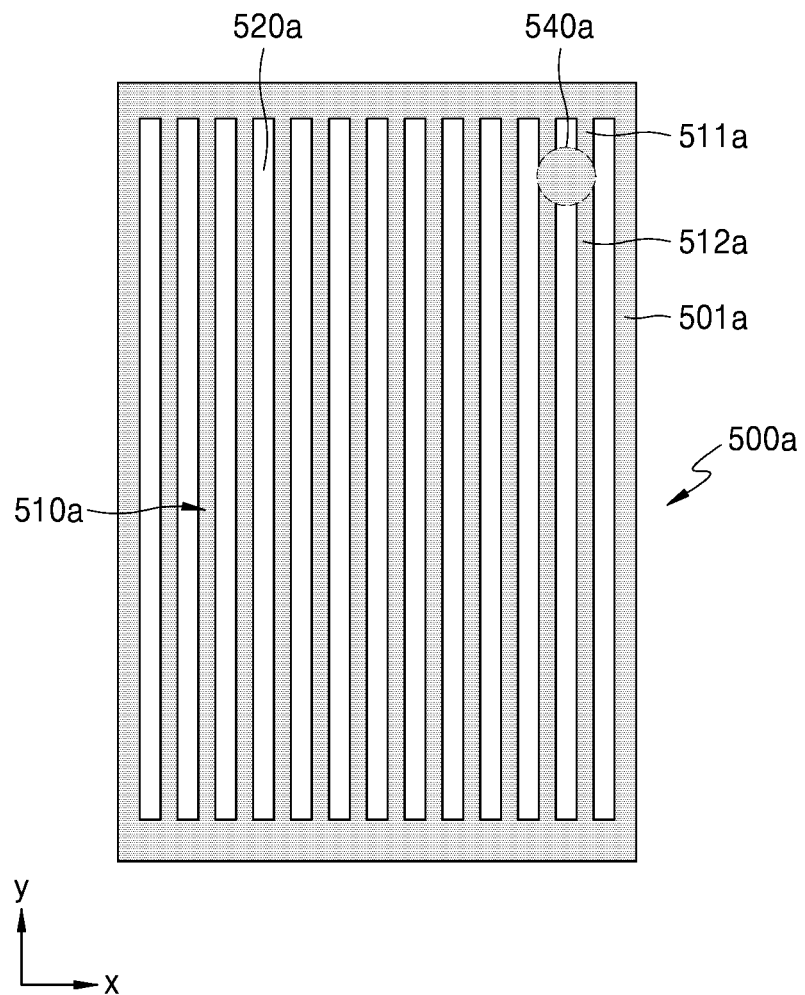
FIG. 19A is a plan view illustrating the first mask of the apparatus for manufacturing the display apparatus according to another embodiment of the present disclosure.

FIG. 19A is a plan view illustrating the first mask 500*a* of the apparatus 400 for manufacturing the display apparatus 1 according to another embodiment of the present disclosure.

The first mask 500*a* may include the first mask body portion 501*a*, the first rib portion 510*a*, the first rib connector 511*a*, the second rib connector 512*a*, the first mask opening portion 520*a*, and the first shield portion 540*a*. In this case, the first mask body portion 501*a*, the first rib portion 510*a*, the first rib connector 511*a*, the second rib connector 512*a*, the first mask opening portion 520*a*, and the first shield portion 540*a* are the same as or similar to those of FIG. 17A, and thus a detailed explanation thereof will not be given.

The first rib portions 510*a* may be arranged to be spaced apart from one another in an x-direction of FIG. 19A. Also, the first mask opening portions 520*a* may be arranged to be spaced apart from one another in the x-direction of FIG. 19A. That is, each first mask opening portion 520*a* may be formed parallel to a long side of the first mask body portion 501*a*.

Figure 19B:
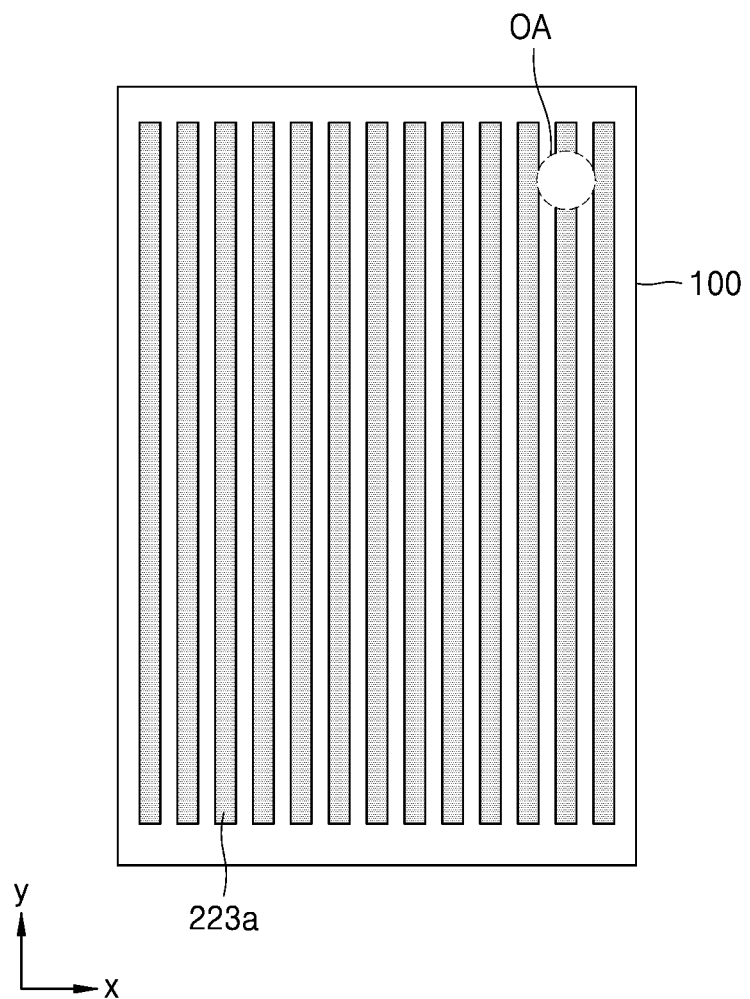
FIG. 19B is a plan view illustrating a part of the counter electrode formed on the substrate by placing the first mask on the second support portion and then depositing a deposition material in a manufacturing method according to another embodiment of the present disclosure.

FIG. 19B is a plan view illustrating a part of the counter electrode 223 formed on the substrate 100 by placing the first mask 500*a* on the second support portion 430 and then depositing a deposition material in a manufacturing method according to another embodiment of the present disclosure.

The first main counter electrodes 223*a* are the same as those of FIG. 17B, and thus a detailed explanation thereof will not be given.

The first main counter electrodes 223*a* may be arranged to be spaced apart from one another in the x-direction of FIG. 19B.

Figure 20A:
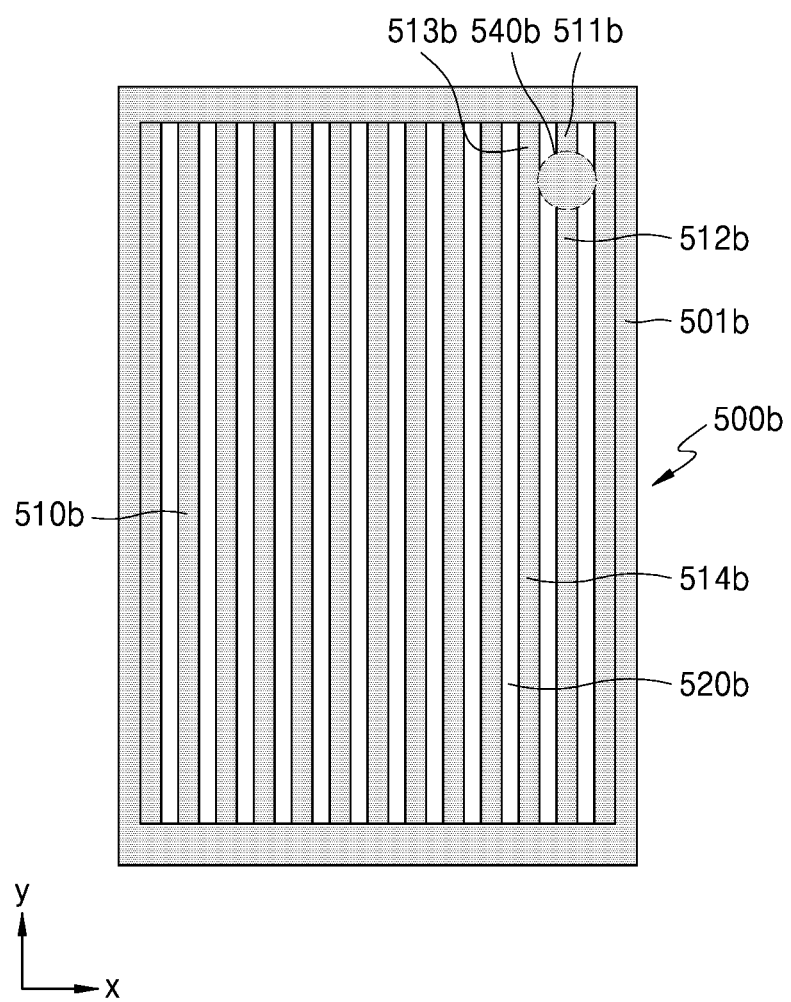
FIG. 20A is a plan view illustrating the second mask of the apparatus for manufacturing the display apparatus according to another embodiment of the present disclosure.

FIG. 20A is a plan view illustrating the second mask 500*b* of the apparatus 400 for manufacturing the display apparatus 1 according to another embodiment of the present disclosure.

Referring to FIG. 20A, the second mask 500*b* may include the second mask body portion 501*b*, the second rib portion 510*b*, the third rib connector 511*b*, the fourth rib connector 512*b*, the second mask opening portion 520*b*, and the second shield portion 540*b*. However, the second mask body portion 501*b*, the second rib portion 510*b*, the third rib connector 511*b*, the fourth rib connector 512*b*, the second mask opening portion 520*b*, and the second shield portion 540*b* are the same as or similar to those of FIG. 18A, and thus a detailed explanation thereof will not be given.

The second rib portions 510*b* may be arranged to be spaced apart from one another in an x-direction of FIG. 20A. Also, the second mask opening portions 520*b* may be arranged to be spaced apart from one another in the x-direction of FIG. 20A. That is, each second mask opening portion 520*b* may be formed parallel to a long side of the second mask body portion 501*b*.

The second shield portion 540*b* may be connected to the second mask body portion 501*b* to cross in a y-direction due to the third rib connector 511*b* and the fourth rib connector 512*b*. Also, the second mask 500*b* may further include the fifth rib connector 513*b* and the sixth rib connector 514*b*. The second shield portion 540*b* may be further connected to the second mask body portion 501*b* to cross in the y-direction due to the fifth rib connector 513*b* and the sixth rib connector 514*b*.

Figure 20B:
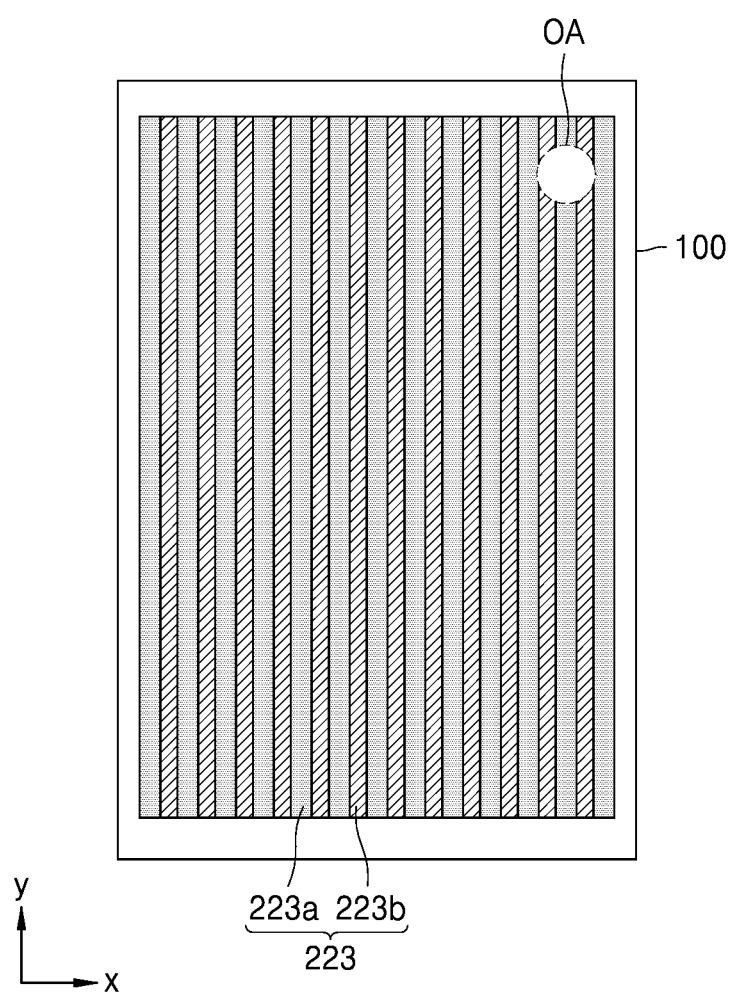
FIG. 20B is a plan view illustrating the counter electrode formed on the substrate by placing the second mask on the second support portion and then depositing a deposition material in a manufacturing method according to another embodiment of the present disclosure.

FIG. 20B is a plan view illustrating the counter electrode 223 formed on the substrate 100 by placing the second mask 500*b* on the second support portion 430 and then depositing a deposition material in a manufacturing method according to another embodiment of the present disclosure.

Referring to FIG. 20B, the first main counter electrodes 223*a* or the second main counter electrodes 223*b* are the same as or similar to those of FIG. 19B, and thus a detailed explanation thereof will not be given.

The first main counter electrodes 223*a* and the second main counter electrodes 223*b* may be arranged to be spaced apart from each other in the x-direction of FIG. 20B.

Figure 21A:
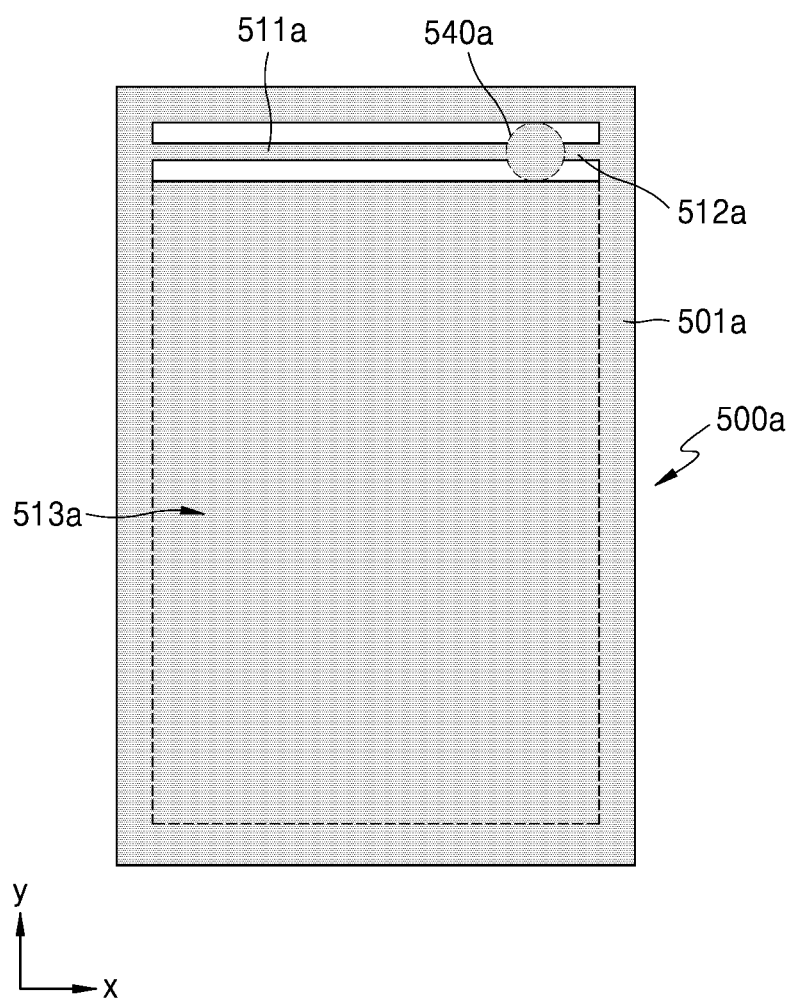
FIG. 21A is a plan view illustrating the first mask of the apparatus for manufacturing the display apparatus according to another embodiment of the present disclosure.

FIG. 21A is a plan view illustrating the first mask 500*a* of the apparatus 400 for manufacturing the display apparatus 1 according to another embodiment of the present disclosure. The same member as that of FIG. 11A is denoted by the same reference numeral, and a repeated explanation thereof will not be given for the sake of brevity.

Referring to FIG. 21A, the first shield portion 540*a* may be provided on the first mask 500*a* to correspond to the through-portion OA. The first shield portion 540*a* shields a deposition material. Also, various suitable modifications, including a case where the first shield portion 540*a* has a rectangular shape or a circular shape, may be made.

Accordingly, deformation of the first mask 500*a* including the first shield portion 540*a* may be reduced or prevented, and an initial or substantially initial shape of the first mask 500*a* may be maintained.

Figure 21B:
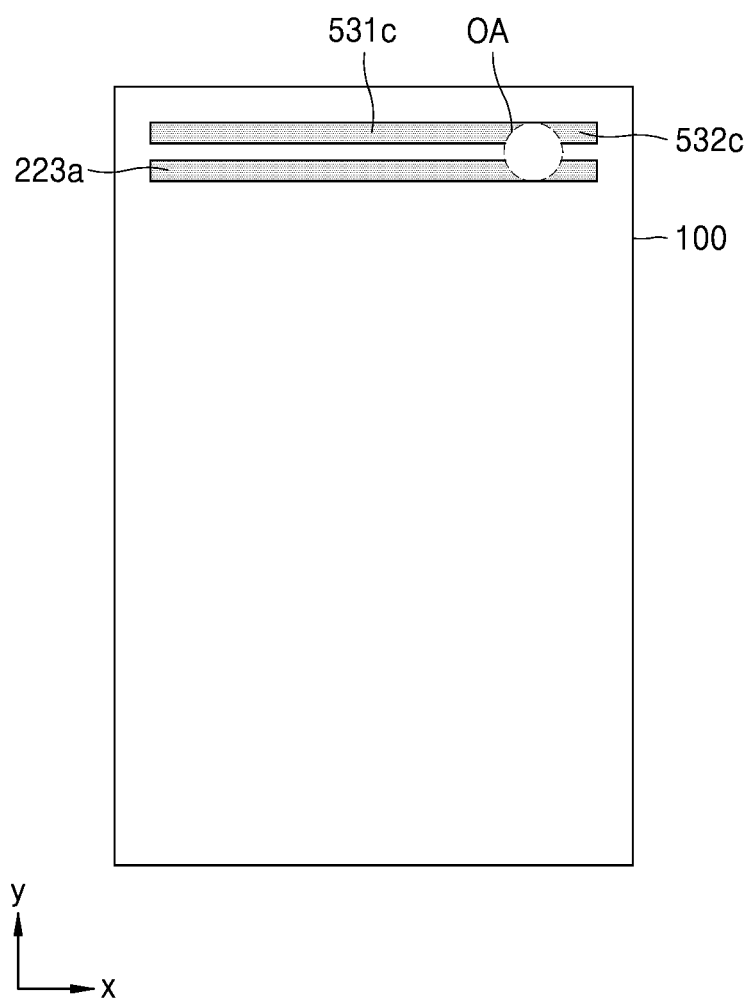
FIG. 21B is a plan view illustrating a part of the counter electrode formed on the substrate by placing the first mask on the second support portion and then depositing a deposition material in a manufacturing method according to another embodiment of the present disclosure.

FIG. 21B is a plan view illustrating a part of the counter electrode 223 formed on the substrate 100 by placing the first mask 500*a* on the second support portion 430 and then depositing a deposition material in a manufacturing method according to another embodiment of the present disclosure. The same member as that of FIG. 11B is denoted by the same reference numeral, and a repeated explanation thereof will not be given for the sake of brevity.

Referring to FIG. 21B, the first main counter electrodes 223*a* may be formed adjacent to the opening area OA. Also, some of the plurality of first main counter electrodes 223*a* may have stripe shapes.

Figure 22A:
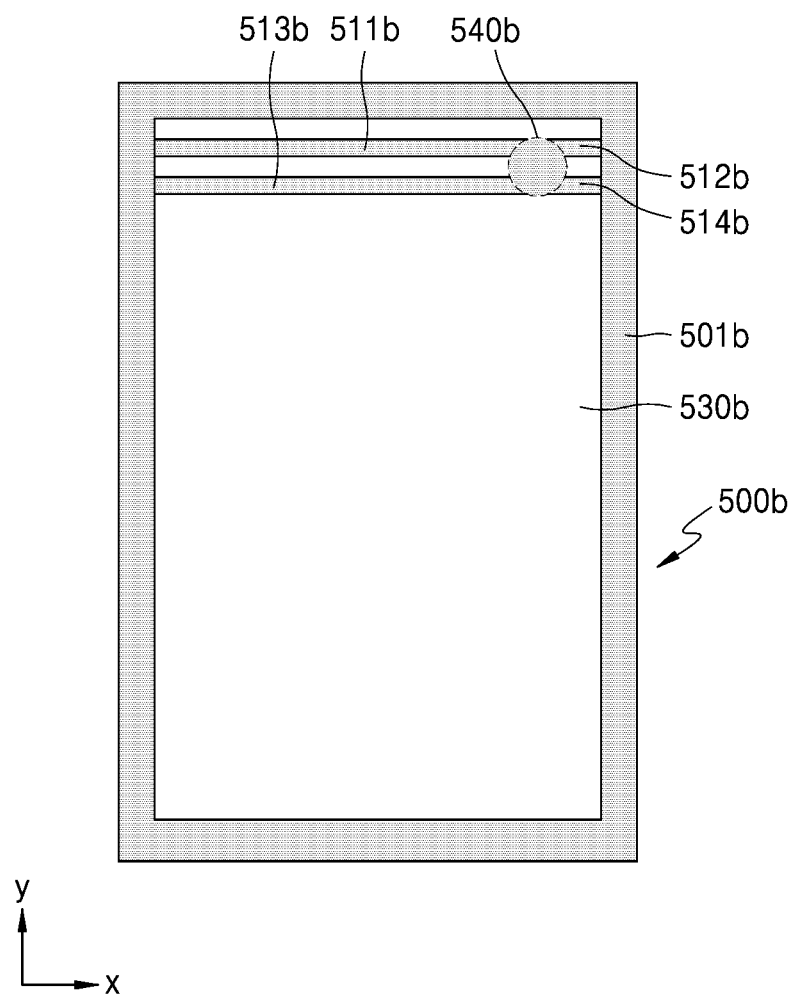
FIG. 22A is a plan view illustrating the second mask of the apparatus for manufacturing the display apparatus according to another embodiment of the present disclosure.

FIG. 22A is a plan view illustrating the second mask 500*b* of the apparatus 400 for manufacturing the display apparatus 1 according to another embodiment of the present disclosure. The same member as that of FIG. 12A is denoted by the same reference numeral, and a repeated explanation thereof will not be given for the sake of brevity.

Referring to FIG. 22A, the second shield portion 540*b* may be connected to and supported on at least four ribs or rib connectors. For example, the second shield portion 540*b* may be connected to the second mask body portion 501b to cross in an x-direction due to the third rib connector 511b and the fourth rib connector 512b. Also, the second shield portion 540b may be connected to the second mask body portion 501b to cross in the x-direction due to the fifth rib connector 513b and the sixth rib connector 514b.

The second shield portion 540b may be supported by the third rib connector 511b through the sixth rib connector 514b. Accordingly, deformation of at least one of the third rib connector 511b through the sixth rib connector 514b connected to the second shield portion 540b may be reduced or prevented. Also, an initial or substantially initial shape of the second mask 500b may be maintained.

Figure 22B:
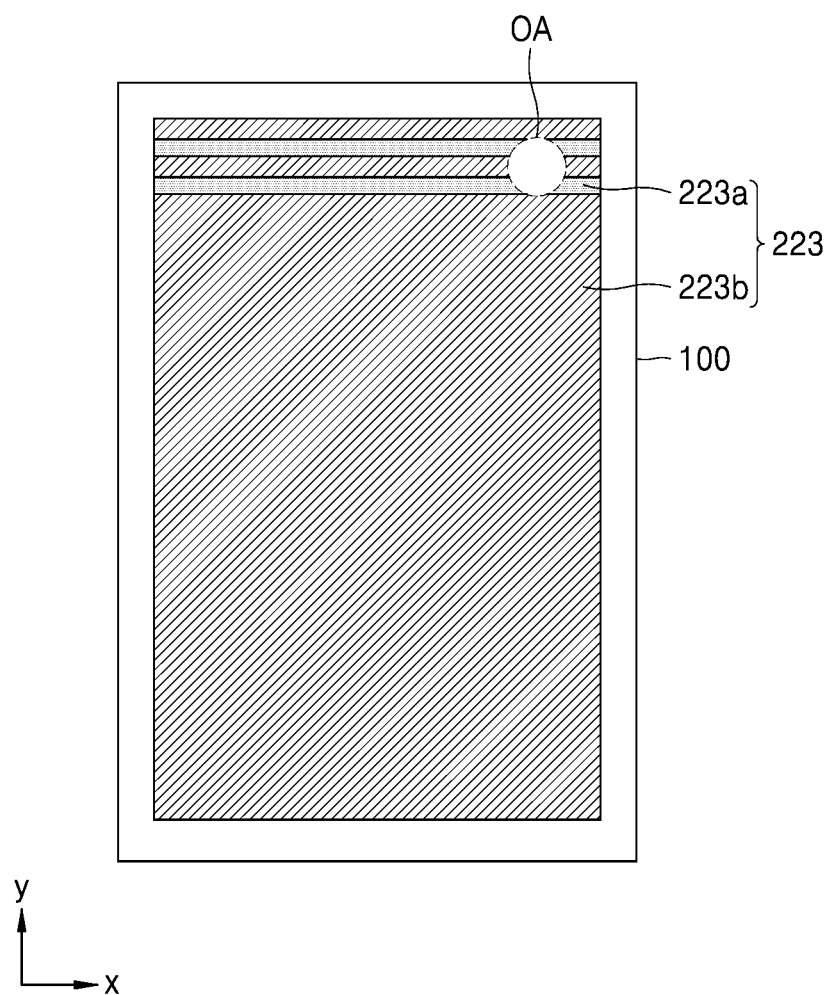
FIG. 22B is a plan view illustrating the counter electrode formed on the substrate by placing the second mask on the second support portion and then depositing a deposition material in a manufacturing method according to another embodiment of the present disclosure.

FIG. 22B is a plan view illustrating the counter electrode 223 formed on the substrate 100 by placing the second mask 500b on the second support portion 430 and then depositing a deposition material in a manufacturing method according to another embodiment of the present disclosure. The same member as that of FIG. 12B is denoted by the same reference numeral, and a repeated explanation thereof will not be given for the sake of brevity.

Referring to FIG. 22B, when the second mask 500b is aligned on the substrate 100, some of the second main counter electrodes 223b may be formed to correspond to the adjacent opening portion 530b. Because a deposition material passes through the adjacent opening portion 530b and is deposited on the substrate 100, some of the second main counter electrodes 223b may be uniformly formed. Accordingly, the number of times the first main counter electrodes 223a and the second main counter electrodes 223b overlap each other may be reduced, and thus a thickness of the counter electrode 223 may be mostly uniform.

Figure 23A:
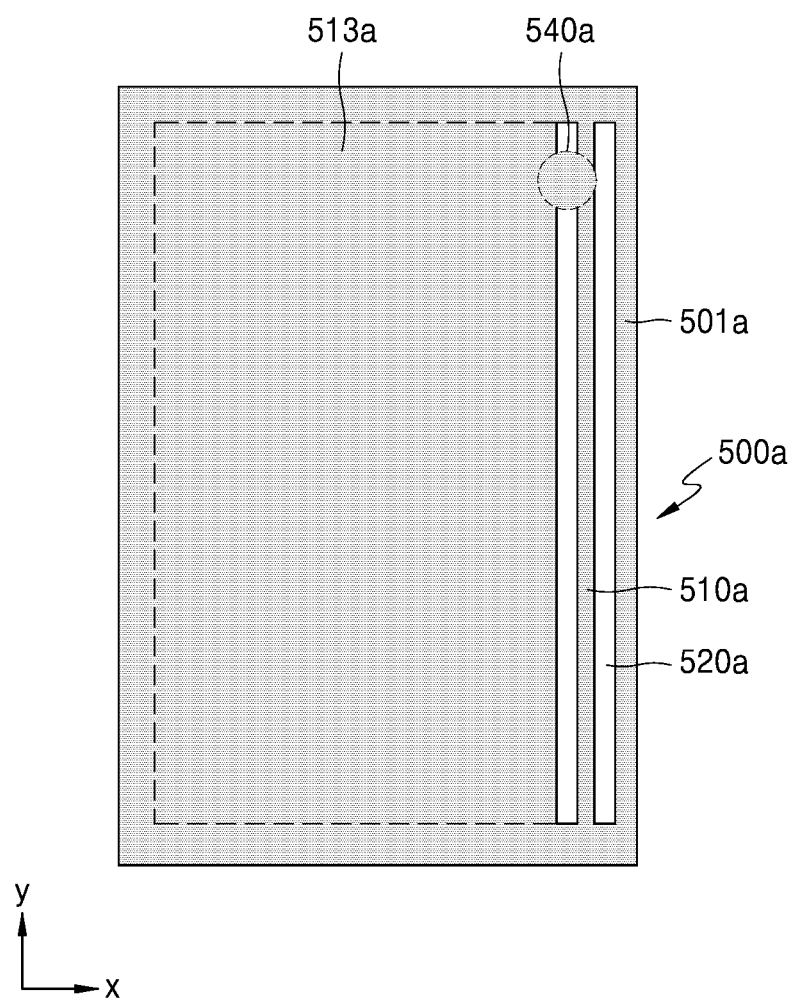
FIG. 23A is a plan view illustrating the first mask of the apparatus for manufacturing the display apparatus according to another embodiment of the present disclosure.

FIG. 23A is a plan view illustrating the first mask 500a of the apparatus 400 for manufacturing the display apparatus 1 according to another embodiment of the present disclosure. The same member as that of FIG. 21A is denoted by the same reference numeral, and a repeated explanation thereof will not be given for the sake of brevity.

Referring to FIG. 23A, the first rib portion 510a may be arranged to be spaced apart from the third rib portion 513a in an x-direction of FIG. 23A. Also, the first mask opening portions 520a may be arranged to be spaced apart from one another in the x-direction of FIG. 23A. That is, each first mask opening portion 520a may be formed parallel to a long side of the first mask body portion 501a.

Figure 23B:
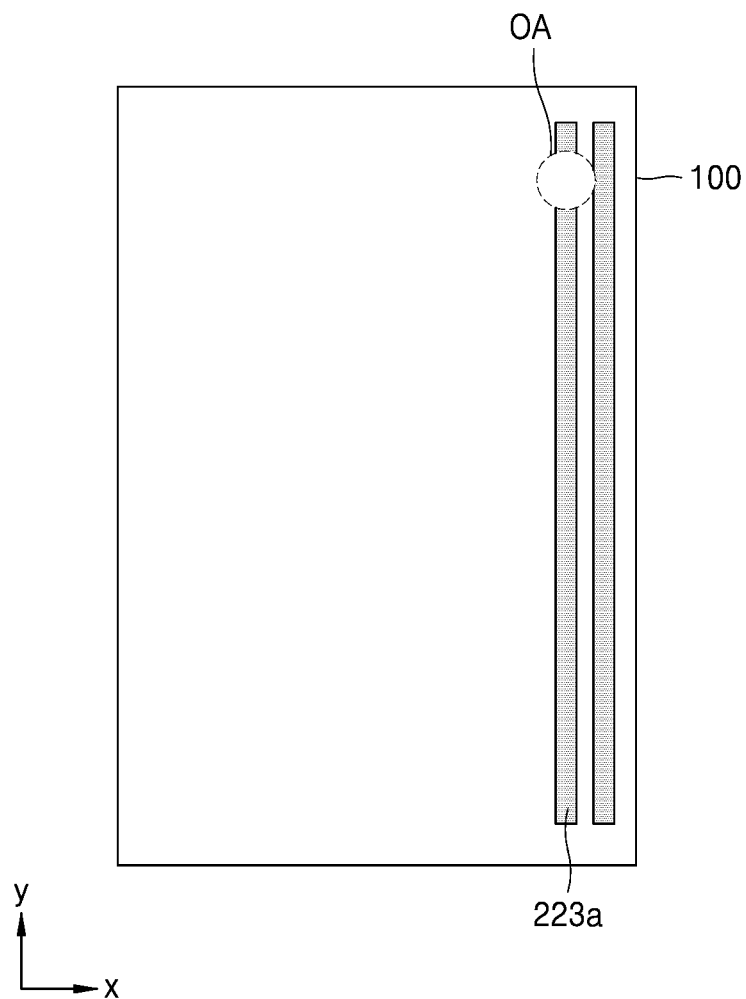
FIG. 23B is a plan view illustrating a part of the counter electrode formed on the substrate by placing the first mask on the second support portion and then depositing a deposition material in a manufacturing method according to another embodiment of the present disclosure.

FIG. 23B is a plan view illustrating a part of the counter electrode 223 formed on the substrate 100 by placing the first mask 500a on the second support portion 430 and then depositing a deposition material in a manufacturing method according to another embodiment of the present disclosure.

Referring to FIG. 23B, the first main counter electrodes 223a may be formed. The first main counter electrodes 223a are the same as or similar to those of FIG. 21B, and thus a detailed explanation thereof will not be given.

The first main counter electrodes 223a may be arranged to be spaced apart from one another in the x-direction of FIG. 23B.

Figure 24A:
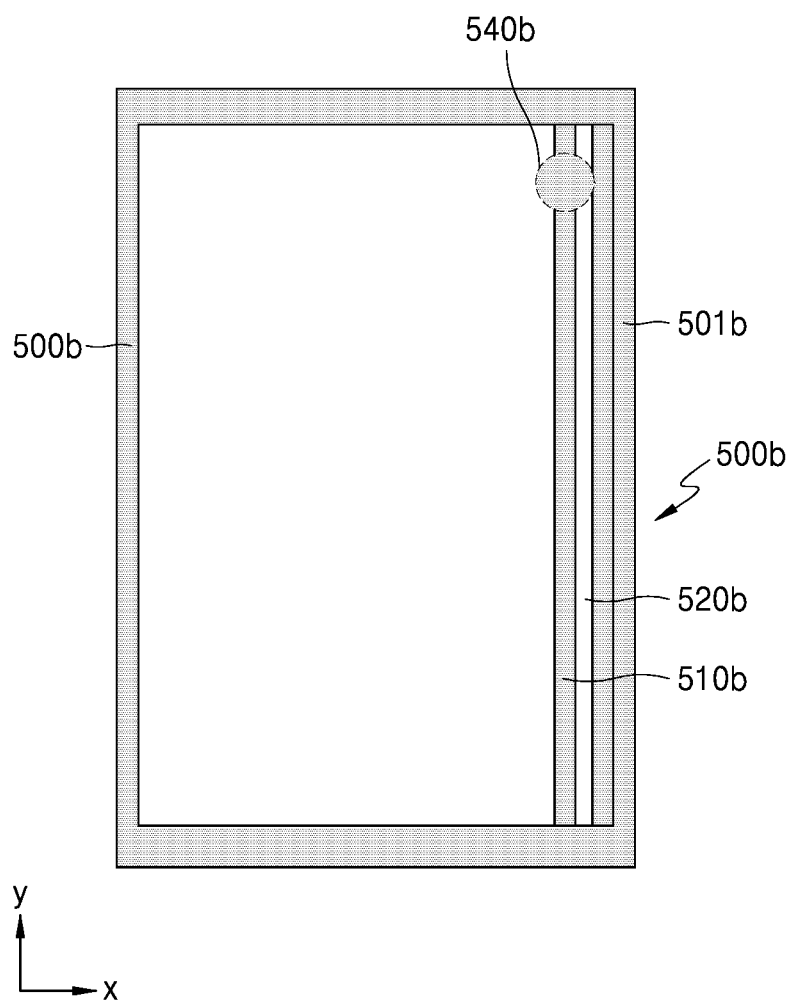
FIG. 24A is a plan view illustrating the second mask of the apparatus for manufacturing the display apparatus according to another embodiment of the present disclosure.

FIG. 24A is a plan view illustrating the second mask 500b of the apparatus 400 for manufacturing the display apparatus 1 according to another embodiment of the present disclosure. The same member as that of FIG. 22A is denoted by the same reference numeral, and a repeated explanation thereof will not be given for the sake of brevity.

Referring to FIG. 24A, the second rib portions 510b may be arranged to be spaced apart from one another in an x-direction of FIG. 24A. Also, the second mask opening portions 520b may be arranged to be spaced apart from one another in the x-direction of FIG. 24A. That is, each second mask opening portion 520b may be formed parallel to a long side of the second mask body portion 501b.

Figure 24B:
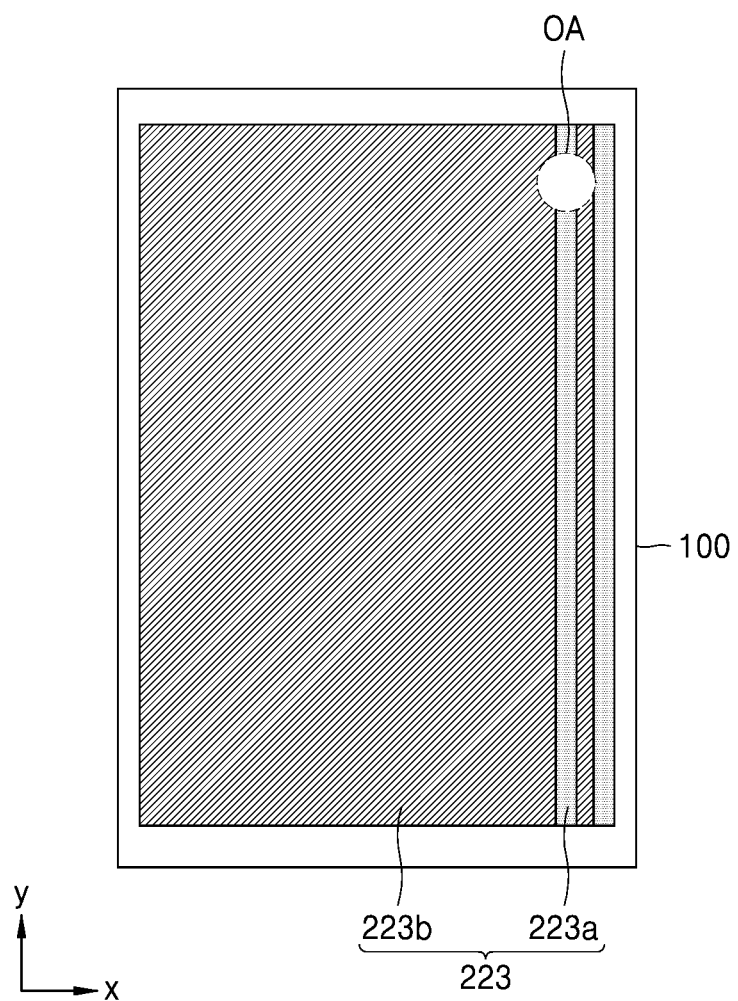
FIG. 24B is a plan view illustrating the counter electrode formed on the substrate by placing the second mask on the second support portion and then depositing a deposition material in a manufacturing method according to another embodiment of the present disclosure.

FIG. 24B is a plan view illustrating the counter electrode 223 formed on the substrate 100 by placing the second mask 500b on the second support portion 430 and then depositing a deposition material in a manufacturing method according to another embodiment of the present disclosure.

Referring to FIG. 24B, the first main counter electrodes 223a and the second main counter electrodes 223b are the same as or similar to those of FIG. 22B, and thus a detailed explanation thereof will not be given.

The second main counter electrodes 223a and the second main counter electrodes 223b may be arranged to be spaced apart from each other in the x-direction of FIG. 24B.

According to a method of manufacturing a display apparatus according to the one or more embodiments of the present disclosure, the display apparatus including a pixel portion and a transmitting portion having an improved light transmittance in a sensor area corresponding to a component such as a sensor may be manufactured, and thus, the component may operate and an image may be formed in an area overlapping the component.

Accordingly, a method of manufacturing a display apparatus having various suitable functions and improved quality may be provided. However, the above effects are merely examples, and effects according to the embodiments are described in more detail throughout the description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims and equivalents thereof.

What is claimed is:
1. A method of manufacturing a display apparatus, the method comprising:
preparing a substrate comprising a display area and a sensor area arranged in the display area;
forming first counter electrodes on the substrate having a first pattern in which the first counter electrodes are spaced apart from one another in the sensor area;
forming second counter electrodes having a second pattern different from the first pattern to be spaced apart from one another in the sensor area; and
arranging a component to correspond to the sensor area.
2. The method of claim 1, wherein:
each of the first counter electrodes and the second counter electrodes has a quadrangular shape in a plan view.
3. The method of claim 2, wherein:
corner portions of the first counter electrodes and the second counter electrodes overlap each other.
4. The method of claim 1, wherein:
the display area surrounds at least a portion of the sensor area.
5. The method of claim 1, further comprising:
forming a plurality of third counter electrodes that are spaced apart from one another in the display area when the first counter electrodes are formed on the substrate.

6. The method of claim 1, further comprising:
forming a plurality of fourth counter electrodes that are spaced apart from one another in the display area when the second counter electrodes are formed on the substrate.

7. The method of claim 1, further comprising:
forming a plurality of third counter electrodes that are spaced apart from one another in the display area when the first counter electrodes are formed on the substrate; and
forming, on the substrate, a plurality of fourth counter electrodes that are spaced apart from one another in the display area when the second counter electrodes are formed on the substrate,
wherein each of the plurality of fourth counter electrodes is arranged between adjacent third counter electrodes of the plurality of third counter electrodes.

8. The method of claim 7, wherein:
one of the third counter electrodes and a corresponding one of the fourth counter electrodes at least partially overlap each other in a plan view.

9. The method of claim 5, wherein:
the plurality of third counter electrodes are formed adjacent to the sensor area.

10. The method of claim 9, wherein:
some of the plurality of third counter electrodes have stripe shapes.

11. The method of claim 1, further comprising:
forming a plurality of third counter electrodes to be spaced apart from one another in the display area when the first counter electrodes are formed on the substrate, wherein some of the plurality of third counter electrodes have stripe shapes; and
forming, on the substrate, a plurality of fourth counter electrodes that are spaced apart from one another in a portion of the display area when the second counter electrodes are formed on the substrate,
wherein each of the plurality of fourth counter electrodes is arranged between adjacent third counter electrodes of the plurality of third counter electrodes.

12. The method of claim 11, wherein:
one of the third counter electrodes and a corresponding one of the fourth counter electrodes at least partially overlap each other in a plan view.

13. The method of claim 11, wherein:
the plurality of third counter electrodes are formed adjacent to the sensor area,
wherein a planar area of one side part of one of the fourth counter electrodes and a planar area of another side part of the one of the fourth counter electrodes in the display area are different from each other.

14. A method of manufacturing a display apparatus, the method comprising:
forming a counter electrode on a substrate comprising a display area and a sensor area;
forming an encapsulation portion on the counter electrode; and
arranging a component for applying a signal through a transmitting portion included in the sensor area,
wherein the forming of the counter electrode on the substrate comprising the display area and the sensor area comprises:
forming a first counter electrode in the sensor area by using a first mask having a plurality of first opening portions arranged in a first pattern on a first shield portion corresponding to the sensor area; and
forming a second counter electrode by using a second mask having a plurality of second opening portions arranged in a second pattern different from the first pattern on a second shield portion corresponding to the sensor area.

15. The method of claim 14, wherein:
each of the plurality of first opening portions and the plurality of second opening portions has a quadrangular shape in a plan view.

16. The method of claim 14, wherein:
the first counter electrode and the second counter electrode are adjacent to each other and at least partially overlap each other.

17. The method of claim 14, wherein:
the first mask has a plurality of third opening portions spaced apart from one another in a third pattern to form a third counter electrode in the display area,
wherein at least one of the plurality of third opening portions is divided into two side parts by the first shield portion.

18. The method of claim 17, wherein:
the first mask has a long side and a short side,
wherein the plurality of third opening portions are formed parallel to the long side of the first mask or the short side of the first mask.

19. The method of claim 14, wherein:
the first mask has a plurality of third opening portions spaced apart from one another in a third pattern to form a plurality of third counter electrodes in the display area, and
the second mask has a plurality of fourth opening portions spaced apart from one another in a fourth pattern to form a fourth counter electrode in the display area,
wherein the fourth counter electrode is arranged between adjacent third counter electrodes of the plurality of third counter electrodes.

20. The method of claim 17, wherein:
each of the plurality of third opening portions are divided into two parts by the first shield portion.

21. The method of claim 14, wherein:
the second mask has a plurality of fourth opening portions spaced apart from one another to form a fourth counter electrode in the display area,
wherein an area of one of the plurality of fourth opening portions is different from an area of another one of the plurality of fourth opening portions,
wherein the second mask comprises a long side and a short side,
wherein an adjacent opening portion for forming a fifth counter electrode is further provided in a portion adjacent to the long side of the second mask or the short side of the second mask.

22. A method of manufacturing a display apparatus, the method comprising:
forming a first counter electrode in a display area by using a first mask on a substrate comprising an opening area and the display area surrounding the opening area; and
forming a second counter electrode by using a second mask in the display area,
wherein each of the first mask and the second mask comprises:
a mask body portion having an opening portion corresponding to the display area;
a shield portion arranged inside the opening portion to have a shape corresponding to the opening area and configured to shield a deposition material;

a first rib connected to the shield portion and connected to the mask body portion to cross the opening portion in a first direction; and a second rib spaced apart from the first rib, connected to the shield portion, and connected to the mask body portion to cross the opening portion in the first direction.

23. The method of claim 22, wherein:

the shield portion of the first mask further comprises: a third rib connected to the mask body portion to cross the opening portion in the first direction; and a fourth rib spaced apart from the third rib, connected to the shield portion, and connected to the mask body portion to cross the opening portion in the first direction.

24. The method of claim 22, wherein:

the shield portion of the first mask is adjacent to the mask body portion.

25. The method of claim 22, wherein:

the opening portion of the first mask has a plurality of openings, wherein an area of one of the plurality of openings is different from an area of another one of the plurality of openings.

26. The method of claim 22, wherein:

the opening portion of the second mask is adjacent to the mask body portion, the first rib, and the second rib.

* * * * *